US008890146B2

(12) United States Patent
Kimura et al.

(10) Patent No.: US 8,890,146 B2
(45) Date of Patent: Nov. 18, 2014

(54) SEMICONDUCTOR DEVICE AND ELECTRONIC DEVICE

(71) Applicant: Semiconductor Energy Laboratory Co., Ltd., Atsugi (JP)

(72) Inventors: Hajime Kimura, Atsugi (JP); Atsushi Umezaki, Isehara (JP); Shunpei Yamazaki, Setagaya (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 13/763,804

(22) Filed: Feb. 11, 2013

(65) Prior Publication Data
US 2013/0146882 A1    Jun. 13, 2013

Related U.S. Application Data

(63) Continuation of application No. 12/960,659, filed on Dec. 6, 2010, now Pat. No. 8,415,665.

(30) Foreign Application Priority Data

Dec. 11, 2009  (JP) .................. 2009-282268

(51) Int. Cl.
H01L 29/04 (2006.01)
H01L 31/036 (2006.01)
H01L 31/0376 (2006.01)
H01L 31/20 (2006.01)

(52) U.S. Cl.
USPC ...................................... 257/57; 257/E27.06

(58) Field of Classification Search
USPC .............................. 257/57, E27.06
See application file for complete search history.

(56) References Cited

U.S. PATENT DOCUMENTS 3,506,851 A   4/1970   Polkinghorn et al.
4,090,096 A   5/1978   Nagami
(Continued)

FOREIGN PATENT DOCUMENTS

EP   1160796 A    12/2001
EP   1 253 718    10/2002
(Continued)

OTHER PUBLICATIONS

International Search Report (Application No. PCT/JP2010/071193) Dated Feb. 1, 2011.

(Continued)

*Primary Examiner* — David S Blum
(74) *Attorney, Agent, or Firm* — Eric J. Robinson; Robinson Intellectual Property Law Office, P.C.

(57) ABSTRACT

An object is to improve the drive capability of a semiconductor device. The semiconductor device includes a first transistor and a second transistor. A first terminal of the first transistor is electrically connected to a first wiring. A second terminal of the first transistor is electrically connected to a second wiring. A gate of the second transistor is electrically connected to a third wiring. A first terminal of the second transistor is electrically connected to the third wiring. A second terminal of the second transistor is electrically connected to a gate of the first transistor. A channel region is formed using an oxide semiconductor layer in each of the first transistor and the second transistor. The off-state current of each of the first transistor and the second transistor per channel width of 1 μm is 1 aA or less.

24 Claims, 29 Drawing Sheets

(56) References Cited

U.S. PATENT DOCUMENTS

| | | |
|---|---|---|
| 4,578,597 A | 3/1986 | Soneda et al. |
| 5,731,856 A | 3/1998 | Kim et al. |
| 5,744,864 A | 4/1998 | Cillessen et al. |
| 5,949,398 A | 9/1999 | Kim |
| 6,294,274 B1 | 9/2001 | Kawazoe et al. |
| 6,563,174 B2 | 5/2003 | Kawasaki et al. |
| 6,611,248 B2 | 8/2003 | Kanbara et al. |
| 6,727,522 B1 | 4/2004 | Kawasaki et al. |
| 6,756,816 B2 | 6/2004 | Miyake |
| 6,788,108 B2 | 9/2004 | Miyake et al. |
| 6,813,332 B2 | 11/2004 | Nagao et al. |
| 6,958,750 B2 | 10/2005 | Azami et al. |
| 6,975,142 B2 | 12/2005 | Azami et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,068,076 B2 | 6/2006 | Azami |
| 7,091,749 B2 | 8/2006 | Miyake et al. |
| 7,105,868 B2 | 9/2006 | Nause et al. |
| 7,116,748 B2 | 10/2006 | Nagao et al. |
| 7,202,863 B2 | 4/2007 | Kimura et al. |
| 7,211,825 B2 | 5/2007 | Shih et al |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,362,139 B2 | 4/2008 | Miyake et al. |
| 7,385,224 B2 | 6/2008 | Ishii et al. |
| 7,402,506 B2 | 7/2008 | Levy et al. |
| 7,403,038 B2 | 7/2008 | Azami |
| 7,411,209 B2 | 8/2008 | Endo et al. |
| 7,443,202 B2 | 10/2008 | Kimura et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| RE40,673 E | 3/2009 | Kanbara et al. |
| 7,501,293 B2 | 3/2009 | Ito et al. |
| 7,586,478 B2 | 9/2009 | Azami et al. |
| 7,674,650 B2 | 3/2010 | Akimoto et al. |
| 7,687,808 B2 | 3/2010 | Umezaki |
| 7,732,819 B2 | 6/2010 | Akimoto et al. |
| 7,786,985 B2 | 8/2010 | Kimura et al. |
| 7,859,510 B2 | 12/2010 | Umezaki |
| 8,044,906 B2 | 10/2011 | Kimura et al. |
| 8,059,078 B2 | 11/2011 | Kimura et al. |
| 8,102,340 B2 | 1/2012 | Lee et al. |
| 8,148,779 B2 | 4/2012 | Jeong et al. |
| 8,330,492 B2 | 12/2012 | Umezaki |
| 8,456,396 B2 | 6/2013 | Umezaki |
| 8,462,100 B2 | 6/2013 | Umezaki |
| 8,643,586 B2 | 2/2014 | Umezaki |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager et al. |
| 2004/0038446 A1 | 2/2004 | Takeda et al. |
| 2004/0127038 A1 | 7/2004 | Carcia et al. |
| 2004/0253781 A1 | 12/2004 | Kimura et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0280279 A1 | 12/2006 | Nagao et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0072439 A1 | 3/2007 | Akimoto et al. |
| 2007/0090365 A1 | 4/2007 | Hayashi et al. |
| 2007/0108446 A1 | 5/2007 | Akimoto |
| 2007/0132686 A1 | 6/2007 | Kimura et al. |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0007296 A1 | 1/2008 | Umezaki |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0062112 A1 | 3/2008 | Umezaki |
| 2008/0073653 A1 | 3/2008 | Iwasaki |
| 2008/0079001 A1 | 4/2008 | Umezaki et al. |
| 2008/0079685 A1 | 4/2008 | Umezaki et al. |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0246403 A1 | 10/2008 | Sagawa et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2008/0308796 A1 | 12/2008 | Akimoto et al. |
| 2008/0308797 A1 | 12/2008 | Akimoto et al. |
| 2008/0308805 A1 | 12/2008 | Akimoto et al. |
| 2008/0308806 A1 | 12/2008 | Akimoto et al. |
| 2009/0001881 A1 | 1/2009 | Nakayama |
| 2009/0008639 A1 | 1/2009 | Akimoto et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0239335 A1 | 9/2009 | Akimoto et al. |
| 2009/0278122 A1 | 11/2009 | Hosono et al. |
| 2009/0280600 A1 | 11/2009 | Hosono et al. |
| 2009/0305461 A1 | 12/2009 | Akimoto et al. |
| 2009/0310734 A1 | 12/2009 | Umezaki |
| 2010/0026619 A1 | 2/2010 | Umezaki |
| 2010/0065844 A1 | 3/2010 | Tokunaga |
| 2010/0072467 A1 | 3/2010 | Yamazaki et al. |
| 2010/0092800 A1 | 4/2010 | Itagaki et al. |
| 2010/0102311 A1 | 4/2010 | Ito et al. |
| 2010/0109002 A1 | 5/2010 | Itagaki et al. |
| 2010/0109708 A1 | 5/2010 | Koyama et al. |
| 2010/0110623 A1 | 5/2010 | Koyama et al. |
| 2010/0123654 A1 | 5/2010 | Kimura |
| 2010/0134396 A1 | 6/2010 | Umezaki |
| 2010/0136743 A1 | 6/2010 | Akimoto et al. |
| 2010/0182226 A1 | 7/2010 | Umezaki |
| 2010/0182306 A1 | 7/2010 | Kimura et al. |
| 2010/0245304 A1 | 9/2010 | Umezaki |
| 2010/0245307 A1 | 9/2010 | Kimura et al. |

(56) References Cited

U.S. PATENT DOCUMENTS

| | | | |
|---|---|---|---|
| 2010/0245335 | A1 | 9/2010 | Kimura et al. |
| 2010/0246750 | A1 | 9/2010 | Kimura et al. |
| 2010/0283049 | A1 | 11/2010 | Sato et al. |
| 2010/0301328 | A1 | 12/2010 | Yamazaki et al. |
| 2010/0309177 | A1 | 12/2010 | Kimura et al. |
| 2010/0309184 | A1 | 12/2010 | Yamamoto et al. |
| 2011/0007044 | A1 | 1/2011 | Kimura et al. |
| 2011/0024750 | A1 | 2/2011 | Yamazaki et al. |
| 2011/0031491 | A1 | 2/2011 | Yamazaki et al. |
| 2012/0032943 | A1 | 2/2012 | Kimura et al. |
| 2012/0273779 | A1 | 11/2012 | Yamazaki et al. |
| 2012/0273780 | A1 | 11/2012 | Yamazaki et al. |
| 2012/0280230 | A1 | 11/2012 | Akimoto et al. |
| 2013/0099222 | A1 | 4/2013 | Sagawa et al. |
| 2013/0100104 | A1 | 4/2013 | Sagawa et al. |
| 2013/0107154 | A1 | 5/2013 | Umezaki |
| 2013/0251091 | A1 | 9/2013 | Nagao et al. |
| 2013/0314139 | A1 | 11/2013 | Umezaki |
| 2014/0145187 | A1 | 5/2014 | Umezaki |

FOREIGN PATENT DOCUMENTS

| | | | |
|---|---|---|---|
| EP | 1684310 | A | 7/2006 |
| EP | 1 737 044 | | 12/2006 |
| EP | 1 770 788 | A | 4/2007 |
| EP | 1895545 | A | 3/2008 |
| EP | 1 995 787 | A | 11/2008 |
| EP | 1 998 374 | A | 12/2008 |
| EP | 1 998 375 | A | 12/2008 |
| EP | 2 224 594 | A | 9/2010 |
| EP | 2 226 847 | | 9/2010 |
| JP | 55-156427 | | 12/1980 |
| JP | 60-198861 | A | 10/1985 |
| JP | 63-210022 | | 8/1988 |
| JP | 63-210023 | | 8/1988 |
| JP | 63-210024 | | 8/1988 |
| JP | 63-215519 | | 9/1988 |
| JP | 63-239117 | | 10/1988 |
| JP | 63-265818 | | 11/1988 |
| JP | 05-251705 | A | 9/1993 |
| JP | 08-264794 | A | 10/1996 |
| JP | 11-505377 | | 5/1999 |
| JP | 2000-044236 | A | 2/2000 |
| JP | 2000-150900 | A | 5/2000 |
| JP | 2002-055644 | A | 2/2002 |
| JP | 2002-076356 | A | 3/2002 |
| JP | 2002-289859 | A | 10/2002 |
| JP | 2002-328643 | | 11/2002 |
| JP | 2003-086000 | | 3/2003 |
| JP | 2003-086808 | | 3/2003 |
| JP | 2003-179479 | | 6/2003 |
| JP | 2003-222256 | | 8/2003 |
| JP | 2004-064528 | | 2/2004 |
| JP | 2004-103957 | A | 4/2004 |
| JP | 2004-222256 | A | 8/2004 |
| JP | 2004-273614 | A | 9/2004 |
| JP | 2004-273732 | A | 9/2004 |
| JP | 2007-123861 | A | 5/2007 |
| JP | 2007-207413 | A | 8/2007 |
| JP | 2007-220820 | A | 8/2007 |
| JP | 2008-009393 | A | 1/2008 |
| JP | 2008-083692 | A | 4/2008 |
| JP | 2008-257086 | A | 2/2009 |
| JP | 2009-031750 | A | 2/2009 |
| WO | WO 2004/114391 | | 12/2004 |
| WO | WO-2007/080813 | | 7/2007 |
| WO | WO 2009/084269 | | 7/2009 |
| WO | WO-2009/084296 | | 7/2009 |

OTHER PUBLICATIONS

Written Opinion (Application No. PCT/JP2010/071193) Dated Feb. 1, 2011.

Fortunato et al., "Wide-Bandgap High-Mobility ZNO Thin-Film Transistors Produced at Room Temperature," Appl. Phys. Lett. (Applied Physics Letters), Sep. 27, 2004, vol. 85, No. 13, pp. 2541-2543.

Dembo et al., "RFCPUS on Glass and Plastic Substrates Fabricated by TFT Transfer Technology," IEDM 05: Technical Digest of International Electron Devices Meeting, Dec. 5, 2005, pp. 1067-1069.

Ikeda et al., "Full-Functional System Liquid Crystal Display Using CG-Silicon Technology," SID Digest '04: SID International Symposium Digest of Technical Papers, 2004, vol. 35, pp. 860-863.

Nomura et al., "Room-Temperature Fabrication of Transparent Flexible Thin-Film Transistors Using Amorphous Oxide Semiconductors," Nature, Nov. 25, 2004, vol. 432, pp. 488-492.

Park et al., "Improvements in the Device Characteristics of Amorphous Indium Gallium Zinc Oxide Thin-Film Transistors by Ar Plasma Treatment," Appl. Phys. Lett. (Applied Physics Letters), Jun. 26, 2007, vol. 90, No. 26, pp. 262106-1-262106-3.

Takahashi et al., "Theoretical Analysis of IGZO Transparent Amorphous Oxide Semiconductor," IDW '08: Proceedings of the 15th International Display Workshops, Dec. 3, 2008, pp. 1637-1640.

Hayashi et al., "42.1: Invited Paper: Improved Amorphous In-Ga-Zn-O TFTs," SID Digest '08: SID International Symposium Digest of Technical Papers, May 20, 2008, vol. 39, pp. 621-624.

Prins et al., "A Ferroelectric Transparent Thin-Film Transistor," Appl. Phys. Lett. (Applied Physics Letters), Jun. 17, 1996, vol. 68, No. 25, pp. 3650-3652.

Nakamura et al., "The Phase Relations in the $In_2O_3$-$Ga_2ZnO_4$-ZnO System at 1350° C," Journal of Solid State Chemistry, Aug. 1, 1991, vol. 93, No. 2, pp. 298-315.

Kimizuka et al., "Syntheses and Single-Crystal Data of Homologous Compounds, $In_2O_3(ZnO)m$ ($m$=3, 4, and 5), $InGaO_3(ZnO)_3$, and $Ga_2O_3(ZnO)m$ ($m$=7, 8, 9, and 16) in the $In_2O_3$-$ZnGa_2O_4$-ZnO System," Journal of Solid State Chemistry, Apr. 1, 1995, vol. 116, No. 1, pp. 170-178.

Nomura et al., "Thin-Film Transistor Fabricated in Single-Crystalline Transparent Oxide Semiconductor," Science, May 23, 2003, vol. 300, No. 5623, pp. 1269-1272.

Masuda et al., "Transparent thin film transistors using ZnO as an active channel layer and their electrical properties," J. Appl. Phys. (Journal of Applied Physics), Feb. 1, 2003, vol. 93, No. 3, pp. 1624-1630.

Asakuma et al., "Crystallization and Reduction of Sol-Gel-Derived Zinc Oxide Films by Irradiation with Ultraviolet Lamp," Journal of Sol-Gel Science and Technology, 2003, vol. 26, pp. 181-184.

Osada et al., "15.2: Development of Driver-Integrated Panel using Amorphous In-Ga-Zn-Oxide TFT," SID Digest '09: SID International Symposium Digest of Technical Papers, May 31, 2009, pp. 184-187.

Nomura et al., "Carrier transport in transparent oxide semiconductor with intrinsic structural randomness probed using single-crystalline InGaO3(ZnO)5 films," Appl. Phys. Lett. (Applied Physics Letters), Sep. 13, 2004, vol. 85, No. 11, pp. 1993-1995.

Li et al., "Modulated Structures of Homologous Compounds In$MO_3$(ZnO)$_m$ ($M$=In,Ga; $m$=Integer) Described by Four-Dimensional Superspace Group," Journal of Solid State Chemistry, 1998, vol. 139, pp. 347-355.

Son et al., "42.4L: Late-News Paper: 4 Inch QVGA AMOLED Driven by the Threshold Voltage Controlled Amorphous GIZO ($Ga_2O_3$-$In_2O_3$-ZnO) TFT," SID Digest '08: SID International Symposium Digest of Technical Papers, May 20, 2008, vol. 39, pp. 633-636.

Lee et al., "World's Largest (15-inch) XGA AMLCD Panel Using IGZO Oxide TFT," SID Digest '08: SID International Symposium Digest of Technical Papers, May 20, 2008, vol. 39, pp. 625-628.

Nowatari et al., "60.2: Intermediate Connector with Suppressed Voltage Loss for White Tandem OLEDs," SID Digest '09: SID International Symposium Digest of Technical Papers, May 31, 2009, vol. 40, pp. 899-902.

Kanno et al., "White Stacked Electrophosphorecent Organic Light-Emitting Devices Employing $MoO_3$ as a Charge-Generation Layer," Adv. Mater. (Advanced Materials), 2006, vol. 18, No. 3, pp. 339-342.

(56) References Cited

OTHER PUBLICATIONS

Tsuda et al., "Ultra Low Power Consumption Technologies for Mobile TFT-LCDs," IDW '02: Proceedings of the 9th International Display Workshops, Dec. 4, 2002, pp. 295-298.

Van de Walle, "Hydrogen as a Cause of Doping in Zinc Oxide," Phys. Rev. Lett. (Physical Review Letters), Jul. 31, 2000, vol. 85, No. 5, pp. 1012-1015.

Fung et al., "2-D Numerical Simulation of High Performance Amorphous In-Ga-Zn-O TFTs for Flat Panel Displays," AM-FPD '08 Digest of Technical Papers, Jul. 2, 2008, pp. 251-252, The Japan Society of Applied Physics.

Jeong et al., "3.1: Distinguished Paper: 12.1-Inch WXGA AMOLED Display Driven by Indium-Gallium-Zinc Oxide TFTs Array," SID Digest '08: SID International Symposium Digest of Technical Papers, May 20, 2008, vol. 39, No. 1, pp. 1-4.

Park et al., "High performance amorphous oxide thin film transistors with self- aligned top-gate structure," IEDM 09: Technical Digest of International Electron Devices Meeting, Dec. 7, 2009, pp. 191-194.

Kurokawa et al., "UHF RFCPUs on Flexible and Glass Substrates for Secure RFID Systems," Journal of Solid-State Circuits, 2008, vol. 43, No. 1, pp. 292-299.

Ohara et al., "Amorphous In-Ga-Zn-Oxide TFTs with Suppressed Variation for 4.0 inch QVGA AMOLED Display," AM-FPD '09 Digest of Technical Papers, Jul. 1, 2009, pp. 227-230, The Japan Society of Applied Physics.

Coates et al., "Optical Studies of the Amorphous Liquid-Cholesteric Liquid Crystal Transition: The "Blue Phase"," Physics Letters, Sep. 10, 1973, vol. 45A, No. 2, pp. 115-116.

Cho et al., "21.2: Al and Sn-doped Zinc Indium Oxide Thin Film Transistors for AMOLED Back-Plane," SID Digest '09: SID International Symposium Digest of Technical Papers, May 31, 2009, pp. 280-283.

Lee et al., "15.4: Excellent Performance of Indium-Oxide-Based Thin-Film Transistors by DC Sputtering," SID Digest '09: SID International Symposium Digest of Technical Papers, May 31, 2009, pp. 191-193.

Jin et al., "65.2: Distinguished Paper: World-Largest (6.5") Flexible Full Color Top Emission AMOLED Display on Plastic Film and Its Bending Properties," SID Digest '09: SID International Symposium Digest of Technical Papers, May 31, 2009, pp. 983-985.

Sakata et al., "Development of 4.0-In. AMOLED Display with Driver Circuit Using Amorphous In-Ga-Zn-Oxide TFTs," IDW '09: Proceedings of the 16th International Display Workshops, 2009, pp. 689-692.

Park et al., "Amorphous Indium-Gallium-Zinc Oxide TFTs and their Application for Large Size AMOLED," AM-FPD '08 Digest of Technical Papers, Jul. 2, 2008, pp. 275-278.

Park et al., "Challenge to Future Displays: Transparent AM-OLED Driven by PEALD Grown ZnO TFT," IMID '07 Digest, 2007, pp. 1249-1252.

Godo et al., "Temperature Dependence of Characteristics and Electronic Structure for Amorphous In-Ga-Zn-Oxide TFT," AM-FPD '09 Digest of Technical Papers, Jul. 1, 2009, pp. 41-44.

Osada et al., "Development of Driver-Integrated Panel using Amorphous In-Ga-Zn-Oxide TFT," AM-FPD '09 Digest of Technical Papers, Jul. 1, 2009, pp. 33-36.

Hirao et al., "Novel Top-Gate Zinc Oxide Thin-Film Transistors (ZnO TFTs) for AMLCDs," Journal of the SID, 2007, vol. 15, No. 1, pp. 17-22.

Hosono, "68.3: Invited Paper: Transparent Amorphous Oxide Semiconductors for High Performance TFT," SID Digest '07: SID International Symposium Digest of Technical Papers, 2007, vol. 38, pp. 1830-1833.

Godo et al., "P-9: Numerical Analysis on Temperature Dependence of Characteristics of Amorphous In-Ga-Zn-Oxide TFT," SID Digest '09: SID International Symposium Digest of Technical Papers, May 31, 2009, pp. 1110-1112.

Ohara et al., "21.3: 4.0 In. QVGA AMOLED Display Using In-Ga-Zn-Oxide TFTs with a Novel Passivation Layer," SID Digest '09: SID International Symposium Digest of Technical Papers, May 31, 2009, pp. 284-287.

Miyasaka, "Suftla Flexible Microelectronics on their Way to Business," SID Digest '07: SID International Symposium Digest of Technical Papers, 2007, vol. 38, pp. 1673-1676.

Chern et al., "An Analytical Model for the Above-Threshold Characteristics of Polysilicon Thin-Film Transistors," IEEE Transactions on Electron Devices, Jul. 1, 1995, vol. 42, No. 7, pp. 1240-1246.

Kikuchi et al., "39.1: Invited Paper: Optically Isotropic NANO-Structured Liquid Crystal Composites for Display Applications," SID Digest '09: SID International Symposium Digest of Technical Papers, May 31, 2009, pp. 578-581.

Asaoka et al., "29.1: Polarizer-Free Reflective LCD Combined With Ultra Low-Power Driving Technology," SID Digest '09: SID International Symposium Digest of Technical Papers, May 31, 2009, pp. 395-398.

Lee et al., "Current Status of, Challenges to, and Perspective View of AM-OLED," IDW '06: Proceedings of the 13th International Display Workshops, Dec. 7, 2006, pp. 663-666.

Kikuchi et al., "62.2: Invited Paper: Fast Electro-Optical Switching in Polymer-Stabilized Liquid Crystalline Blue Phases for Display Application," SID Digest '07: SID International Symposium Digest of Technical Papers, 2007, vol. 38, pp. 1737-1740.

Nakamura, "Synthesis of Homologous Compound with New Long-Period Structure," Nirim Newsletter, Mar. 1, 1995, vol. 150, pp. 1-4.

Kikuchi et al., "Polymer-Stabilized Liquid Crystal Blue Phases," Nature Materials, Sep. 2, 2002, vol. 1, pp. 64-68.

Kimizuka et al., "Spinel, $YbFe_2O_4$, and $Yb_2Fe_3O_7$ Types of Structures for Compounds in the $In_2O_3$ and $Sc_2O_3$-$A_2O_3$-BO Systems [A: Fe, Ga, or Al; B: Mg, Mn, Fe, Ni, Cu, or Zn] at Temperatures Over 1000° C," Journal of Solid State Chemistry, 1985, vol. 60, pp. 382-384.

Kitzerow et al., "Observation of Blue Phases in Chiral Networks," Liquid Crystals, 1993, vol. 14, No. 3, pp. 911-916.

Costello et al., "Electron Microscopy of a Cholesteric Liquid Crystal and its Blue Phase," Phys. Rev. A (Physical Review A), May 1, 1984, vol. 29, No. 5, pp. 2957-2959.

Meiboom et al., "Theory of the Blue Phase of Cholesteric Liquid Crystals," Phys. Rev. Lett. (Physical Review Letters), May 4, 1981, vol. 46, No. 18, pp. 1216-1219.

Park et al., "42.3: Transparent ZnO Thin Film Transistor for the Application of High Aperture Ratio Bottom Emission AM-OLED Display," SID Digest '08: SID International Symposium Digest of Technical Papers, May 20, 2008, vol. 39, pp. 629-632.

Orita et al., "Mechanism of Electrical Conductivity of Transparent $InGaZnO_4$," Phys. Rev. B (Physical Review B), Jan. 15, 2000, vol. 61, No. 3, pp. 1811-1816.

Nomura et al., "Amorphous Oxide Semiconductors for High-Performance Flexible Thin-Film Transistors," Jpn. J. Appl. Phys. (Japanese Journal of Applied Physics), 2006, vol. 45, No. 5B, pp. 4303-4308.

Janotti et al., "Native Point Defects in ZnO," Phys. Rev. B (Physical Review. B), Oct. 4, 2007, vol. 76, No. 16, pp. 165202-1-165202-22.

Park et al., "Electronic Transport Properties of Amorphous Indium-Gallium-Zinc Oxide Semiconductor Upon Exposure to Water," Appl. Phys. Lett. (Applied Physics Letters), 2008, vol. 92, pp. 072104-1-072104-3.

Hsieh et al., "P-29: Modeling of Amorphous Oxide Semiconductor Thin Film Transistors and Subgap Density of States," SID Digest '08: SID International Symposium Digest of Technical Papers, 2008, vol. 39, pp. 1277-1280.

Janotti et al., "Oxygen Vacancies in ZnO," Appl. Phys. Lett. (Applied Physics Letters), 2005, vol. 87, pp. 122102-1-122102-3.

Oba et al., "Defect energetics in ZnO: A hybrid Hartree-Fock density functional study," Phys. Rev. B (Physical Review B), 2008, vol. 77, pp. 245202-1-245202-6.

Orita et al., "Amorphous transparent conductive oxide $InGaO_3(ZnO)_m$ (m<4): a Zn 4s conductor," Philosophical Magazine, 2001, vol. 81, No. 5, pp. 501-515.

(56) References Cited

OTHER PUBLICATIONS

Hosono et al., "Working hypothesis to explore novel wide band gap electrically conducting amorphous oxides and examples," J. Non-Cryst. Solids (Journal of Non-Crystalline Solids), 1996, vol. 198-200, pp. 165-169.

Mo et al., "Amorphous Oxide TFT Backplanes for Large Size AMOLED Displays," IDW '08: Proceedings of the 6th International Display Workshops, Dec. 3, 2008, pp. 581-584.

Kim et al., "High-Performance oxide thin film transistors passivated by various gas plasmas," 214th ECS Meeting, 2008, No. 2317.

Clark et al., "First Principles Methods Using CASTEP," Zeitschrift fur Kristallographie, 2005, vol. 220, pp. 567-570.

Lany et al., "Dopability, Intrinsic Conductivity, and Nonstoichiometry of Transparent Conducting Oxides," Phys. Rev. Lett. (Physical Review Letters), Jan. 26, 2007, vol. 98, pp. 045501-1-045501-4.

Park et al., "Dry etching of ZnO films and plasma-induced damage to optical properties," J. Vac. Sci. Technol. B (Journal of Vacuum Science & Technology B), Mar. 1, 2003, vol. 21, No. 2, pp. 800-803.

Oh et al., "Improving the Gate Stability of ZnO Thin-Film Transistors with Aluminum Oxide Dielectric Layers," J. Electrochem. Soc. (Journal of the Electrochemical Society), 2008, vol. 155, No. 12, pp. H1009-H1014.

Ueno et al., "Field-Effect Transistor on $SrTiO_3$ with Sputtered $Al_2O_3$ Gate Insulator," Appl. Phys. Lett. (Applied Physics Letters), Sep. 1, 2003, vol. 83, No. 9, pp. 1755-1757.

exceeds
the potential V2
and becomes
lower than
the potential V1

SEMICONDUCTOR DEVICE AND ELECTRONIC DEVICE

CROSS REFERENCES TO RELATED APPLICATIONS

The present invention is a Continuation application of application Ser. No. 12/960,659, filed on Dec. 6, 2010, now U.S. Pat. No. 8,415,665, the entire contents of which being incorporated herein by reference.

TECHNICAL FIELD

A technical field of the invention disclosed herein relates to a semiconductor device, a display device, a liquid crystal display device, and a method for driving these devices.

BACKGROUND ART

Semiconductor devices in which the conductivity of all the transistors is either n-type or p-type have been developed. In particular, development of semiconductor devices that are constituted only by n-channel transistors has been advanced (e.g., Patent Documents 1 to 4).

Such a semiconductor device includes, for example, a first transistor having one of a source and a drain connected to a power supply line and the other of the source and the drain connected to an output, and one or a plurality of second transistors connected between a gate of the first transistor and each wiring.

In order to make the amplitude voltage of an output signal from the semiconductor device equal to a power supply voltage, the potential of the gate of the first transistor is made higher (or lower) than the power supply voltage by capacitive coupling in many cases. In order to realize this, the gate of the first transistor needs to be in a floating state. For that reason, it is necessary to turn off the second transistor (or all the plurality of second transistors) connected to the gate of the first transistor.

Reference

Patent Document 1: Japanese Published Patent Application No. 2002-328643
Patent Document 2: Japanese Published Patent Application No. 2003-179479
Patent Document 3: Japanese Published Patent Application No. 2004-064528
Patent Document 4: Japanese Published Patent Application No. 2003-222256

DISCLOSURE OF INVENTION

However, in a conventional semiconductor device, even if the second transistor is off, electric charge held by the gate of the first transistor is lost over time because of the off-state current of the second transistor. Therefore, the drive capability of the semiconductor device is impaired.

In view of the foregoing problem, an object of one embodiment of the present invention is to realize higher performance. An object of one embodiment of the present invention is to improve the drive capability of a semiconductor device.

According to one embodiment of the present invention, a semiconductor device includes a first transistor and a second transistor. A first terminal of the first transistor is electrically connected to a first wiring. A second terminal of the first transistor is electrically connected to a second wiring. A gate of the second transistor is electrically connected to a third wiring. A first terminal of the second transistor is electrically connected to the third wiring. A second terminal of the second transistor is electrically connected to a gate of the first transistor. A channel region is formed using an oxide semiconductor layer in each of the first transistor and the second transistor. The first transistor and the second transistor have an off-state current of 1 aA/μm or less.

According to another embodiment of the present invention, a semiconductor device includes a first transistor, a second transistor, a third transistor, and a fourth transistor. A first terminal of the first transistor is electrically connected to a first wiring. A second terminal of the first transistor is electrically connected to a second wiring. A gate of the second transistor is electrically connected to a third wiring. A first terminal of the second transistor is electrically connected to the third wiring. A second terminal of the second transistor is electrically connected to a gate of the first transistor. A gate of the third transistor is electrically connected to a fourth wiring. A first terminal of the third transistor is electrically connected to a fifth wiring. A second terminal of the third transistor is electrically connected to the second wiring. A gate of the fourth transistor is electrically connected to the fourth wiring. A first terminal of the fourth transistor is electrically connected to the fifth wiring. A second terminal of the fourth transistor is electrically connected to the gate of the first transistor. A channel region is formed using an oxide semiconductor layer in each of the first to fourth transistors. The first to fourth transistors have an off-state current of 1 aA/μm or less.

According to another embodiment of the present invention, a semiconductor device includes a first transistor and a second transistor. A first terminal of the first transistor is electrically connected to a first wiring. A second terminal of the first transistor is electrically connected to a second wiring. A gate of the second transistor is electrically connected to the first wiring. A first terminal of the second transistor is electrically connected to the first wiring. A second terminal of the second transistor is electrically connected to a gate of the first transistor. A channel region is formed using an oxide semiconductor layer in each of the first transistor and the second transistor. The first transistor and the second transistor have an off-state current of 1 aA/μm or less.

According to another embodiment of the present invention, a semiconductor device includes a first transistor, a second transistor, a third transistor, and a fourth transistor. A first terminal of the first transistor is electrically connected to a first wiring. A second terminal of the first transistor is electrically connected to a second wiring. A gate of the second transistor is electrically connected to the first wiring. A first terminal of the second transistor is electrically connected to the first wiring. A second terminal of the second transistor is electrically connected to a gate of the first transistor. A gate of the third transistor is electrically connected to a third wiring. A first terminal of the third transistor is electrically connected to a fourth wiring. A second terminal of the third transistor is electrically connected to the second wiring. A gate of the fourth transistor is electrically connected to the third wiring. A first terminal of the fourth transistor is electrically connected to the fourth wiring. A second terminal of the fourth transistor is electrically connected to the gate of the first transistor. A channel region is formed using an oxide semiconductor layer in each of the first to fourth transistors. The first to fourth transistors have an off-state current of 1 aA/μm or less.

According to another embodiment of the present invention, a semiconductor device includes a first transistor, a second transistor, N third transistors (N is a natural number), and N fourth transistors. A first terminal of the first transistor is electrically connected to a first wiring. A second terminal of the first transistor is electrically connected to a second wiring. A gate of the second transistor is electrically connected to the first wiring. A first terminal of the second transistor is electrically connected to the first wiring. A second terminal of the second transistor is electrically connected to a gate of the first transistor. Gates of the N third transistor are electrically connected to respective N third wirings. First terminals of the N third transistors are electrically connected to a fourth wiring. Second terminals of the N third transistors are electrically connected to the second wiring. Gates of the N fourth transistors are electrically connected to the respective N third wirings. First terminals of the N fourth transistors are electrically connected to the fourth wiring. Second terminals of the N fourth transistors are electrically connected to the gate of the first transistor. A channel region is formed using an oxide semiconductor layer in each of the first transistor, the second transistor, the N third transistors, and the N fourth transistors. The first transistor, the second transistor, the N third transistors, and the N fourth transistors have an off-state current of 1 aA/µm or less.

In any of the above-described semiconductor devices, the oxide semiconductor preferably includes a non-single-crystal region. Alternatively, in any of the above-described semiconductor devices, oxide semiconductor preferably includes a non-single-crystal region which has a c-axis alignment in a direction perpendicular to a surface of the oxide semiconductor.

One embodiment of the present invention is an electronic device that includes any of the above semiconductor devices and an operation switch.

For example, in this specification and the like, when it is explicitly described that X and Y are connected, the case where X and Y are electrically connected, the case where X and Y are functionally connected, and the case where X and Y are directly connected are included therein. Here, each of X and Y denotes an object (e.g., a device, an element, a circuit, a wiring, an electrode, a terminal, a conductive film, or a layer). Therefore, another element may be provided between elements having a connection relation shown in drawings and texts, without limitation on a predetermined connection relation, for example, the connection relation shown in the drawings and the texts.

For example, in the case where X and Y are electrically connected, one or more elements that enable electrical connection between X and Y (e.g., a switch, a transistor, a capacitor, an inductor, a resistor, and/or a diode) can be connected between X and Y. Note that the expression "electrically connected" is sometimes used to mean "connected". In this case, "electrically connected" has the meaning of "functionally connected" and "directly connected".

For example, in the case where X and Y are functionally connected, one or more circuits that enable functional connection between X and Y (e.g., a logic circuit such as an inverter, a NAND circuit, or a NOR circuit; a signal converter circuit such as a DA converter circuit, an AD converter circuit, or a gamma correction circuit; a potential level converter circuit such as a power supply circuit (e.g., a dc-dc converter, a step-up dc-dc converter, or a step-down dc-dc converter) or a level shifter circuit for changing the potential level of a signal; a voltage source; a current source; a switching circuit; an amplifier circuit such as a circuit that can increase signal amplitude, the amount of current, or the like, an operational amplifier, a differential amplifier circuit, a source follower circuit, or a buffer circuit; a signal generation circuit; a memory circuit; and/or a control circuit) can be connected between X and Y. When a signal output from X is transmitted to Y, it can be said that X and Y are functionally connected even if another circuit is provided between X and Y.

For example, in this specification and the like, when it is explicitly described that Y is formed on or over X, it does not necessarily mean that Y is formed on and in direct contact with X. The description includes the case where X and Y are not in direct contact with each other, that is, the case where another object is placed between X and Y. Here, each of X and Y corresponds to an object (e.g., a device, an element, a circuit, a wiring, an electrode, a terminal, a conductive film, or a layer).

Accordingly, for example, when it is explicitly described that a layer Y is formed on (or over) a layer X, it includes both the case where the layer Y is formed on and in direct contact with the layer X, and the case where another layer (e.g., a layer Z) is formed on and in direct contact with the layer X and the layer Y is formed on and in direct contact with the layer Z. Note that another layer (e.g., the layer Z) may be a single layer or a plurality of layers (a stack).

Similarly, when it is explicitly described that Y is formed above X, it does not necessarily mean that Y is formed on and in direct contact with X, and another object may be placed between X and Y. Therefore, for example, when it is described that a layer Y is formed above a layer X, it includes both the case where the layer Y is formed on and in direct contact with the layer X, and the case where another layer (e.g., a layer Z) is formed on and in direct contact with the layer X and the layer Y is formed on and in direct contact with the layer Z. Note that another layer (e.g., the layer Z) may be a single layer or a plurality of layers (a stack).

Note that when it is explicitly described that Y is formed over, on, or above X, it includes the case where Y is formed obliquely over/above X.

Note that the same can be said when it is explicitly described that Y is formed below or under X.

For example, in this specification and the like, explicit singular forms preferably mean singular forms. However, the singular form can also include the plural without limitation to the above. Similarly, explicit plural forms preferably mean plural forms. However, the plural form can include the singular without limitation to the above.

For example, in this specification and the like, the terms "first", "second," "third," and the like are used for distinguishing various elements, members, regions, layers, and areas from each other. Therefore, the terms "first", "second", "third," and the like do not limit the number of the elements, members, regions, layers, areas, or the like. Further, for example, "first" can be replaced with "second", "third", or the like.

For example, in this specification and the like, terms for describing spatial arrangement, such as "over", "above", "under", "below", "laterally", "right", "left", "obliquely", "behind", "front", "inside", "outside", and "in" are often used for briefly showing a relation between an element and another element or between a feature and another feature with reference to a diagram. Note that embodiments of the present invention are not limited thereto, and such terms for describing spatial arrangement can indicate not only the direction illustrated in a diagram but also another direction. For example, when it is explicitly described that Y is over X it does not necessarily mean that Y is placed over X. Since a device in a diagram can be inverted or rotated by 180°, the case where Y is placed under B can be included. Accordingly, "over" can refer to the direction described by "under" in addition to the direction described by "over". Note that embodiments of the present invention are not limited to this, and "over" can refer to any of the other directions described by "laterally", "right", "left", "obliquely", "behind", "front", "inside", "outside", "in", and the like in addition to the directions described by "over" and "under" because the device in the diagram can be rotated in a variety of directions. That is, the terms for describing spatial arrangement can be construed adequately depending on the situation.

Note that the size, the thickness of a layer, or a region in diagrams is sometimes exaggerated for simplicity. Therefore, embodiments of the present invention are not limited to such scales.

Note that a diagram schematically illustrates an ideal example, and embodiments of the present invention are not limited to the shape, value, or the like illustrated in the diagram. For example, it is possible to include variations in shape due to a manufacturing technique or an error, or variations in signal, voltage, or current due to noise or difference in timing.

According to one embodiment of the present invention, higher performance can be realized or the drive capability of a semiconductor device can be improved.

BEST MODE FOR CARRYING OUT THE INVENTION

Figure 1A:
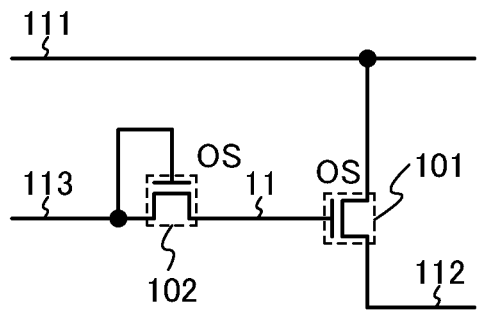
FIG. 1A illustrates an example of a circuit diagram of a semiconductor device in Embodiment 1, and FIGS. 1B and 1C each illustrate an example of a schematic diagram for explaining operation of the semiconductor device.

Embodiments will be described below with reference to the accompanying drawings. Note that the embodiments can be carried out in many different modes, and it is easily understood by those skilled in the art that modes and details can be modified in various ways without departing from the purpose and the scope of the present invention. Therefore, the present invention is not interpreted as being limited to the description of the embodiments. Note that in structures described below, the same portions or portions having similar functions are denoted by the same reference numerals, and description thereof is not repeated.

Note that what is described in one embodiment (or part of the content) can be applied to, combined with, or replaced with content (or part thereof) in one or a plurality of embodiments (which may be this one embodiment and/or other embodiments).

Embodiment 1

In this embodiment, an example of a semiconductor device and an example of a method for driving the semiconductor device will be described. In particular, an example of a circuit using bootstrap operation and a method for driving the circuit will be described.

First, an example of a structure of a semiconductor device in this embodiment will be described.

FIG. 1A illustrates an example of a semiconductor device in this embodiment. The semiconductor device in FIG. 1A includes a transistor 101 and a transistor 102. A first terminal of the transistor 101 is connected to a wiring 111. A second terminal of the transistor 101 is connected to a wiring 112. A first terminal of the transistor 102 is connected to a wiring 113. A second terminal of the transistor 102 is connected to a gate of the transistor 101. A gate of the transistor 102 is connected to the wiring 113. Note that the semiconductor device in this embodiment is not limited to having the structure illustrated in FIG. 1A and can have a variety of other structures.

Note that a portion where the gate of the transistor 101 and the second terminal of the transistor 102 are connected is referred to as a node 11.

Note that the case where the transistors 101 and 102 are n-channel transistors is described below. An n-channel transistor is turned on when the potential difference between the gate and the source is higher than the threshold voltage.

Note that an oxide semiconductor is preferably used for a semiconductor layer of a transistor included in the semiconductor device in this embodiment. The use of an oxide semiconductor for a semiconductor layer can realize improvement in subthreshold swing (S value) of the transistor, reduction in off-state current of the transistor, and/or improvement in withstand voltage of the transistor.

Note that in this specification and the like, it is sometimes possible for those skilled in the art to constitute one embodiment of the invention even when portions to which all terminals of an active element (e.g., a transistor or a diode), a passive element (e.g., a capacitor or a resistor), or the like are connected are not specified. In particular, when there are likely to be a plurality of possible portions to be connected to a terminal, it is not necessary to specify the portion to be connected to the terminal. Therefore, it is sometimes possible to constitute one embodiment of the invention by specifying only a portion to be connected to some of terminals of an active element (e.g., a transistor or a diode), a passive element (e.g., a capacitor or a resistor), or the like.

In addition, in this specification and the like, it is sometimes possible for those skilled in the art to specify the invention when at least a portion to be connected to a terminal in a circuit is specified. Moreover, it is sometimes possible for those skilled in the art to specify the invention when at least a function of a circuit is specified. Therefore, when a portion to be connected to a terminal is specified in a circuit, the circuit is disclosed as one embodiment of the invention even if a function is not specified, and one embodiment of the invention can be constituted. Furthermore, when a function of a circuit is specified, the circuit is disclosed as one embodiment of the invention even if a portion to be connected to a terminal is not specified, and one embodiment of the invention can be constituted.

Next, an example of potentials applied to each wiring will be described.

A potential V1 is applied to the wiring 111. That is, a constant voltage (e.g., a voltage V1) is supplied to the wiring 111. Alternatively, the potential V1 and a potential V2 (the potential V2<the potential V1) are selectively or alternately applied to the wiring 111. That is, a signal (e.g., a clock signal) is input to the wiring 111. When the potential V1 is applied to the wiring 111, the wiring 111 has a function of a power supply line. On the other hand, when the potential V1 and the potential V2 are selectively applied to the wiring 111, the wiring 111 has a function of a signal line (e.g., a clock signal line). Note that the potentials applied to the wiring 111 are not limited to the potential V1 and the potential V2, and various other potentials can be applied to the wiring 111.

A signal is output from the wiring 112. Therefore, the wiring 112 has a function of a signal line. Note that the potential of the wiring 112 is in the range from V2 to V1, for example.

The potential V1 and the potential V2 (the potential V2<the potential V1) are selectively applied to the wiring 113. That is, a signal is input to the wiring 113. Therefore, the wiring 113 has a function of a signal line. Note that the potentials applied to the wiring 113 are not limited to the potential V1 and the potential V2. For example, a constant voltage can be supplied to the wiring 113. As another example, an analog signal or a signal with three or more potentials can be input to the wiring 113.

Description is given on the assumption that a node, a wiring, an electrode, a terminal, or the like is supplied with a potential A and thus has a potential equal to the potential A.

Note that the terms "equal," "same," and the like in this specification and the like sometimes mean that there is a difference within the margin of error. For example, in the case where potentials (or voltages) are equal to each other, the margin of error may be at least ±10%, is preferably ±5%, and is more preferably ±3%. Alternatively, the margin of error includes the range of change in potential due to leakage current, feedthrough, noise, or the like; the range of measurement error due to a measurement device or the like; the range of variation in potential due to process variation; or the like.

Next, an example of operation of the semiconductor device in this embodiment will be described. The following two different operations will be described below: the operation in the case where the potential V1 is applied to the wiring 111, and the operation in the case where the potential V1 and the potential V2 are selectively applied to the wiring 111.

An example of the operation of the semiconductor device in this embodiment in the case where the potential V1 is applied to the wiring 111 is described.

Figure 1B:
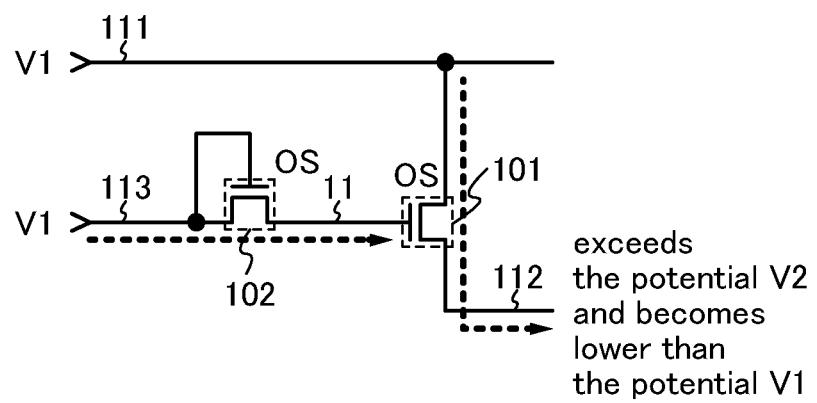

It is assumed that an initial value of the potential of the node 11 and an initial value of the potential of the wiring 112 are equal to the potential V2. When the potential V1 is applied to the wiring 113, the transistor 102 is turned on, so that electrical continuity is established between the wiring 113 and the node 11. Then, the potential of the wiring 113 is supplied to the node 11, so that the potential of the node 11 starts to rise. Then, the transistor 101 is turned on when the potential of the node 11 reaches V2+Vth101 (Vth101 represents the threshold voltage of the transistor 101), so that electrical continuity is established between the wiring 111 and the wiring 112. Then, the potential of the wiring 111 is supplied to the wiring 112, so that the potential of the wiring 112 starts to rise (see FIG. 1B).

Figure 1C:
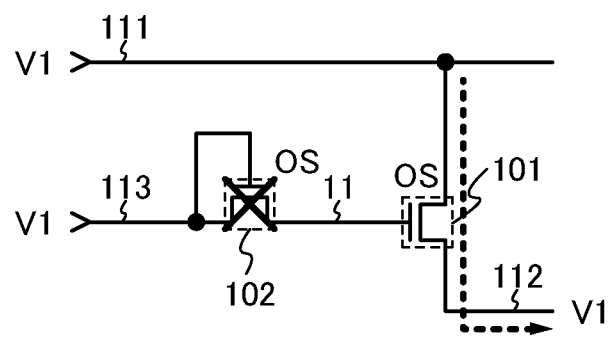

After that, the transistor 102 is turned off when the potential of the node 11 reaches V1−Vth102 (Vth102 represents the threshold voltage of the transistor 102 and satisfies V2+Vth101<V1−Vth102); thus, electrical continuity between the wiring 113 and the node 11 is broken. Then, the node 11 enters a floating state. After that, the potential of the wiring 112 continues to rise, and then rises to a value equal to that of the potential V1. With the rise in potential of the wiring 112, the potential of the node 11 rises to V1+Vth101+Va (Va is a positive number) due to parasitic capacitance between the gate and the second terminal of the transistor 101 (see FIG. 1C). This is so-called bootstrap operation.

Note that when the potential V2 is applied to the wiring 113, the transistor 102 is turned off, so that electrical continuity is not established between the wiring 113 and the node 11. That is, the node 11 enters a floating state. In this case, the operation of the semiconductor device in FIG. 1A depends on the potential of the node 11 before the potential V2 is applied to the wiring 113. When the potential V2 is applied to the wiring 113 on the assumption that the potential of the node 11 before the potential V2 is applied to the wiring 113 is lower than V2+Vth101, for example, the transistor 101 is turned off, so that electrical continuity is not established between the wiring 111 and the wiring 112. Therefore, the potential of the wiring 112 remains the same as that before the potential V2 is applied to the wiring 113. On the other hand, when the potential V2 is applied to the wiring 113 on the assumption that the potential of the node 11 before the potential V2 is applied to the wiring 113 exceeds V2+Vth101, for example, the transistor 101 is turned on, so that electrical continuity is established between the wiring 111 and the wiring 112. Thus, the potential of the wiring 112 becomes equal to the potential V1, and the potential of the node 11 becomes V1+Vth101+Va due to bootstrap operation.

An example of the operation of the semiconductor device in this embodiment in the case where the potential V1 and the potential V2 are selectively applied to the wiring 111 is described.

Figure 2A:
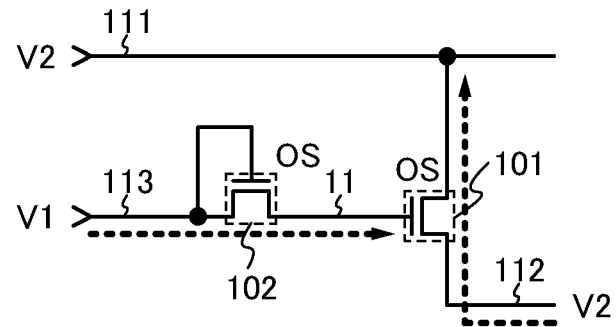
FIGS. 2A to 2C each illustrate an example of a schematic diagram for explaining operation of a semiconductor device in Embodiment 1.

It is assumed that an initial value of the potential of the node 11 and an initial value of the potential of the wiring 112 are equal to the potential V2. When the potential V1 is applied to the wiring 113 and the potential V2 is applied to the wiring 111, the transistor 102 is turned on, so that electrical continuity is established between the wiring 113 and the node 11. Then, the potential of the wiring 113 is supplied to the node 11, so that the potential of the node 11 starts to rise. Then, the transistor 101 is turned on when the potential of the node 11 reaches V2+Vth101, so that electrical continuity is established between the wiring 111 and the wiring 112. Then, the potential of the wiring 111 is supplied to the wiring 112, so that the potential of the wiring 112 is equal to the potential V2 (see FIG. 2A).

Figure 2B:
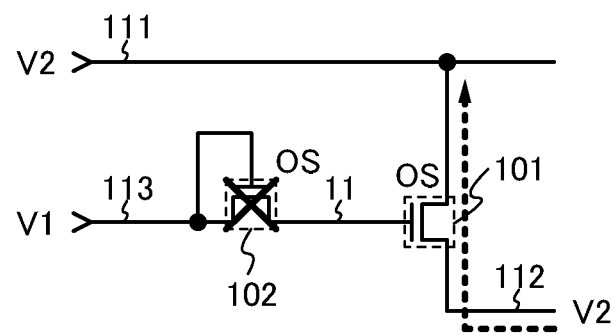

After that, the transistor 102 is turned off when the potential of the node 11 reaches V1−Vth102, so that electrical continuity between the wiring 113 and the node 11 is broken. Then, the node 11 enters a floating state (see FIG. 2B).

Figure 2C:
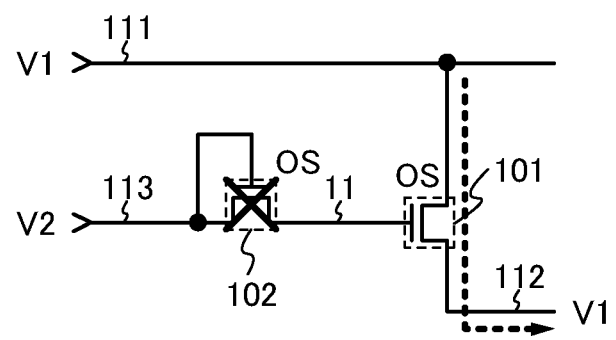

After that, the potential V1 is applied to the wiring 111. At this time, the node 11 remains in a floating state, so that the potential of the node 11 remains V1−Vth102. Therefore, the transistor 101 remains on and electrical continuity between the wiring 111 and the wiring 112 remains established. That is, the potential of the wiring 111 continues to be supplied to the wiring 112. Accordingly, the potential of the wiring 112 starts to rise at the same time as the application of the potential V1 to the wiring 111, and rises to a value equal to that of the potential V1. With the rise in potential of the wiring 112, the potential of the node 11 rises to V1+Vth101+Va (Va is a positive number) due to parasitic capacitance between the gate and the second terminal of the transistor 101 (see FIG. 2C). This is so-called bootstrap operation.

Note that when the potential V2 is applied to the wiring 113, the transistor 102 is turned off, so that electrical continuity is not established between the wiring 113 and the node 11. That is, the node 11 enters a floating state. In this case, the operation of the semiconductor device in FIG. 2A depends on the potential of the node 11 before the potential V2 is applied to the wiring 113. When the potential V2 is applied to the wiring 113 on the assumption that the potential of the node 11 before the potential V2 is applied to the wiring 113 is lower than V2+Vth101, for example, the transistor 101 is turned off, so that electrical continuity is not established between the wiring 111 and the wiring 112. Therefore, the potential of the wiring 112 remains the same as that before the potential V2 is applied to the wiring 113. On the other hand, when the potential V2 is applied to the wiring 113 on the assumption that the potential of the node 11 before the potential V2 is applied to the wiring 113 exceeds V2+Vth101, for example, the transistor 101 is turned on, so that electrical continuity is established between the wiring 111 and the wiring 112. Thus, the potential of the wiring 112 becomes equal to the potential of the wiring 111. That is, the potential of the wiring 112 becomes equal to the potential V1 when the potential V1 is applied to the wiring 111, whereas the potential of the wiring 112 becomes equal to the potential V2 when the potential V2 is applied to the wiring 111.

As described above, in the semiconductor device in this embodiment, the potential of the wiring 112 can be made equal to the potential of the wiring 111 by using the bootstrap operation.

In a conventional semiconductor device, a transistor has a large S value. For that reason, it takes a long time after the potential V1 is applied to the wiring 113 until the transistor 102 is turned off; the timing at which the potential of the node 11 starts to rise due to bootstrap operation is delayed; the potential of the node 11 is lowered; the potential difference between the gate and the second terminal of the transistor 101 is small; the rise time of the potential of the wiring 112 is long; a load capable of being connected to the wiring 112 is small; the channel width of the transistor 101 is large; or the layout area is large.

In contrast, the S value can be reduced in the semiconductor device of this embodiment because an oxide semiconductor is used for a semiconductor layer of a transistor included in the semiconductor device. For that reason, the drive capability of the semiconductor device can be improved. For example, when the transistor 102 has a small S value, it is possible to shorten the time after the potential V1 is applied to the wiring 113 until the transistor 102 is turned off; thus, the timing at which the potential of the node 11 starts to rise due to bootstrap operation can be advanced. When the timing at which the potential of the node 11 starts to rise is advanced, the potential of the node 11 can be made higher, so that the potential difference between the gate and the second terminal of the transistor 101 can be increased. As a result, the rise time of the potential of the wiring 112 can be shortened. Alternatively, even when a large load is connected to the wiring 112, the load can be driven. Alternatively, the channel width of the transistor 101 can be reduced, so that the layout area can be decreased. As another example, a small S value of the transistor 101 can shorten the rise time of the potential of the wiring 112.

Further, in a conventional semiconductor device, the off-state current of a transistor is large. For that reason, the amount of electric charge that is lost from the node 11 over time is large; the potential of the node 11 is lowered; the time during which the potential of the node 11 can be kept higher than V1+Vth101 is short; it is difficult to lower the drive frequency; or the range of drive frequencies with which the semiconductor device can operate is narrow.

In contrast, the off-state current of the transistor included in the semiconductor device of this embodiment is small. Thus, the drive capability of the semiconductor device can be improved. For example, when the transistor 102 has a small off-state current, it is possible to decrease the amount of electric charge lost from the node 11, so that a reduction in potential of the node 11 can be suppressed. In other words, it is possible to extend the time during which the potential of the node 11 can be kept higher than V1+Vth101. As a result, the drive frequency can be lowered, so that the range of drive frequencies with which the semiconductor device in this embodiment can operate can be enlarged.

In the case where the potential V1 and the potential V2 are selectively applied to the wiring 111, the potential of the node 11 rises to V1−Vth102 and then further rises due to bootstrap operation. In other words, the potential difference between the gate and the second terminal of the transistor 101 can be increased. Thus, the rise time of the potential of the wiring 112 can be shortened. Alternatively, even when a large load is connected to the wiring 112, the load can be driven. Alternatively, the channel width of the transistor 101 can be reduced, so that the layout area can be decreased.

Note that in the case where the potential V1 and the potential V2 are selectively applied to the wiring 111, after the potential V1 is applied to the wiring 113, the potential of the wiring 112 rises at the same time as the application of the potential V1 to the wiring 111. Therefore, the semiconductor device in this embodiment can be used as part of a shift register circuit.

Next, an example of a function of each transistor will be described.

The transistor 101 has a function of controlling electrical continuity between the wiring 111 and the wiring 112. That is, the transistor 101 has a function of a switch. Alternatively, the transistor 101 has a function of controlling the timing of supplying the potential of the wiring 111 to the wiring 112, a function of controlling the timing of raising the potential of the wiring 112, or a function of controlling the timing of raising the potential of the node 11 by parasitic capacitance between the gate and the second terminal of the transistor 101. Note that the transistor 101 has at least one of the above functions.

The transistor 102 has a function of controlling electrical continuity between the wiring 113 and the node 11. That is, the transistor 102 has a function of a switch. Alternatively, the transistor 102 has a function of establishing electrical continuity between the wiring 113 and the node 11 when the potential of the wiring 113 is higher than the potential of the node 11, and breaking electrical continuity between the wiring 113 and the node 11 when the potential of the wiring 113 is lower than the potential of the node 11. That is, the transistor 102 has a function of a diode. Alternatively, the transistor 102 has a function of controlling the timing of supplying the potential of the wiring 113 to the node 11, a function of controlling the timing of raising the potential of the node 11, or a function of controlling the timing of bringing the node 11 into a floating state. Note that the transistor 102 has at least one of the above functions.

Next, an example of potentials applied to each wiring will be described. By controlling a potential applied to each wiring as appropriate, the semiconductor device in this embodiment can have a variety of functions or the drive capability of the semiconductor device can be improved.

For example, in the case where the potential V1 and the potential V2 are selectively applied to the wiring 113, the wiring 111 can be supplied with a potential higher than the potential V1 or a potential lower than the potential V1. When the wiring 111 is supplied with a potential that is higher or lower than the potential V1, the semiconductor device in this embodiment can have a function of a level shift circuit.

Note that when the wiring 111 is supplied with a potential higher than the potential V1, it is preferable that the potential applied to the wiring 111 be higher than the potential V1 and be 4 times or less as high as the potential V1. More preferably, the potential is 1.2 to 3 times as high as the potential V1. Further preferably, the potential is 1.5 to 2.3 times as high as the potential V1.

Note that when the wiring 111 is supplied with a potential lower than the potential V1, it is preferable that the potential applied to the wiring 111 be 0.2 times or more as high as the potential V1 and be less than the potential V1. More preferably, the potential is 0.3 to 0.9 times as high as the potential V1. Further preferably, the potential is 0.5 to 0.7 times as high as the potential V1.

For example, in the case where the potential V1 is applied to the wiring 111, the wiring 113 can be supplied with a potential higher than the potential V1. Specifically, it is preferable that the potential applied to the wiring 113 be higher than the potential applied to the wiring 111 and be 3 times or less as high as the potential applied to the wiring 111. The potential applied to the wiring 113 is more preferably 1.3 to 2.5 times, further preferably 1.5 to 2 times as high as the potential applied to the wiring 111. When the potential applied to the wiring 113 is high, it is possible to shorten the time after the potential V1 is applied to the wiring 113 until the transistor 102 is turned off; thus, the timing at which the potential of the node 11 starts to rise due to bootstrap operation can be advanced. When the timing at which the potential of the node 11 starts to rise is advanced, the potential of the node 11 can be made higher, so that the potential difference between the gate and the second terminal of the transistor 101 can be increased. As a result, the rise time of the potential of the wiring 112 can be shortened. Alternatively, even when a large load is connected to the wiring 112, the load can be driven. Alternatively, the channel width of the transistor 101 can be reduced, so that the layout area can be decreased.

Next, an example of the threshold voltage of each transistor will be described. When each transistor has an appropriate threshold voltage, the drive capability of the semiconductor device can be improved.

For example, it is preferable that the threshold voltage of the transistor 102 be as low as possible. Specifically, the threshold voltage of the transistor 102 is preferably lower than that of the transistor 101. The threshold voltage of the transistor 102 is preferably 0.1 times or more as high as that of the transistor 101 and lower than that of the transistor 101. The threshold voltage of the transistor 102 is more preferably 0.3 to 0.9 times, further preferably 0.5 to 0.7 times as high as that of the transistor 101. When the transistor 102 has a low threshold voltage, it is possible to shorten the time after the potential V1 is applied to the wiring 113 until the transistor 102 is turned off; thus, the timing at which the potential of the node 11 starts to rise due to bootstrap operation can be advanced. When the timing at which the potential of the node 11 starts to rise is advanced, the potential of the node 11 can be made higher, so that the potential difference between the gate and the second terminal of the transistor 101 can be increased. As a result, the rise time of the potential of the wiring 112 can be shortened. Alternatively, even when a large load is connected to the wiring 112, the load can be driven. Alternatively, the channel width of the transistor 101 can be reduced, so that the layout area can be decreased.

Moreover, for example, the threshold voltage of the transistor 101 is preferably lower than the drive voltage of the semiconductor device (e.g., the potential V1−the potential V2). Specifically, the threshold voltage of the transistor 101 is preferably $\frac{1}{50}$ to $\frac{1}{2}$ times, more preferably $\frac{1}{40}$ to $\frac{1}{7}$ times, further preferably $\frac{1}{30}$ to $\frac{1}{10}$ times as high as the drive voltage of the semiconductor device. The threshold voltage of the transistor 101 is made lower than the drive voltage of the semiconductor device, so that a malfunction of the semiconductor device can be prevented and the semiconductor device can operate correctly.

Next, an example of the size of each transistor will be described. When each transistor has an appropriate size, the drive capability of the semiconductor device in this embodiment can be improved.

For example, the channel width of the transistor 101 is preferably larger than that of the transistor 102. The channel width of the transistor 101 is preferably 2 to 100 times, more preferably 5 to 50 times, further preferably 10 to 30 times as large as that of the transistor 102.

Note that the current supply capability of a transistor can be controlled by the channel width (W) of the transistor. Specifically, the larger the channel width of the transistor is, the more the current supply capability of the transistor is improved.

Note that a factor in controlling the current supply capability of a transistor is not limited to the channel width of the transistor. For example, the current supply capability of a transistor can be controlled by the channel length (L) of the transistor, the W/L ratio of the transistor, a potential difference (Vgs) between a gate and a source of the transistor, or the like. Specifically, the current supply capability of a transistor is improved as the channel length of the transistor is smaller, the W/L ratio of the transistor is larger, or Vgs of the transistor is larger. Therefore, in this specification and the like, the expression "the channel width of the transistor is large" has the same meaning as the expressions "the channel length of the transistor is small," "the W/L ratio of the transistor is large," and "Vgs of the transistor is large".

Next, a semiconductor device with a structure different from that of the semiconductor device in FIG. 1A will be described.

For example, in the semiconductor device illustrated in FIG. 1A, a wiring to which the gate and/or the first terminal of the transistor 102 is/are connected is not limited to the wiring 113 and can be various other wirings.

Figure 3A:
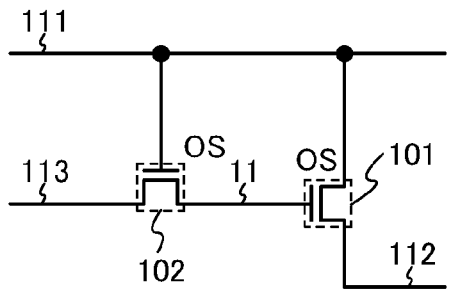
FIGS. 3A to 3D each illustrate an example of a circuit diagram of a semiconductor device in Embodiment 1.

FIG. 3A illustrates an example of the case where the gate of the transistor 102 is connected to the wiring 111 in the semiconductor device illustrated in FIG. 1A. In the semiconductor device in FIG. 3A, in the case where the potential V2 is applied to the wiring 113, the potential of the node 11 can be made equal to the potential V2.

Figure 3B:
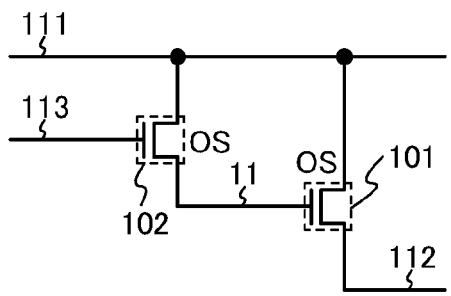

FIG. 3B illustrates an example of the case where the first terminal of the transistor 102 is connected to the wiring 111 in the semiconductor device illustrated in FIG. 1A. In the semiconductor device in FIG. 3B, the potential V1 can be supplied to the node 11 from the wiring 111 whose resistance is lower than that of the wiring 113, so that the potential of the node 11 can be raised quickly.

Figure 3C:
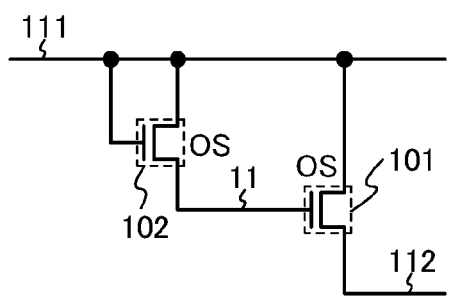

FIG. 3C illustrates an example of the case where the gate of the transistor 102 is connected to the wiring 111 and the first terminal of the transistor 102 is connected to the wiring 111 in the semiconductor device illustrated in FIG. 1A. In the semiconductor device in FIG. 3C, the wiring 113 can be omitted, so that the number of wirings and the number of signals can be reduced.

In addition, for example, when the capacitance between the node 11 and the wiring 112 is increased in the semiconductor devices illustrated in FIG. 1A and FIGS. 3A to 3C, the potential of the node 11 at the time of bootstrap operation can be made higher.

Specifically, for example, in the semiconductor devices illustrated in FIG. 1A and FIGS. 3A to 3C, a capacitor can be connected between the node 11 and the wiring 112. It is preferable that one electrode of a capacitor 121 be formed using the material used for the gate of the transistor 101 and be connected to the node 11. Moreover, it is preferable that the other electrode of the capacitor 121 be formed using the material used for the second terminal of the transistor 101 and be connected to the wiring 112. A contact hole or the like can be omitted in such a manner, so that the layout area can be decreased.

Alternatively, for example, in the semiconductor devices illustrated in FIG. 1A and FIGS. 3A to 3C, the area where the material used for forming the gate of the transistor 101 overlaps with the material used for forming the second terminal of the transistor 101 can be made larger than the area where the material used for forming the gate of the transistor 101 overlaps with the material used for forming the first terminal of the transistor 101. Specifically, it is preferable that the area where the material of the gate of the transistor 101 overlaps with the material of the second terminal of the transistor 101 be larger than the area where the material of the gate of the transistor 101 overlaps with the material of the first terminal of the transistor 101, and be 5 times or less as large as the area where the material of the gate of the transistor 101 overlaps with the material of the first terminal of the transistor 101. The area where the material of the gate of the transistor 101 overlaps with the material of the second terminal of the transistor 101 is more preferably 1.5 to 4 times, further preferably 2 to 3 times as large as the area where the material of the gate of the transistor 101 overlaps with the material of the first terminal of the transistor 101.

Figure 3D:
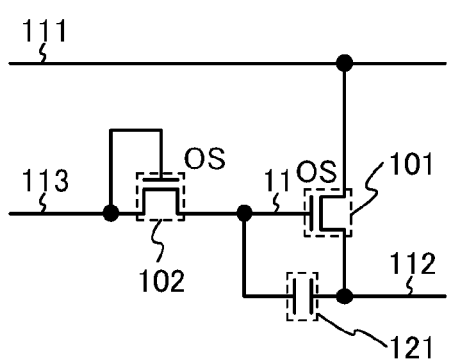

FIG. 3D illustrates an example of the case where the capacitor 121 is connected between the gate and the second terminal of the transistor 101 in the semiconductor device illustrated in FIG. 1A.

For example, in the semiconductor devices in FIGS. 3A to 3D, the first terminal of the transistor 101 and the gate or the first terminal of the transistor 102 can be connected to different wirings.

Figure 4A:
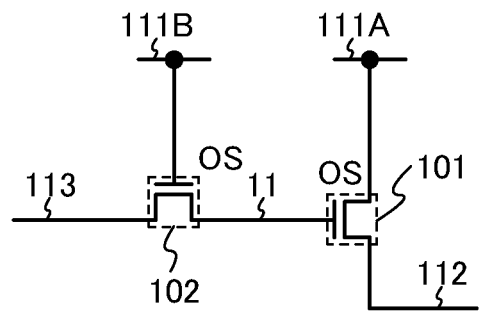
FIGS. 4A to 4C each illustrate an example of a circuit diagram of a semiconductor device in Embodiment 1.

FIG. 4A illustrates an example of the case where the first terminal of the transistor 101 is connected to a wiring 111A and the gate of the transistor 102 is connected to a wiring 111B in the semiconductor device illustrated in FIG. 3A.

Figure 4B:
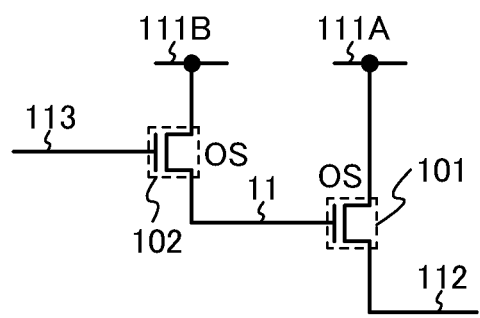

FIG. 4B illustrates an example of the case where the first terminal of the transistor 101 is connected to the wiring 111A and the first terminal of the transistor 102 is connected to the wiring 111B in the semiconductor device illustrated in FIG. 3B.

Figure 4C:
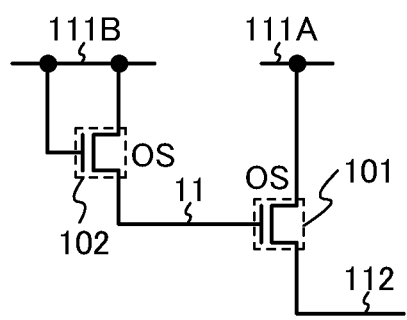

FIG. 4C illustrates an example of the case where the first terminal of the transistor 101 is connected to the wiring 111A and the gate and the first terminal of the transistor 102 are connected to the wiring 111B in the semiconductor device illustrated in FIG. 3C.

Note that the wirings 111A and 111B have a function similar to that of the wiring 111. The potential V1 is supplied to the wirings 111A and 111B. Note that potentials applied to the wirings 111A and 111B can be different from each other. For example, when the wiring 111A is supplied with a potential higher than the potential V1 or a potential lower than the potential V1, the semiconductor devices illustrated in FIGS. 4A to 4C can have a function of a level shift circuit. As another example, when the wiring 111B is supplied with a potential higher than the potential V1, the rise time of the potential of the node 11 can be shortened. On the other hand, when the wiring 111B is supplied with a potential lower than the potential V1, the timing at which the transistor 102 is turned off can be advanced.

Note that in this specification and the like, a transistor with a multi-gate structure having two or more gate electrodes can be used as a transistor, for example. In the multi-gate structure, a plurality of channel regions corresponding to a plurality of gate electrodes are connected in series, so that the structure is such that a plurality of transistors are connected in series. For that reason, with the multi-gate structure, the off-state current can be further reduced and the withstand voltage of the transistor can be increased (the reliability can be improved). Alternatively, with the multi-gate structure, drain-source current does not change much even if drain-source voltage changes when the transistor operates in a saturation region, so that a flat slope of voltage-current characteristics can be obtained. By utilizing the flat slope of the voltage-current characteristics, an ideal current source circuit or an active load having an extremely large resistance can be realized. As a result, a differential circuit, a current mirror circuit, or the like with excellent properties can be realized.

Note that a transistor with a structure where gate electrodes are formed above and below a channel can be used as a transistor, for example. With the structure where the gate electrodes are formed above and below the channel, a circuit structure where a plurality of transistors are connected in parallel is provided. Thus, a channel region is increased, so that the amount of current can be increased. Alternatively, with the structure where gate electrodes are formed above and below the channel, a depletion layer is easily formed; thus, the S value can be improved.

Note that as a transistor, for example, it is possible to use a transistor with a structure where a gate electrode is formed above a channel region, a structure where a gate electrode is formed below a channel region, a staggered structure, an inverted staggered structure, a structure where a channel region is divided into a plurality of regions, a structure where channel regions are connected in parallel or in series, or the like.

Note that for example, a transistor with a structure where a source electrode or a drain electrode overlaps with a channel region (or part thereof) can be used as a transistor. By using the structure where the source electrode or the drain electrode overlaps with the channel region (or part thereof), unstable operation due to accumulation of electric charge in part of the channel region can be prevented.

Note that in this specification and the like, in a diagram or a text described in one embodiment, it is possible to take out part of the diagram or the text and constitute an embodiment of the invention. Therefore, in the case where a diagram or a text related to a certain portion is described, the context taken out from part of the diagram or the text is also disclosed as one embodiment of the invention and can constitute one embodiment of the invention. Thus, for example, in a diagram or a text including one or more of active elements (e.g., transistors or diodes), wirings, passive elements (e.g., capacitors or resistors), conductive layers, insulating layers, semiconductor layers, organic materials, inorganic materials, components, devices, operating methods, manufacturing methods, or the like, it is possible to take out part of the diagram or the text and constitute one embodiment of the invention. For example, from a circuit diagram in which N circuit elements (e.g., transistors or capacitors; N is an integer) are provided, it is possible to constitute one embodiment of the invention by taking out M circuit elements (e.g., transistors or capacitors; M is an integer, where M<N). As another example, it is possible to constitute one embodiment of the invention by taking out M layers (M is an integer, where M<N) from a cross-sectional view in which N layers (N is an integer) are provided. As another example, it is possible to constitute one embodiment of the invention by taking out M elements (M is an integer, where M<N) from a flow chart in which N elements (N is an integer) are provided.

Note that in the case where at least one specific example is described in a diagram or a text described in one embodiment in this specification and the like, it will be readily appreciated by those skilled in the art that a broader concept of the specific example can be derived. Therefore, in the case where at least one specific example is described in the diagram or the text described in one embodiment, a broader concept of the specific example is disclosed as one embodiment of the invention, and one embodiment of the invention can be constituted.

Note that in this specification and the like, a content described in at least a diagram (which may be part of the diagram) is disclosed as one embodiment of the invention, and one embodiment of the invention can be constituted. Therefore, when a certain content is described in a diagram, the content is disclosed as one embodiment of the invention even when the content is not described with a text, and one embodiment of the invention can be constituted. In a similar manner, part of a diagram, which is taken out from the diagram, is disclosed as one embodiment of the invention, and one embodiment of the invention can be constituted.

Embodiment 2

In this embodiment, an example of a structure of a semiconductor device and an example of a method for driving the semiconductor device will be described. In particular, an example of an inverter circuit and a buffer circuit that include the semiconductor device shown in Embodiment 1 and an example of a method for driving the inverter circuit and the buffer circuit will be described.

First, an example of a structure of a semiconductor device in this embodiment will be described.

Figure 5A:
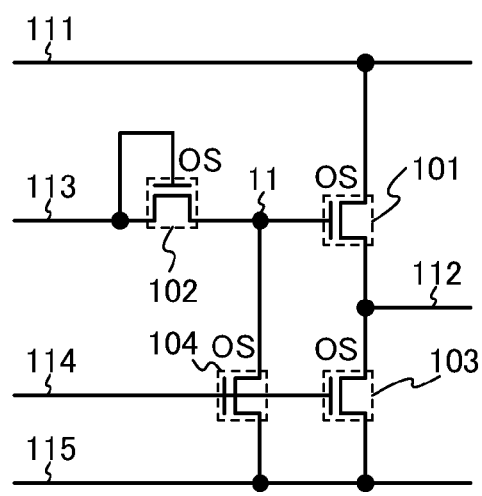
FIG. 5A illustrates an example of a circuit diagram of a semiconductor device in Embodiment 2.

FIG. 5A illustrates an example of a structure of a semiconductor device. The semiconductor device illustrated in FIG. 5A includes the transistor 101, the transistor 102, a transistor 103, a transistor 104, the wiring 112, the wiring 113, a wiring 114, and a wiring 115. The transistors 101 to 104 are formed using an oxide semiconductor material. The transistors 103 and 104 are n-channel transistors.

FIG. 5A illustrates the semiconductor device obtained by additionally providing the transistors 103 and 104 in the semiconductor device in FIG. 1A. A gate of the transistor 103 is connected to the wiring 114. A first terminal of the transistor 103 is connected to the wiring 115. A second terminal of the transistor 103 is connected to the wiring 112. A gate of the transistor 104 is connected to the wiring 114. A first terminal of the transistor 104 is connected to the wiring 115. A second terminal of the transistor 104 is connected to the gate of the transistor 101. Note that the semiconductor device in this embodiment is not limited to having the structure illustrated in FIG. 5A and can have a variety of other structures.

Next, an example of potentials applied to each wiring will be described.

The potential V1 and the potential V2 are selectively applied to the wiring 114. That is, a signal is input to the wiring 114. Therefore, the wiring 114 has a function of a signal line. Assuming that an inverted signal of a signal input to the wiring 113 is input to the wiring 114, the potential V1 is applied to the wiring 114 when the potential V2 is applied to the wiring 113, whereas the potential V2 is applied to the wiring 114 when the potential V1 is applied to the wiring 113. Note that the wirings 113 and 114 can be supplied with the same potential without limitation to the above.

The potential V2 is applied to the wiring 115. That is, a constant voltage (e.g., a voltage V2) is supplied to the wiring 115. Therefore, the wiring 115 has a function of a power supply line. Note that the potential applied to the wiring 115 is not limited to the potential V2, and various other potentials can be applied to the wiring 115. For example, the potential V1 and the potential V2 can be selectively applied to the wiring 115. When the potential V1 is applied to the wiring 115, a reverse bias can be applied to the transistors 103 and 104; thus, shift of the threshold voltage of the transistors 103 and 104 can be suppressed.

Next, an example of operation of the semiconductor device illustrated in FIG. 5A will be described. The following two different operations will be described below: the operation in the case where the potential V2 is applied to the wiring 113 and the potential V1 is applied to the wiring 114, and the operation in the case where the potential V1 is applied to the wiring 113 and the potential V2 is applied to the wiring 114.

Figure 5B:
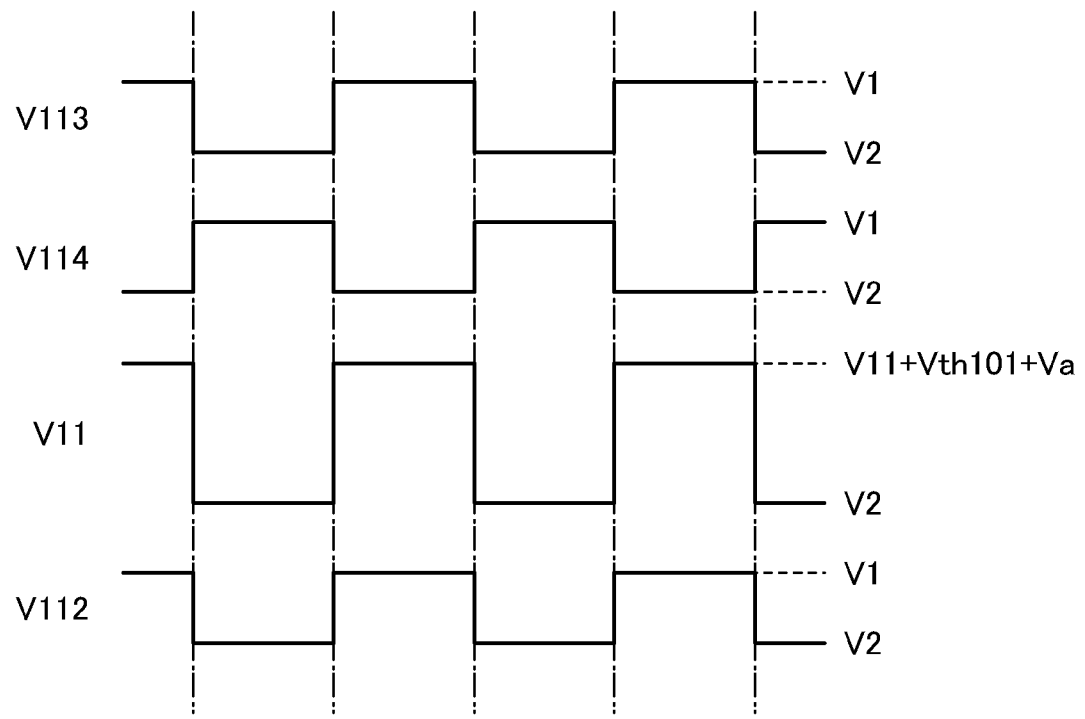
FIG. 5B illustrates an example of a timing chart for explaining operation of the semiconductor device.

FIG. 5B is an example of a timing chart for explaining operation of the semiconductor device in FIG. 5A. FIG. 5B illustrates the potential of the wiring 113 (a potential V113), the potential of the wiring 114 (a potential V114), the potential of the node 11 (a potential V11), and the potential of the wiring 112 (a potential V112).

First, the operation in the case where the potential V2 is applied to the wiring 113 and the potential V1 is applied to the wiring 114 will be described.

Figure 6A:
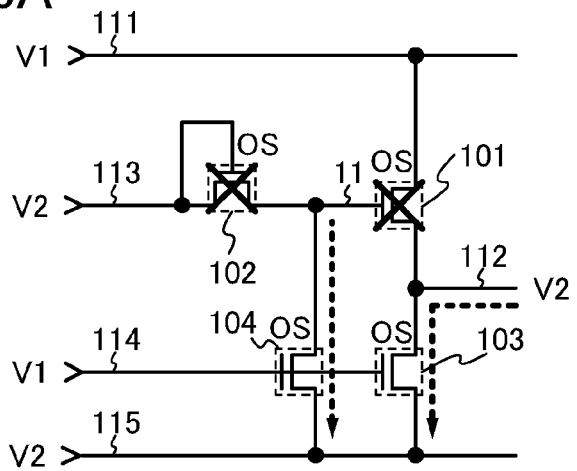
FIGS. 6A to 6C each illustrate an example of a schematic diagram for explaining operation of a semiconductor device in Embodiment 2.

When the potential V2 is applied to the wiring 113 and the potential V1 is applied to the wiring 114, the transistor 104 is turned on, so that electrical continuity is established between the wiring 115 and the node 11. At this time, the transistor 102 is turned off, so that electrical continuity is not established between the wiring 113 and the node 11. The potential of the wiring 115 is supplied to the node 11 in such a manner, so that the potential of the node 11 becomes equal to the potential V2. Thus, the transistor 101 is turned off, so that electrical continuity is not established between the wiring 111 and the wiring 112. At this time, the transistor 103 is turned on, so that electrical continuity is established between the wiring 115 and the wiring 112. The potential of the wiring 115 is supplied to the wiring 112 in such a manner, whereby the potential of the wiring 112 becomes equal to the potential V2 (see FIG. 6A).

Then, the operation in the case where the potential V1 is applied to the wiring 113 and the potential V2 is applied to the wiring 114 will be described.

Figure 6B:
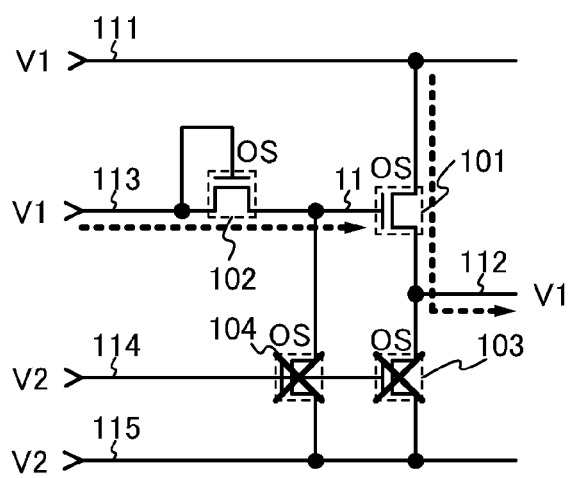

When the potential V1 is applied to the wiring 113 and the potential V2 is applied to the wiring 114, the transistor 104 is turned off, so that electrical continuity is not established between the wiring 115 and the node 11. At this time, the transistor 102 is turned on, so that electrical continuity is established between the wiring 113 and the node 11. The potential of the wiring 113 is supplied to the node 11 in such a manner, so that the potential of the node 11 starts to rise. Then, the potential of the node 11 rises to V2+Vth101. Thus, the transistor 101 is turned on, so that electrical continuity is established between the wiring 111 and the wiring 112. At this time, the transistor 103 is turned off, so that electrical continuity is not established between the wiring 115 and the wiring 112. The potential of the wiring 111 is supplied to the wiring 112 in such a manner, whereby the potential of the wiring 112 starts to rise (see FIG. 6B).

Figure 6C:
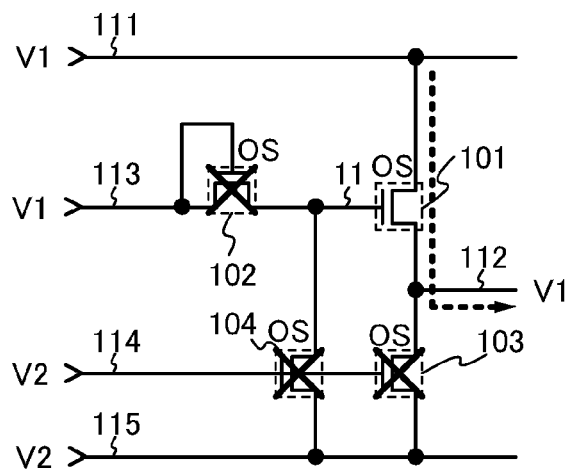

After that, the potential of the node 11 rises to V1−Vth102. Thus, the transistor 102 is turned off, so that electrical continuity between the wiring 113 and the node 11 is broken. Then, the node 11 enters a floating state. At this time, the potential of the wiring 112 continues to rise. For that reason, the potential of the node 11 rises to V1+Vth101+Va because of parasitic capacitance between the gate and the second terminal of the transistor 101. This is so-called bootstrap operation. Accordingly, the potential of the wiring 112 rises to a value equal to that of the potential V1 (see FIG. 6C).

As described above, in the semiconductor device in this embodiment, the potential of the wiring 112 can be made equal to the potential of the wiring 111 or the potential of the wiring 115 by using the bootstrap operation.

In a conventional semiconductor device, a transistor has a large S value. For that reason, it takes a long time after the potential V1 is applied to the wiring 113 until the transistor 102 is turned off; the timing at which the potential of the node 11 starts to rise due to bootstrap operation is delayed; the potential of the node 11 is lowered; the potential difference between the gate and the second terminal of the transistor 101 is small; the rise time of the potential of the wiring 112 is long; a load capable of being connected to the wiring 112 is small; the channel width of the transistor 101 is large; the layout area is large; the fall time of the potential of the wiring 112 is long; it takes a long time after the potential V1 is applied to the wiring 114 until the transistor 101 is turned off; it takes a long time for current to flow from the wiring 111 to the wiring 115 through the transistor 101 and the transistor 103; or power consumption is increased.

In contrast, the S value can be reduced in the semiconductor device of this embodiment because an oxide semiconductor is used for a semiconductor layer of a transistor included in the semiconductor device. For that reason, the drive capability of the semiconductor device can be improved. For example, when the transistor 102 has a small S value, it is possible to shorten the time after the potential V1 is applied to the wiring 113 until the transistor 102 is turned off; thus, the timing at which the potential of the node 11 starts to rise because of bootstrap operation can be advanced. When the timing at which the potential of the node 11 starts to rise is advanced, the potential of the node 11 can be made higher, so that the potential difference between the gate and the second terminal of the transistor 101 can be increased. As a result, the rise time of the potential of the wiring 112 can be shortened. Alternatively, even when a large load is connected to the wiring 112, the load can be driven. Alternatively, the channel width of the transistor 101 can be reduced, so that the layout area can be decreased. As another example, a small S value of the transistor 101 can shorten the rise time of the potential of the wiring 112. As another example, a small S value of the transistor 103 can shorten the fall time of the potential of the wiring 112. As another example, a small S value of the transistor 104 can shorten the time after the potential V1 is applied to the wiring 114 until the transistor 101 is turned off. Accordingly, it is possible to suppress current flowing from the wiring 111 to the wiring 115 through the transistor 101 and the transistor 103. Thus, power consumption can be reduced.

Further, in a conventional semiconductor device, the off-state current of a transistor is large. For that reason, the amount of electric charge leaking from the node 11 is large; the potential of the node 11 is lowered; the time during which the potential of the node 11 can be kept higher than V1+Vth101 is short; it is difficult to lower the drive frequency; or the range of drive frequencies with which the semiconductor device can operate is narrow.

In contrast, the off-state current of a transistor included in the semiconductor device of this embodiment is small. For that reason, the drive capability of the semiconductor device can be improved. For example, when the transistors 102 and 104 have a small off-state current, it is possible to decrease the amount of electric charge leaking from the node 11. Thus, a reduction in potential of the node 11 can be suppressed. In other words, it is possible to extend the time during which the potential of the node 11 can be kept higher than V1+Vth101. As a result, the drive frequency can be lowered, so that the range of drive frequencies with which the semiconductor device in this embodiment can operate can be enlarged.

Note that a signal output from the wiring 112 is an inverted signal of a signal input to the wiring 114. That is, the semiconductor device in this embodiment can have a function of an inverter circuit. Alternatively, a signal output from the wiring 112 is a non-inverted signal of a signal input to the wiring 113. That is, the semiconductor device in this embodiment can have a function of a buffer circuit.

Next, an example of a function of each transistor will be described.

The transistor 103 has a function of controlling electrical continuity between the wiring 115 and the wiring 112. That is, the transistor 103 has a function of a switch. Alternatively, the transistor 103 has a function of controlling the timing of supplying the potential of the wiring 115 to the wiring 112 or a function of controlling the timing of decreasing the potential of the wiring 112. Note that the transistor 103 has at least one of the above functions.

The transistor 104 has a function of controlling electrical continuity between the wiring 115 and the node 11. That is, the transistor 104 has a function of a switch. Alternatively, the transistor 104 has a function of controlling the timing of supplying the potential of the wiring 115 to the node 11 or a function of controlling the timing of decreasing the potential of the node 11. Note that the transistor 104 has at least one of the above functions.

Next, various potentials applied to each wiring will be described. By controlling a potential applied to each wiring as appropriate, the semiconductor device in this embodiment can have a variety of functions or the drive capability of the semiconductor device can be improved.

For example, in the case where the potential V1 and the potential V2 are selectively applied to the wiring 113 or the wiring 114, the wiring 111 can be supplied with a potential higher than the potential V1 or a potential lower than the potential V1. Thus, the semiconductor device in this embodiment can have a function of a level shift circuit.

Note that when the wiring 111 is supplied with a potential higher than the potential V1, it is preferable that the potential be higher than the potential V1 and be 4 times or less as high as the potential V1. More preferably, the potential is 1.2 to 3 times as high as the potential V1. Further preferably, the potential is 1.5 to 2.3 times as high as the potential V1.

Note that when the wiring 111 is supplied with a potential lower than the potential V1, it is preferable that the potential be 0.2 times or more as high as the potential V1 and be less than the potential V1. More preferably, the potential is 0.3 to 0.9 times as high as the potential V1. Further preferably, the potential is 0.5 to 0.7 times as high as the potential V1.

In addition, for example, in the case where the potential V1 and the potential V2 are selectively applied to the wiring 114, a potential lower than the potential V1 and a potential higher than the potential V2 can be selectively applied to the wiring 113. In that case, the rise time of the potential of the wiring 114 is often shorter than that of the potential of the wiring 113. Alternatively, the fall time of the potential of the wiring 114 is often shorter than that of the potential of the wiring 113. The wiring 114 is connected to the wiring 113 through an inverter circuit in many cases.

For example, in the case where the potential V1 and the potential V2 are selectively applied to the wiring 113, a potential lower than the potential V1 and a potential higher than the potential V2 can be selectively applied to the wiring 114. In that case, the rise time of the potential of the wiring 113 is often shorter than that of the potential of the wiring 114. Alternatively, the fall time of the potential of the wiring 113 is often shorter than that of the potential of the wiring 114. The wiring 113 is connected to the wiring 114 through an inverter circuit in many cases.

Next, an example of the threshold voltage of each transistor will be described. When each transistor has an appropriate threshold voltage, the drive capability of the semiconductor device can be improved.

For example, the threshold voltage of the transistor 103 is preferably higher than that of the transistor 101 and/or that of the transistor 102. In particular, the threshold voltage of the transistor 103 is preferably higher than that of the transistor 101 and is preferably 3 times or less as high as that of the transistor 101. The threshold voltage of the transistor 103 is more preferably 1.2 to 2.5 times, further preferably 1.5 to 2 times as high as that of the transistor 101.

Furthermore, for example, the threshold voltage of the transistor 104 is preferably higher than that of the transistor 101 and/or that of the transistor 102. In particular, the threshold voltage of the transistor 104 preferably exceeds that of the transistor 101 and is 3 times or less as high as that of the transistor 101. The threshold voltage of the transistor 104 is more preferably 1.2 to 2.5 times, further preferably 1.5 to 2 times as high as that of the transistor 101.

For example, the sum of the threshold voltage of the transistor 101 and the threshold voltage of the transistor 103 is preferably lower than the drive voltage of the semiconductor device (e.g., the potential V1–the potential V2). Specifically, the sum of the threshold voltages of the transistors 101 and 103 is preferably $1/100$ to $1/2$ times, more preferably $1/50$ to $1/5$ times, further preferably $1/30$ to $1/10$ times as high as the drive voltage of the semiconductor device. The sum of the threshold voltages of the transistors 101 and 103 is made lower than the drive voltage of the semiconductor device, so that a malfunction of the semiconductor device can be prevented and the semiconductor device can operate correctly.

Next, an example of the size of each transistor will be described. When each transistor has an appropriate size, the drive capability of the semiconductor device in this embodiment can be improved.

For example, the potential difference between the gate and the source of the transistor 101 when the transistor 101 is turned on is often smaller than that between the gate and the source of the transistor 103 when the transistor 103 is turned on. Therefore, the channel width of the transistor 101 is preferably larger than that of the transistor 103. Specifically, the channel width of the transistor 101 is preferably larger than that of the transistor 103 and is preferably 10 times or less as large as that of the transistor 103. The channel width of the transistor 101 is more preferably 1.3 to 5 times, further preferably 1.5 to 3 times as large as that of the transistor 103.

For example, the load of the wiring 112 is often larger than the load of the node 11. Therefore, the channel width of the transistor 103 is preferably larger than that of the transistor 104. Specifically, the channel width of the transistor 103 is preferably larger than that of the transistor 104 and is preferably 10 times or less as large as that of the transistor 104. The channel width of the transistor 103 is more preferably 1.5 to 7 times, further preferably 2 to 5 times as large as that of the transistor 104.

For example, the channel length of the transistor 103 and/or the channel length of the transistor 104 is/are preferably large. Specifically, the channel length of the transistor 103 is preferably larger than that of the transistor 101 and/or that of the transistor 102. Alternatively, the channel length of the transistor 104 is preferably larger than that of the transistor 101 and/or that of the transistor 102. When the channel length of the transistor 103 and/or the transistor 104 is increased, the amount of shift in threshold voltage of the transistor 103 and/or the transistor 104 can be reduced. Thus, the reliability of the semiconductor device can be improved.

Next, a semiconductor device with a structure different from that of the semiconductor device in FIG. 5A will be described.

For example, the transistors 103 and 104 can be provided in not only the semiconductor device illustrated in FIG. 1A but also the semiconductor devices illustrated in FIGS. 3A to 3D and FIGS. 4A to 4C. When the semiconductor devices illustrated in FIGS. 3A to 3D and FIGS. 4A to 4C are provided with the transistors 103 and 104, the semiconductor devices have a function and an advantageous effect that are similar to those of the semiconductor device in FIG. 5A.

Figure 7A:
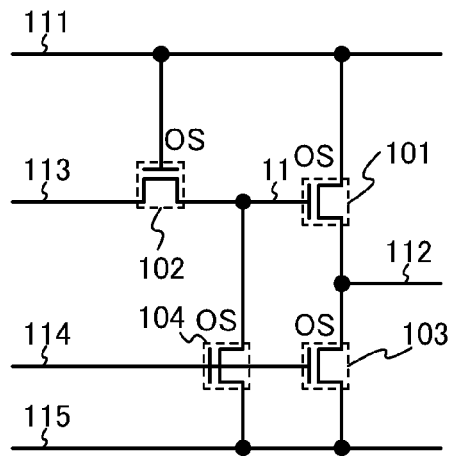
FIGS. 7A to 7C each illustrate an example of a circuit diagram of a semiconductor device in Embodiment 2.

FIG. 7A illustrates an example of the case where the transistors 103 and 104 are provided in the semiconductor device in FIG. 3A.

Figure 7B:
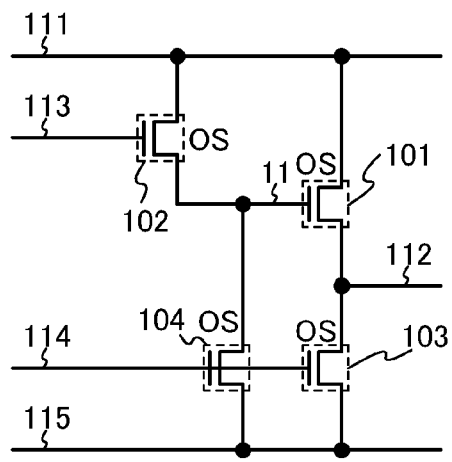

FIG. 7B illustrates an example of the case where the transistors 103 and 104 are provided in the semiconductor device in FIG. 3B.

Figure 7C:
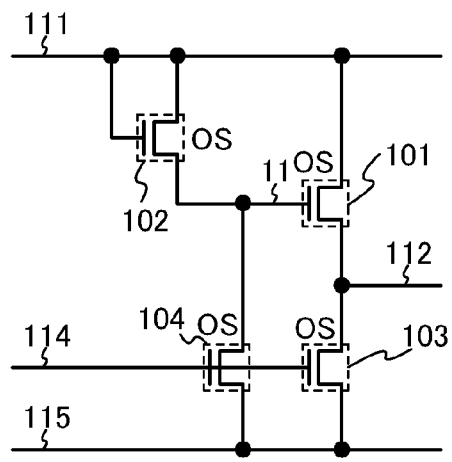

FIG. 7C illustrates an example of the case where the transistors 103 and 104 are provided in the semiconductor device in FIG. 3C. In the semiconductor device in FIG. 7C, the wiring 113 can be omitted, so that the number of wirings and the number of signals can be reduced.

Figure 8A:
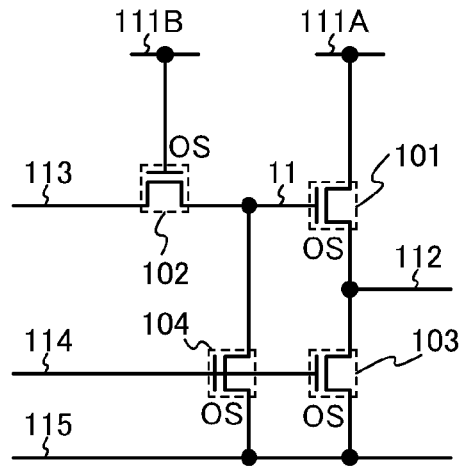
FIGS. 8A to 8C each illustrate an example of a circuit diagram of a semiconductor device in Embodiment 2.

FIG. 8A illustrates an example of the case where the transistors 103 and 104 are provided in the semiconductor device in FIG. 4A.

Figure 8B:
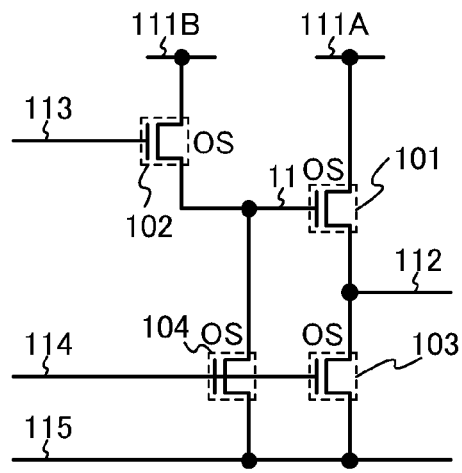

FIG. 8B illustrates an example of the case where the transistors 103 and 104 are provided in the semiconductor device in FIG. 4B.

Figure 8C:
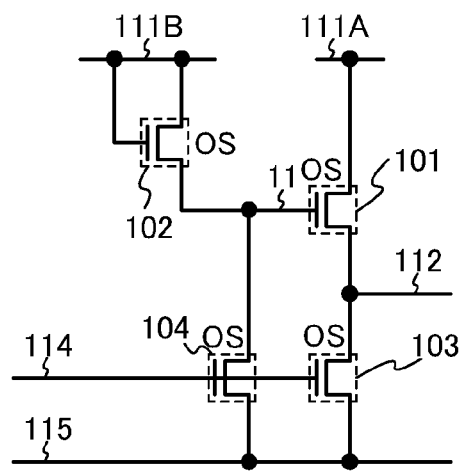

FIG. 8C illustrates an example of the case where the transistors 103 and 104 are provided in the semiconductor device in FIG. 4C.

For example, the transistor 104 can be omitted in each of the semiconductor devices illustrated in FIG. 5A, FIGS. 7A to 7C, and FIGS. 8A to 8C. The number of transistors can be reduced by omitting the transistor 104, so that the layout area can be decreased.

Figure 9A:
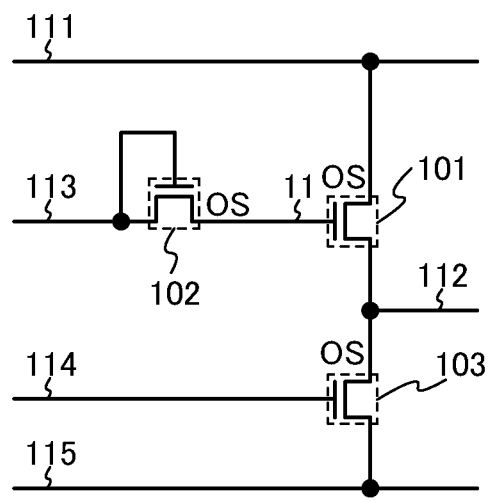
FIGS. 9A and 9B each illustrate an example of a circuit diagram of a semiconductor device in Embodiment 2.

FIG. 9A illustrates an example of the case where the transistor 104 is omitted in the semiconductor device in FIG. 5A.

Figure 9B:
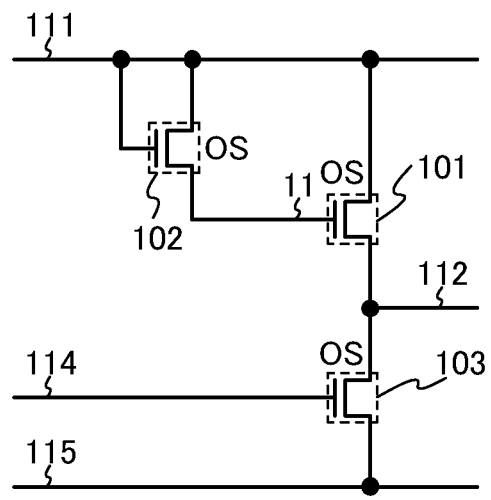

FIG. 9B illustrates an example of the case where the transistor 104 is omitted in the semiconductor device in FIG. 7C.

Next, an example of a circuit having a function of controlling a semiconductor device (such a circuit is also referred to as a control circuit) will be described.

Figure 10:
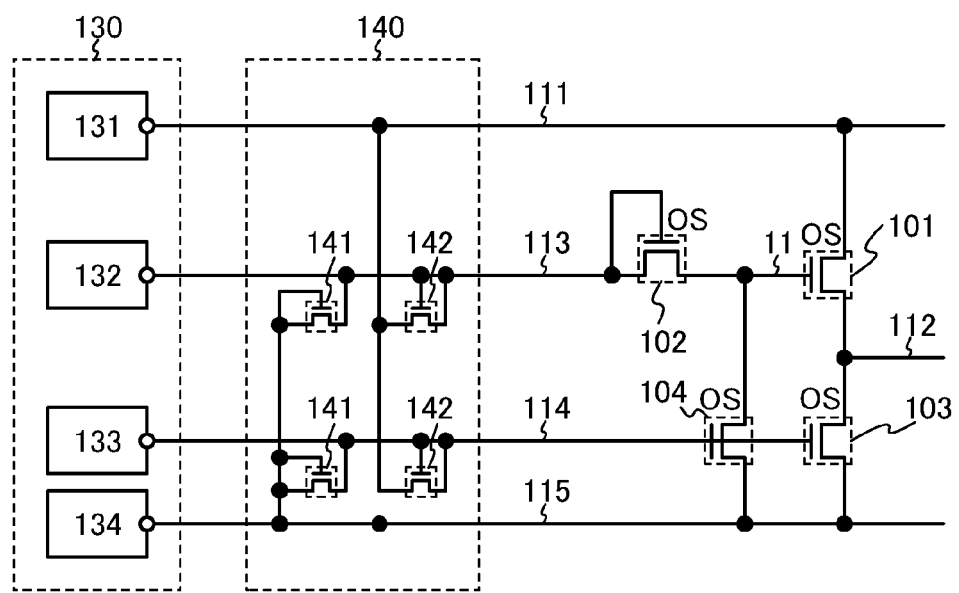
FIG. 10 illustrates an example of a circuit diagram of a semiconductor device in Embodiment 2.

FIG. 10 illustrates a circuit 130 for controlling a semiconductor device. In FIG. 10, the semiconductor device illustrated in FIG. 5A is used as the semiconductor device; however, the semiconductor device to be used is not limited to the semiconductor device in FIG. 5A. For example, any of the semiconductor devices in Embodiment 1, this embodiment, or the other embodiments can be used as the semiconductor device.

The circuit 130 has a function of applying a potential to each wiring of the semiconductor device. That is, the circuit 130 has a function of controlling the timing of outputting a signal or supplying a voltage to each wiring of the semiconductor device.

The circuit 130 includes a circuit 131, a circuit 132, a circuit 133, and a circuit 134. The circuit 131 has a function of supplying the voltage V1 to the wiring 111 or a function of supplying a signal to the wiring 111. The circuit 132 has a function of supplying a signal to the wiring 113. The circuit 133 has a function of supplying a signal to the wiring 114. The circuit 134 has a function of supplying the voltage V1 to the wiring 115. That is, each of the circuits 131, 132, and 133 has a function of a signal generation circuit, a timing generator circuit, or the like. Each of the circuits 131 and 134 has a function of a voltage generation circuit, a regulator circuit, or the like.

Note that each of the circuits 131 to 134 can be constituted by at least one of an amplifier circuit, a bipolar transistor, a MOS transistor, a capacitor, a resistor, a coil, a DC voltage source, an AC voltage source, a DC current source, and a switch.

Note that a protective circuit 140 can be connected to the wirings 113 and 114. The protective circuit 140 includes a plurality of transistors 141 and a plurality of transistors 142. A first terminal of the transistor 141 is connected to the wiring 115. A second terminal of the transistor 141 is connected to the wiring 113 or the wiring 114. A gate of the transistor 141 is connected to the wiring 115. A first terminal of the transistor 142 is connected to the wiring 111. A second terminal of the transistor 142 is connected to the wiring 113 or the wiring 114. A gate of the transistor 142 is connected to the wiring 113 or the wiring 114. Note that either the transistors 141 or the transistors 142 can be omitted.

This embodiment can be combined with any of the other embodiments as appropriate.

Embodiment 3

In this embodiment, an example of a semiconductor device and an example of a method for driving the semiconductor device will be described. In particular, an example of a NOR circuit and a NAND circuit that include the semiconductor device shown in Embodiment 2 and an example of a method for driving the NOR circuit and the NAND circuit will be described.

First, a structure with which the semiconductor device in Embodiment 2 can have a function of a NOR circuit will be described.

In the semiconductor device in Embodiment 2, N transistors 103 (referred to as transistors 103_1 to 103_N, where N is a natural number) are connected in parallel between the wiring 115 and the wiring 112. Gates of the N transistors 103 are connected to N wirings 114 (wirings 114_1 to 114_N), respectively. Moreover, N transistors 104 (referred to as transistors 104_1 to 104_N) are connected in parallel between the wiring 115 and the node 11. Gates of the N transistors 104 are connected to the respective N wirings 114. For example, a first terminal of the transistor 103_i (i is any one of 1 to N) is connected to the wiring 115. A second terminal of the transistor 103_i is connected to the wiring 112. A gate of the transistor 103_i is connected to the wiring 114_i. A first terminal of the transistor 104_i (i is any one of 1 to N) is connected to the wiring 115. A second terminal of the transistor 104_i is connected to the node 11. A gate of the transistor 104_i is connected to the wiring 114_i. With such a structure, the semiconductor device in Embodiment 2 can have a function of a NOR circuit with N inputs.

Figure 11A:
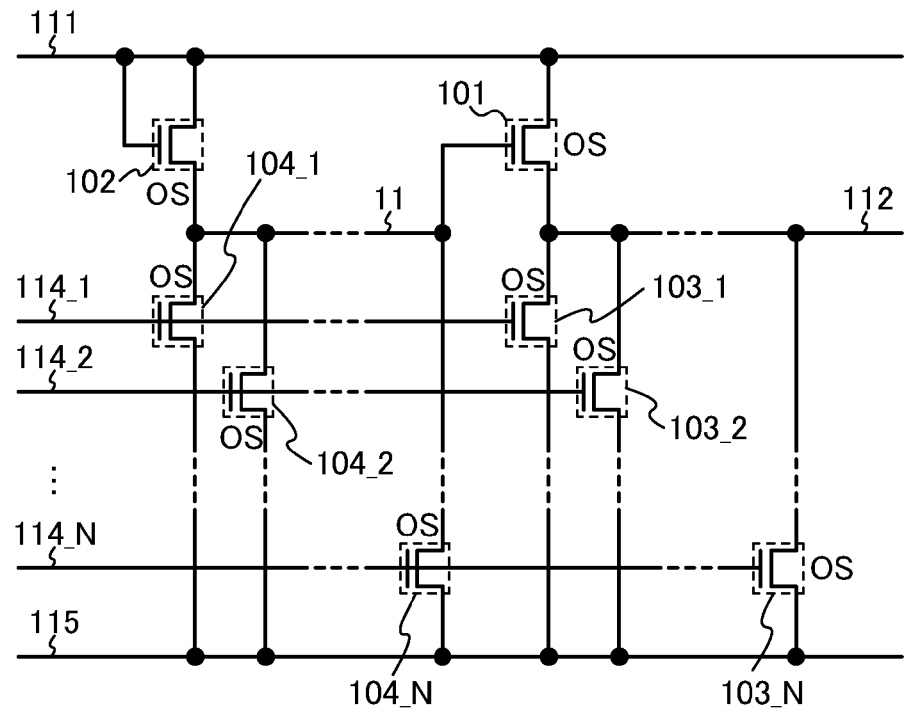
FIGS. 11A and 11B each illustrate an example of a circuit diagram of a semiconductor device in Embodiment 3.

FIG. 11A illustrates an example of a NOR circuit obtained by adding the above-described structure to the semiconductor device illustrated in FIG. 7C.

Figure 11B:
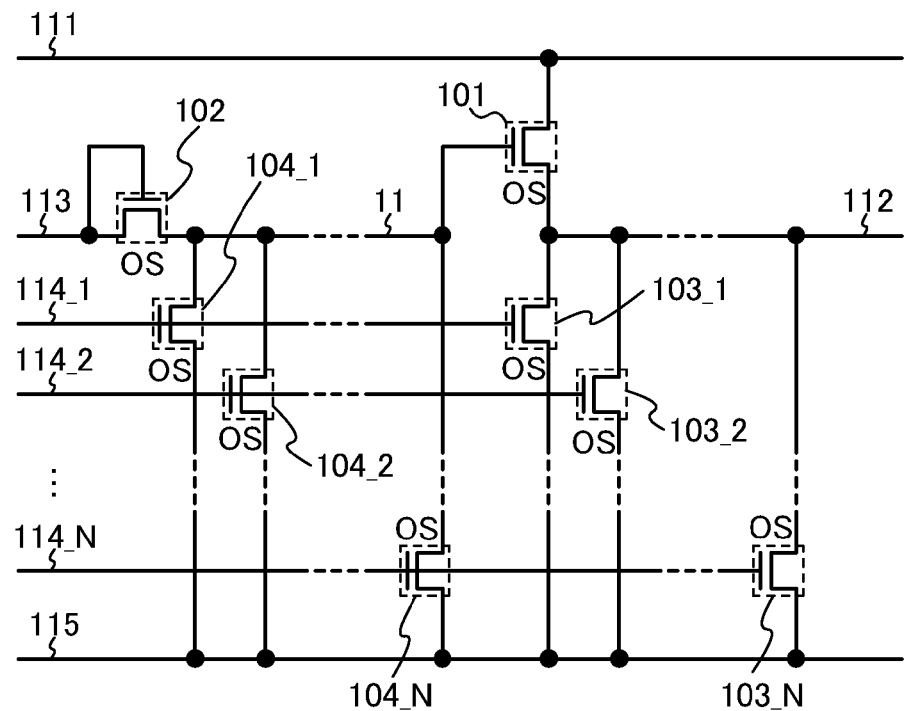

FIG. 11B illustrates an example of a NOR circuit obtained by adding the above-described structure to the semiconductor device illustrated in FIG. 5A. In the NOR circuit in FIG. 11B, an inverted signal of a signal input to any of the N wirings 114 may be input to the wiring 113.

Next, an example of operation of the NOR circuit including the semiconductor device in Embodiment 2 will be described, using the semiconductor device illustrated in FIG. 11A as an example. Here, the following two operations will be described: the operation in the case where the potential V1 is applied to at least one of the N wirings 114, and the operation in the case where the potential V2 is applied to all the N wirings 114.

Figure 12A:
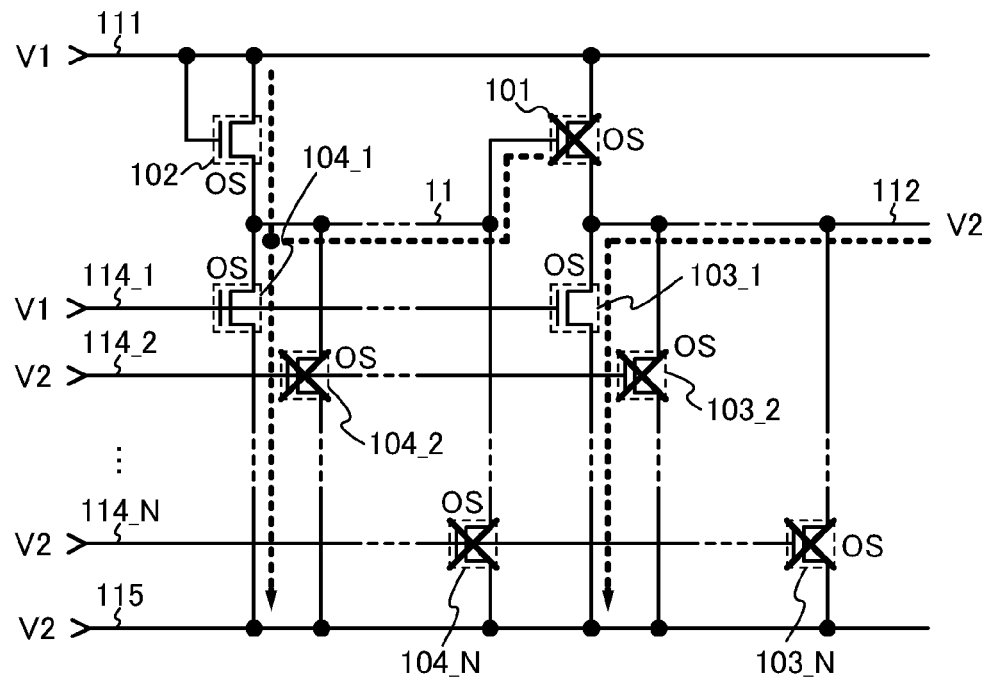
FIGS. 12A and 12B each illustrate an example of a schematic diagram for explaining operation of a semiconductor device in Embodiment 3.

First, the operation in the case where the potential V1 is applied to at least one of the N wirings 114 will be described. It is assumed that the potential V1 is applied to the wiring 114_1 and the potential V2 is applied to the other wirings (the wirings 114_2 to 114_N), and that the potential V1 is applied to the wiring 111 and the potential V2 is applied to the wiring 115. Accordingly, the transistor 104_1 is turned on and the transistors 104_2 to 104_N are turned off, so that electrical continuity is established between the wiring 115 and the node 11. At this time, the transistor 102 is turned on, so that electrical continuity is established between the wiring 111 and the node 11. In such a manner, the node 11 is supplied with the potential of the wiring 115 and the potential of the wiring 111. Thus, the potential of the node 11 exceeds the potential of the wiring 115 (the potential V2) and becomes lower than the potential of the wiring 111 (the potential V1). Assuming that the potential of the node 11 becomes lower than V2+Vth101 here, the transistor 101 is turned off, so that electrical continuity is not established between the wiring 111 and the wiring 112. At this time, the transistor 103_1 is turned on and the transistors 103_2 to 103_N are turned off, so that electrical continuity is established between the wiring 115 and the wiring 112. The potential of the wiring 115 is supplied to the wiring 112 in such a manner, so that the potential of the wiring 112 becomes equal to the potential V2 (see FIG. 12A).

Figure 12B:
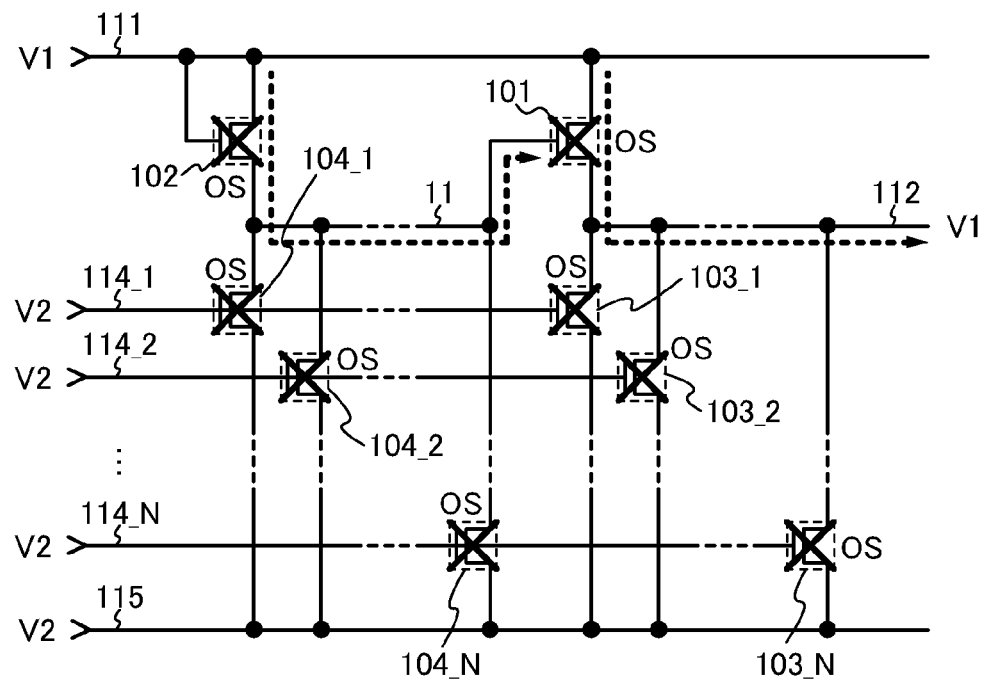

Then, the operation in the case where the potential V2 is applied to all the N wirings 114 will be described. Assuming that the potential V1 is applied to the wiring 111 and the potential V2 is applied to the wiring 115, the transistors 104_1 to 104_N are turned off, so that electrical continuity is not established between the wiring 115 and the node 11. At this time, the transistor 102 is turned on, so that electrical continuity is established between the wiring 111 and the node 11. Then, the potential of the wiring 111 is supplied to the node 11, so that the potential of the node 11 starts to rise. Then, the potential of the node 11 rises to V2+Vth101. Thus, the transistor 101 is turned on, so that electrical continuity is established between the wiring 111 and the wiring 112. At this time, the transistors 103_1 to 103_N are off, so that electrical continuity is not established between the wiring 115 and the wiring 112. The potential of the wiring 111 is supplied to the wiring 112 in such a manner, so that the potential of the wiring 112 starts to rise. After that, the potential of the node 11 rises to V1−Vth102. Thus, the transistor 102 is turned off, so that electrical continuity between the wiring 111 and the node 11 is broken. Then, the node 11 enters a floating state. At this time, the potential of the wiring 112 continues to rise. For that reason, the potential of the node 11 rises to V1+Vth101+Va because of parasitic capacitance between the gate and the second terminal of the transistor 101. This is so-called bootstrap operation. Accordingly, the potential of the wiring 112 rises to a value equal to that of the potential V1 (see FIG. 12B).

Note that the N transistors 103 preferably have the same channel width. If restriction of circuit layout or the like makes it difficult for the N transistors 103 to have the same channel width, it is preferable that at least two of the N transistors 103 have the same channel width. This is because when the transistors 103 have the same channel width, the circuit can be designed more easily and an operation malfunction can be suppressed. The same can be said for the transistors 104.

Note that the N transistors 103 preferably have high drive capability in order to drive the wiring 112. Therefore, the channel width of at least one of the N transistors 103 is preferably larger than that of at least one of the N transistors 104. Specifically, the channel width of at least one of the N transistors 103 is preferably larger than that of at least one of the N transistors 104 and is preferably 10 times or less as large as that of at least one of the N transistors 104. The channel width of at least one of the N transistors 103 is more preferably 1.5 to 7 times, further preferably 2 to 5 times as large as that of at least one of the N transistors 104.

Note that in the case where the potential V2 is applied to the N wirings 114, the potential of the node 11 preferably has a value with which the transistor 101 is turned off. For that reason, the channel width of at least one of the N transistors 104 is preferably larger than that of the transistor 102. Specifically, the channel width of at least one of the N transistors 104 is preferably larger than that of the transistor 102 and is preferably 10 times or less as large as that of the transistor 102. The channel width of at least one of the N transistors 104 is more preferably 2 to 5 times, further preferably 2.5 to 3.5 times as large as that of the transistor 102.

Next, a structure with which the semiconductor device in Embodiment 2 can have a function of a NAND circuit will be described.

The following is a structure with which the semiconductor device in Embodiment 2 can have a function of a NAND circuit. In the semiconductor device in Embodiment 2, the N transistors 103 (the transistors 103_1 to 103_N, where N is a natural number) are connected in series between the wiring 115 and the wiring 112. Gates of the N transistors 103 are connected to the N wirings 114 (the wirings 114_1 to 114_N), respectively. Moreover, the N transistors 104 (the transistors 104_1 to 104_N) are connected in series between the wiring 115 and the node 11. Gates of the N transistors 104 are connected to the respective N wirings 114. For example, a first terminal of the transistor 103__i (i is any one of 1 to N) is connected to a second terminal of the transistor 103__i+1. A second terminal of the transistor 103__i is connected to a first terminal of the transistor 103__i−1. A gate of the transistor 103__i is connected to the wiring 114__i. A first terminal of the transistor 104__i (i is any one of 1 to N) is connected to a second terminal of the transistor 104__i+1. A second terminal of the transistor 104__i is connected to a first terminal of the transistor 104__i−1. A gate of the transistor 104__i is connected to the wiring 114__i. Note that a second terminal of the transistor 103_1 is connected to the wiring 112; a first terminal of the transistor 103_N is connected to the wiring 115; a second terminal of the transistor 104_1 is connected to the node 11; and a first terminal of the transistor 104_N is connected to the wiring 115. With such a structure, the semiconductor device in Embodiment 2 can have a function of a NAND circuit with N inputs.

Figure 13A:
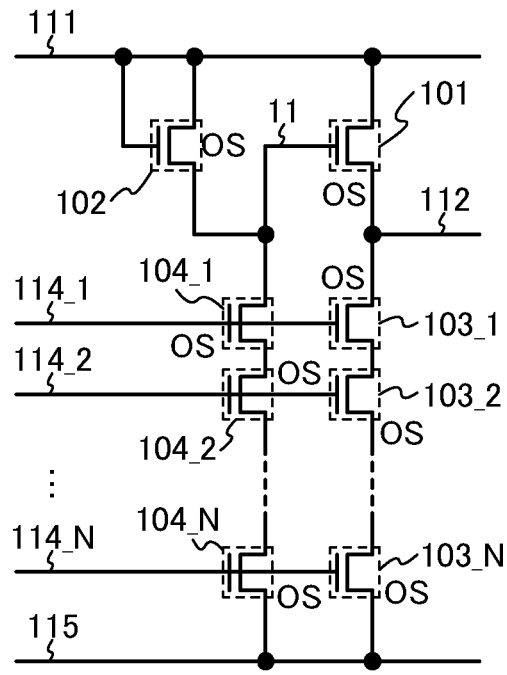
FIGS. 13A and 13B each illustrate an example of a circuit diagram of a semiconductor device in Embodiment 3.

FIG. 13A illustrates an example of a NAND circuit obtained by adding the above-described structure to the semiconductor device illustrated in FIG. 7C.

Figure 13B:
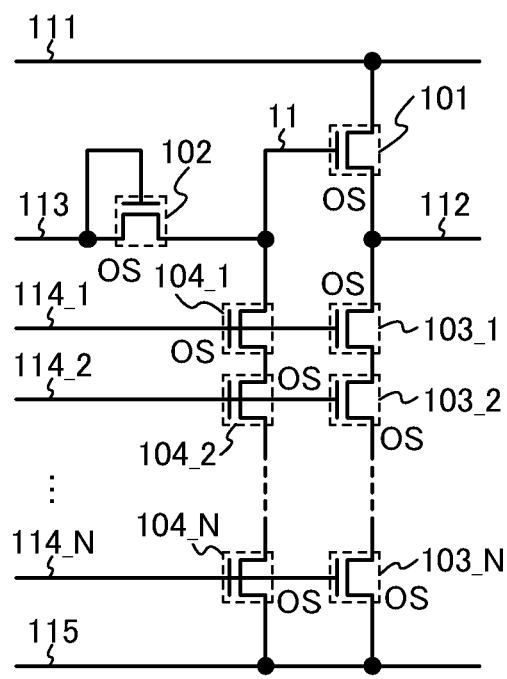

FIG. 13B illustrates an example of a NAND circuit obtained by adding the above-described structure to the semiconductor device illustrated in FIG. 5A. Note that an inverted signal of a signal input to any of the N wirings 114 is input to the wiring 113.

Next, an example of operation of the NAND circuit including the semiconductor device in Embodiment 2 will be described, using the semiconductor device illustrated in FIG. 13A as an example. Here, the following two operations will be described: the operation in the case where the potential V2 is applied to at least one of the N wirings 114, and the operation in the case where the potential V1 is applied to all the N wirings 114.

Figure 14A:
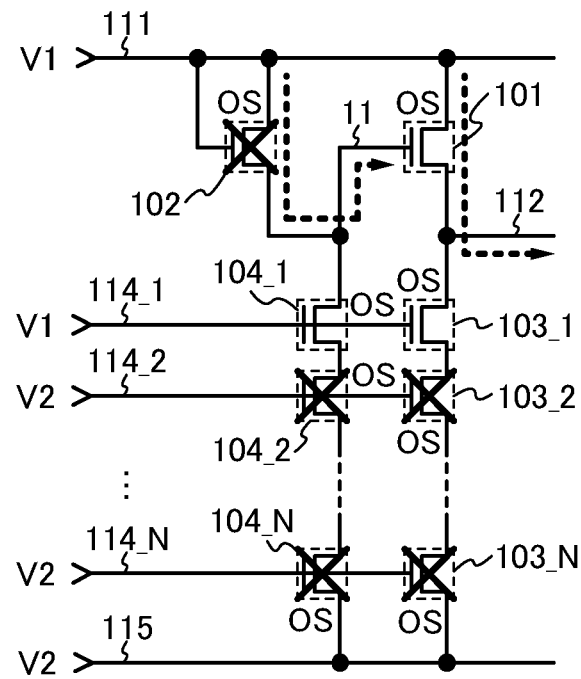
FIGS. 14A and 14B each illustrate an example of a schematic diagram for explaining operation of a semiconductor device in Embodiment 3.

First, the operation in the case where the potential V2 is applied to at least one of the N wirings 114 will be described. It is assumed that the potential V1 is applied to the wiring 114_1 and the potential V2 is applied to the other wirings (the wirings 114_2 to 114_N), and that the potential V1 is applied to the wiring 111 and the potential V2 is applied to the wiring 115. Accordingly, the transistor 104_1 is turned on and the transistors 104_2 to 104_N are turned off, so that electrical continuity is not established between the wiring 115 and the node 11. At this time, the transistor 102 is turned on, so that electrical continuity is established between the wiring 111 and the node 11. Then, the potential of the wiring 111 is supplied to the node 11, so that the potential of the node 11 starts to rise. Then, the potential of the node 11 rises to V2+Vth101. Thus, the transistor 101 is turned on, so that electrical continuity is established between the wiring 111 and the wiring 112. At this time, the transistor 103_1 is turned on and the transistors 103_2 to 103_N are turned off, so that electrical continuity is not established between the wiring 115 and the wiring 112. The potential of the wiring 111 is supplied to the wiring 112 in such a manner, so that the potential of the wiring 112 starts to rise. After that, the potential of the node 11 rises to V1−Vth102. Thus, the transistor 102 is turned off, so that electrical continuity between the wiring 111 and the node 11 is broken. Then, the node 11 enters a floating state. At this time, the potential of the wiring 112 continues to rise. For that reason, the potential of the node 11 rises to V1+Vth101+Va due to parasitic capacitance between the gate and the second terminal of the transistor 101. This is so-called bootstrap operation. Accordingly, the potential of the wiring 112 rises to a value equal to that of the potential V1 (see FIG. 14A).

Figure 14B:
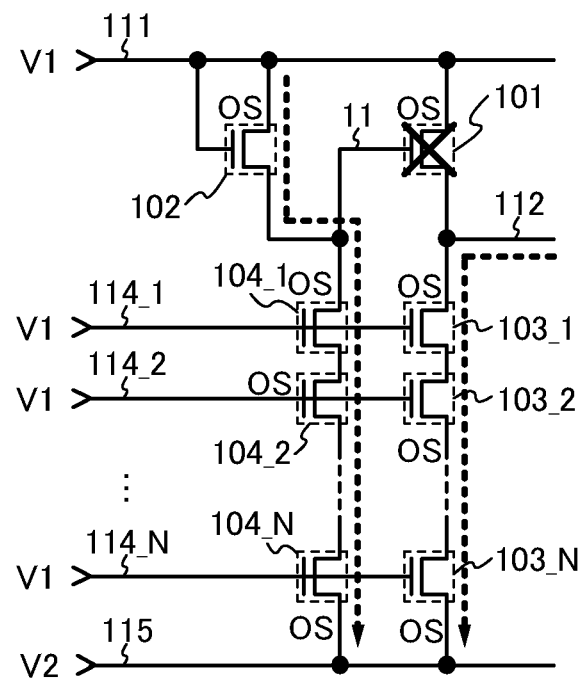

Then, the operation in the case where the potential V1 is applied to all the N wirings 114 will be described. Assuming that the potential V1 is applied to the wiring 111 and the potential V2 is applied to the wiring 115, the transistors 104_1 to 104_N are turned on, so that electrical continuity is established between the wiring 115 and the node 11. At this time, the transistor 102 is turned on, so that electrical continuity is established between the wiring 111 and the node 11. In such a manner, the node 11 is supplied with the potential of the wiring 115 and the potential of the wiring 111. Thus, the potential of the node 11 exceeds the potential of the wiring 115 (the potential V2) and becomes lower than the potential of the wiring 111 (the potential V1). Assuming that the potential of the node 11 is lower than V2+Vth102 here, the transistor 102 is turned off, so that electrical continuity is not established between the wiring 111 and the wiring 112. At this time, the transistors 103_1 to 103_N are turned on, so that electrical continuity is established between the wiring 115 and the wiring 112. The potential of the wiring 115 is supplied to the wiring 112 in such a manner, so that the potential of the wiring 112 becomes equal to the potential V2 (see FIG. 14B).

Note that the N transistors 103 preferably have the same channel width. If restriction of circuit layout or the like makes it difficult for the N transistors 103 to have the same channel width, it is preferable that at least two of the N transistors 103 have the same channel width. This is because when the transistors 103 have the same channel width, the circuit can be designed more easily and an operation malfunction can be suppressed. The same can be said for the transistors 104.

Note that the channel width of the N transistors 103 is preferably large in order to shorten the fall time of the potential of the wiring 112. However, the layout area is increased if the channel width is too large. For that reason, at least one channel width of the N transistors 103 is preferably N times or less as large as the channel width of the transistor 101. At least one channel width of the N transistors 103 is more preferably ⅓ to 3 times, further preferably ½ to 2 times as large as the channel width of the transistor 101.

Note that in the case where the potential V1 is applied to all the N wirings 114, the channel width of the N transistors 104 is preferably large in order that the potential of the node 11 is lower than V2+Vth101. However, the layout area is increased if the channel width is too large. For that reason, the channel width of at least one of the N transistors 104 is preferably N times or less as large as that of the transistor 102. The width of at least one of the N transistors 104 is more preferably ⅓ to 3 times, further preferably ½ to 2 times as large as that of the transistor 102.

As described above, the NOR circuit and the NAND circuit in this embodiment can be constituted using the semiconductor device shown in Embodiment 2. Thus, the NOR circuit and the NAND circuit in this embodiment can obtain advantageous effects similar to those of the semiconductor devices in Embodiments 1 and 2.

This embodiment can be combined with any of the other embodiments as appropriate.

Embodiment 4

In this embodiment, an example of a semiconductor device and an example of a method for driving the semiconductor device will be described. In particular, an example of a decoder circuit including the semiconductor device shown in Embodiment 3 and an example of a method for driving the decoder circuit will be described.

First, an example of a structure of a semiconductor device in this embodiment will be described.

Figure 16:
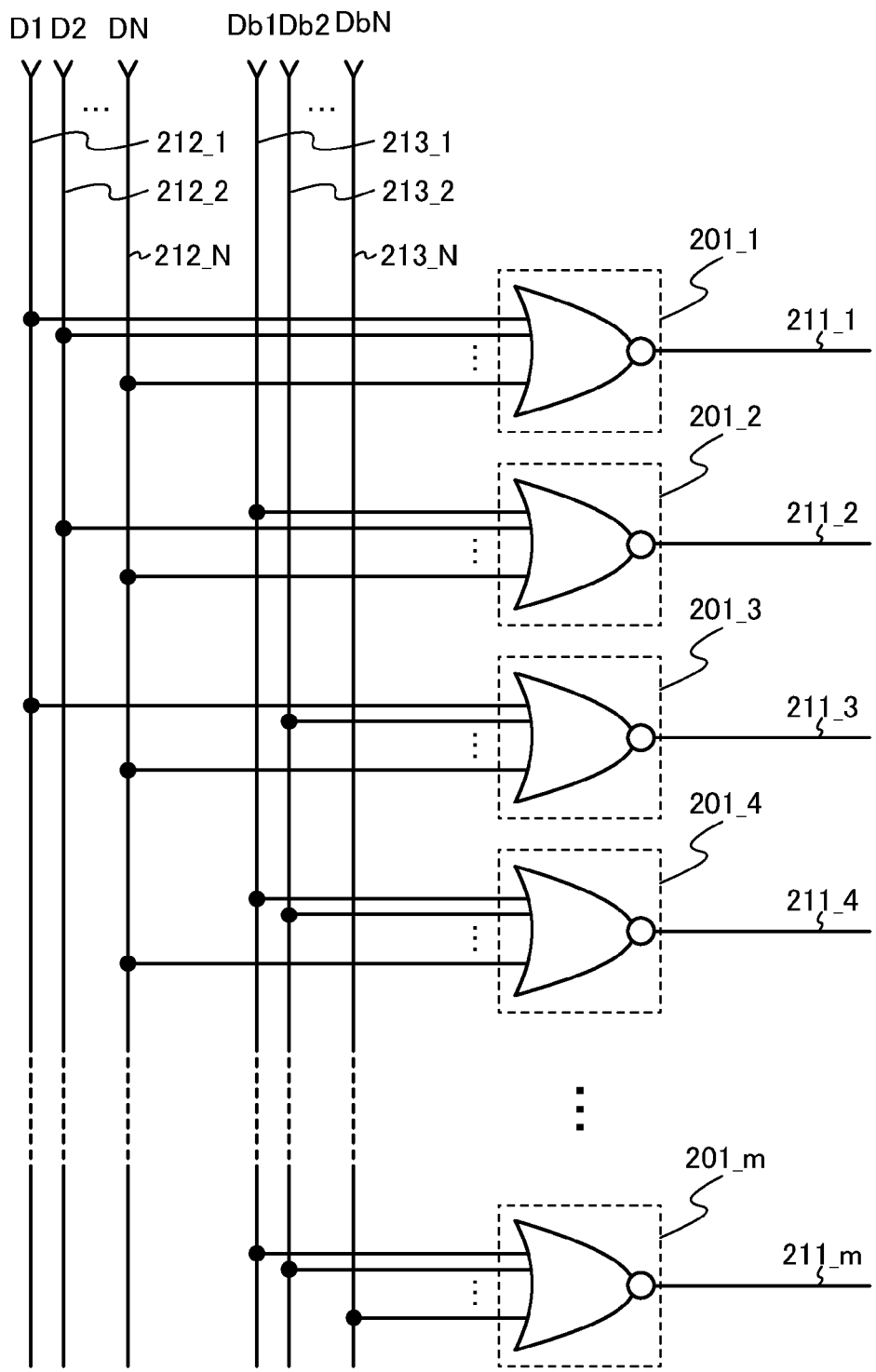
FIG. 16 illustrates an example of a circuit diagram of a semiconductor device in Embodiment 4.

FIG. 16 illustrates an example of a decoder circuit in this embodiment. The decoder circuit in FIG. 16 includes m NOR circuits 201 (referred to as NOR circuits 201_1 to 201_m, where m is a natural number).

Note that any of the NOR circuits shown in Embodiment 3 is preferably used as the m NOR circuits 201.

A control signal of N bits (N is a natural number, where $2^N$>m) is input to each of the m NOR circuits 201. The control signal of N bits is selected from control signals D1 to DN and control signals Db1 to DbN. The control signals Db1 to DbN are inverted signals of the control signals D1 to DN. Control signals input to the m NOR circuits 201 are different from each other. For example, the control signal D1 to DN are input to the NOR circuit 201_1. The control signal Db1 and the control signals D2 to DN are input to the NOR circuit 2012. The control signal D1, the control signal Db2, and the control signals D3 to DN are input to the NOR circuit 201_3. The control signals input to the m NOR circuits 201 are made different from each other in such a manner, so that only a signal output from any one of the m NOR circuits 201 can have a different value from signals output from the other NOR circuits 201. Specifically, the signal output from any one of the m NOR circuits 201 can be an H-level signal and the signals output from the other NOR circuits 201 can be L-level signals. Moreover, when values of the control signals D1 to DN and the control signals Db1 to DbN are changed every predetermined period (e.g., per one gate selection period), the NOR circuits 201_1 to 201_m can sequentially output an H-level signal. Alternatively, the m NOR circuits 201 can output an H-level signal in given order.

Note that the control signals D1 to DN are input to the decoder circuit through N wirings 212 (referred to as wirings 212_1 to 212_N). The control signals Db1 to DbN are input to the decoder circuit through N wirings 213 (referred to as wirings 213_1 to 213_N). Output signals of the m NOR circuits 201 are output to respective m wirings 211 (wirings 211_1 to 211_m).

Note that the control signals Db1 to DbN can be generated by inverting the control signals D1 to DN by an inverter circuit or the like. As the inverter circuit used for generating the control signals Db1 to DbN, any of the semiconductor devices shown in Embodiment 1 can be used, for example.

Figure 17:
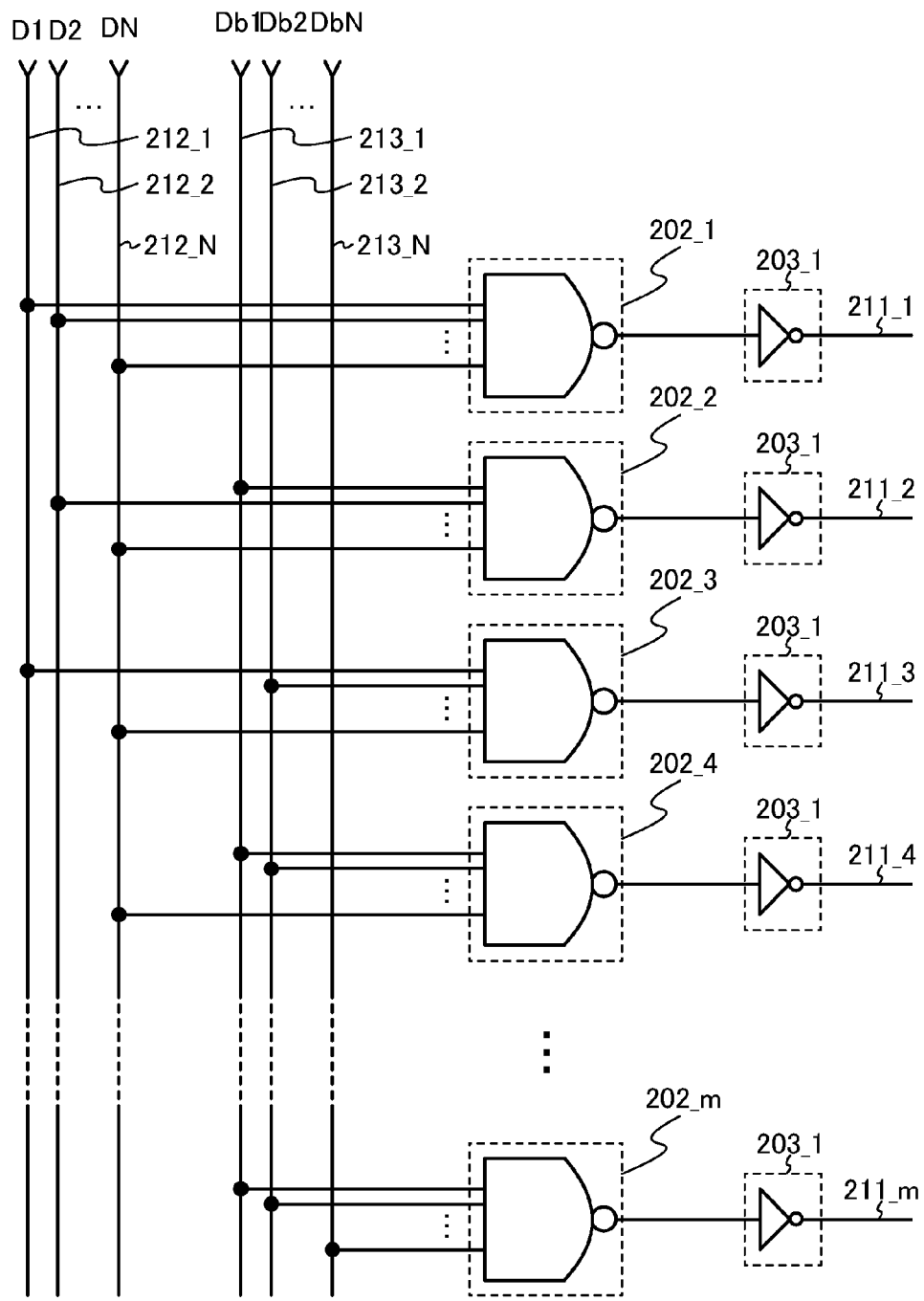
FIG. 17 illustrates an example of a circuit diagram of a semiconductor device in Embodiment 4.

A decoder circuit can be constituted not only by NOR circuits but also by NAND circuits. As the NAND circuit, any of the NAND circuits shown in Embodiment 3 is preferably used. FIG. 17 is a circuit diagram of a decoder circuit constituted by NAND circuits. The decoder circuit in FIG. 17 differs from the decoder circuit in FIG. 16 in that m NAND circuits 202 (referred to as NAND circuits 202_1 to 202_$m$) are used instead of m NOR circuits 201.

In the decoder circuit in FIG. 17, a signal output from any one of the m NAND circuits 202 is an L-level signal and signals output from the other NAND circuits 202 are H-level signals. For that reason, m inverter circuits 203 (referred to as inverter circuits 203_1 to 203_$m$) can be provided when needed. Output signals of the m NAND circuits 202 are output to the m wirings 211 through the m inverter circuits 203.

As described above, the decoder circuit in this embodiment can be constituted by the NOR circuit or the NAND circuit shown in Embodiment 3. Thus, the decoder circuit in this embodiment can obtain advantageous effects similar to those of the semiconductor devices in Embodiments 1 and 2.

This embodiment can be combined with any of the other embodiments as appropriate.

Embodiment 5

In this embodiment, an example of a structure of a semiconductor device and an example of a process for manufacturing the semiconductor device will be described. In particular, an example of a thin film transistor in which a channel formation region is formed using an oxide semiconductor and an example of a process for manufacturing the thin film transistor will be described.

<Example of Structure of Transistor>

Figure 15A:
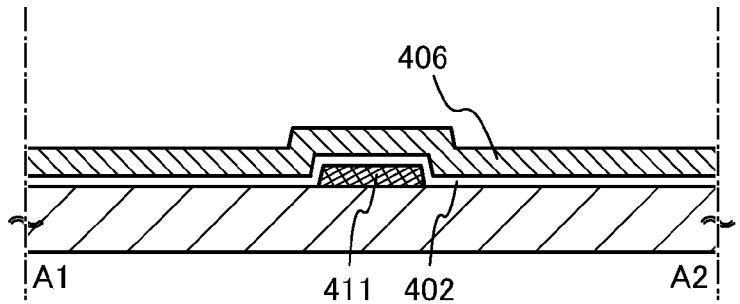
FIGS. 15A to 15D illustrate an example of a process for manufacturing a semiconductor device in Embodiment 5.
Figure 15B:
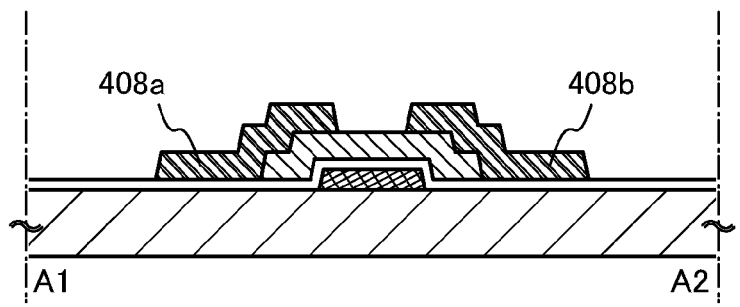
Figure 15C:
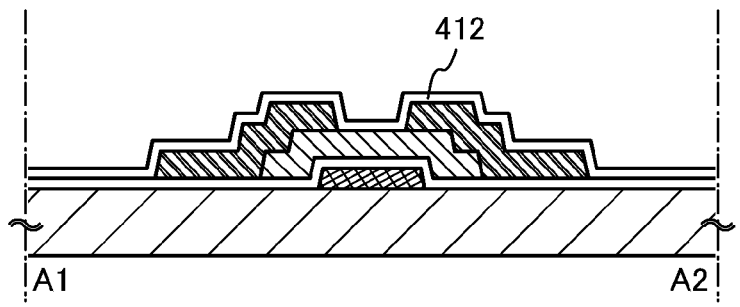
Figure 15D:
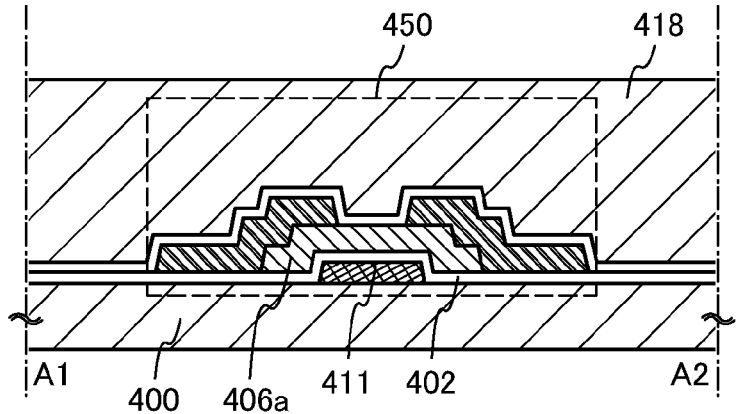

FIG. 15D is a cross-sectional view of a transistor 450 (e.g., a thin film transistor) which is an example of a semiconductor device. The transistor 450 in FIG. 15D is an inverted staggered thin film transistor. Although FIG. 15D illustrates a single-gate thin film transistor, a multi-gate thin film transistor including a plurality of channel formation regions may be used as needed. The thin film transistor is an n-channel transistor in the following description; alternatively, a p-channel transistor may be used.

The transistor 450 includes a gate electrode layer 411 provided over a substrate 400, a gate insulating layer 402 that covers the gate electrode layer 411, an oxide semiconductor layer 406a provided over the gate electrode layer 411, and source/drain electrode layers 408a and 408b electrically connected to the oxide semiconductor layer 406a. Moreover, an insulating layer 412 and an insulating layer 418 are provided over the transistor 450. Note that the insulating layer 412 and the insulating layer 418 are not essential and thus can be omitted as appropriate.

For the oxide semiconductor layer 406a, a four-component metal oxide such as an In—Sn—Ga—Zn—O-based metal oxide; a three-component metal oxide such as an In—Ga—Zn—O-based metal oxide, an In—Sn—Zn—O-based metal oxide, an In—Al—Zn—O based metal oxide, a Sn—Ga—Zn—O-based metal oxide, an Al—Ga—Zn—O-based metal oxide, or a Sn—Al—Zn—O-based metal oxide; a two-component metal oxide such as an In—Zn—O-based metal oxide, a Sn—Zn—O-based metal oxide, an Al—Zn—O-based metal oxide, a Zn—Mg—O-based metal oxide, a Sn—Mg—O-based metal oxide, or an In—Mg—O-based metal oxide; an In—O-based metal oxide, a Sn—O-based metal oxide, a Zn—O-based metal oxide, or the like is used.

In particular, an In—Ga—Zn—O-based oxide semiconductor material is preferably employed as a semiconductor material used for a semiconductor device because it has sufficiently high resistance when no electric field is applied and thus can realize a sufficiently small off-state current, and because it has high field-effect mobility.

A typical example of the In—Ga—Zn—O-based oxide semiconductor material is an oxide semiconductor material represented by InGaO$_3$(ZnO)$_m$ (m is larger than 0 and is not a natural number). Moreover, there is an oxide semiconductor material represented by 1 nMO$_3$(ZnO)$_m$ (m is larger than 0 and is not a natural number), using M instead of Ga. Here, M denotes one or more of metal elements selected from gallium (Ga), aluminum (Al), iron (Fe), nickel (Ni), manganese (Mn), cobalt (Co), and the like. For example, M can be Ga and Al, Ga and Fe, Ga and Ni, Ga and Mn, or Ga and Co. Note that the above composition is derived from a crystal structure and thus is just an example. In addition, an oxide semiconductor material expressed by In—Ga—Zn—O in this specification is InGaO$_3$(ZnO)$_m$ (m is larger than 0 and is not a natural number), and it can be confirmed using analysis with ICP-MS or RBS that m is not a natural number.

The hydrogen concentration of the oxide semiconductor layer is preferably $5 \times 10^{19}$ (atoms/cm$^3$) or less.

<Method for Manufacturing Transistor>

Next, a method for manufacturing the above thin film transistor is described with reference to FIGS. 15A to 15D.

First, the gate electrode layer 411 is formed over the substrate 400, and then, the gate insulating layer 402 is formed so as to cover the gate electrode layer 411. After that, an oxide semiconductor layer 406 is formed over the gate insulating layer 402 (see FIG. 15A).

As the substrate 400, a glass substrate can be used, for example. The glass substrate is preferably a non-alkali glass substrate. For the non-alkali glass substrate, a glass material such as aluminosilicate glass, aluminoborosilicate glass, or barium borosilicate glass is used, for example. Instead of a glass substrate, the substrate 400 can be an insulating substrate formed using an insulator, such as a ceramic substrate, a quartz substrate, or a sapphire substrate; a semiconductor substrate that is formed using a semiconductor material such as silicon and has a surface covered with an insulating material; or a conductive substrate that is formed using a conductive material such as metal or stainless steel and has a surface covered with an insulating material. Furthermore, a substrate formed from a flexible synthetic resin such as plastic generally tends to have a low upper temperature limit, but can be used as the substrate 400 as long as the substrate can withstand processing temperatures in the subsequent manufacturing steps.

The gate electrode layer 411 can be formed in such a manner that a conductive layer is formed over the substrate 400 and selectively etched. The gate electrode layer 411 can be formed by a physical vapor deposition (PVD) method such as a sputtering method or a chemical vapor deposition (CVD) method such as a plasma CVD method. Moreover, the gate electrode layer 411 can be formed using a metal material selected from aluminum, chromium, copper, tantalum, titanium, molybdenum, and tungsten; an alloy containing any of these elements; or the like. A material containing one or more of manganese, magnesium, zirconium, and/or beryllium may be used. A material that contains aluminum and one or more of elements selected from titanium, tantalum, tungsten, molybdenum, chromium, neodymium, and scandium may be used.

Alternatively, the gate electrode layer 411 may be formed using a conductive metal oxide. As the conductive metal oxide, indium oxide (In$_2$O$_3$), tin oxide (SnO$_2$), zinc oxide (ZnO), an alloy of indium oxide and tin oxide (In$_2$O$_3$—SnO$_2$, sometimes referred to as ITO), an alloy of indium oxide and zinc oxide (In$_2$O$_3$—ZnO), or any of the metal oxide materials containing silicon or silicon oxide can be used.

The gate electrode layer 411 may have a single-layer structure or a layered structure of two layers or more. Note that in this embodiment, heat treatment at relatively high temperature is performed after the formation of the gate electrode layer 411; therefore, the gate electrode layer 411 is preferably formed using a material with heat resistance high enough to withstand the heat treatment. Examples of the material with heat resistance are titanium, tantalum, tungsten, and molybdenum. Moreover, it is possible to use polysilicon whose conductivity is increased by addition of an impurity element.

The gate insulating layer 402 can be formed by a CVD method, a sputtering method, or the like. The gate insulating layer 402 is preferably formed using silicon oxide, silicon nitride, silicon oxynitride, silicon nitride oxide, aluminum oxide, hafnium oxide, tantalum oxide, or the like. The gate insulating layer 402 may have a single-layer structure or a layered structure of two layers or more. The gate insulating layer 402 can have a thickness of 10 nm to 500 nm, for example.

When the gate insulating layer 402 is formed using a high-k material such as hafnium silicate ($HfSiO_x$), hafnium silicate to which nitrogen is added ($HfSi_xO_yN_z$), hafnium aluminate to which nitrogen is added ($HfAl_xO_yN_z$), hafnium oxide, or yttrium oxide, gate leakage can be reduced. Further, the gate insulating layer 402 can have a layered structure in which a layer including a high-k material and one or more of a silicon oxide layer, a silicon nitride layer, a silicon oxynitride layer, a silicon nitride oxide layer, and an aluminum oxide layer are stacked.

Note that the gate insulating layer 402 is preferably formed so as to contain impurities such as hydrogen and water as little as possible. This is because if hydrogen and water are contained in the gate insulating layer 402, hydrogen might enter the oxide semiconductor layer 406a and extract oxygen in the oxide semiconductor layer 406a, which might lead to deterioration of characteristics of the transistor.

For example, the gate insulating layer 402 is formed by a sputtering method or the like, the gate insulating layer 402 is preferably formed in a state where moisture remaining in a treatment chamber is removed. An entrapment vacuum pump is preferably used in order to remove moisture remaining in a treatment chamber. For example, a cryopump, an ion pump, or a titanium sublimation pump can be used. A turbo pump provided with a cold trap may be used. In a treatment chamber that is evacuated with a cryopump or the like, hydrogen, water, and the like are sufficiently removed, so that the concentration of impurities contained in the gate insulating layer 402 can be reduced.

In addition, it is preferable to employ a high-density plasma CVD method using a microwave (e.g., a frequency of 2.45 GHz) because the gate insulating layer 402 can be dense and have high withstand voltage and high quality. When the oxide semiconductor layer 406a and the high-quality gate insulating layer 402 are in close contact with each other, the interface state density can be reduced and interface properties can be favorable. In particular, it is preferable to use a high-density plasma apparatus with which a plasma density of $1\times10^{11}/cm^3$ or higher can be achieved. Properties of the interface between the gate insulating layer 402 and the oxide semiconductor layer 406a can be made favorable and impurities of the oxide semiconductor, particularly hydrogen and water, are reduced as described above; thus, it is possible to obtain a stable transistor whose threshold voltage (Vth) does not change through a gate bias-temperature stress test (BT test; for example, at 85° C. with $2\times10^6$ V/cm for 12 hours).

In forming the gate electrode layer 411, it is preferable to use a high-purity gas from which impurities such as hydrogen and water is reduced to a concentration of approximately a few parts per million (ppm) or a few parts per billion (ppb).

Note that the oxide semiconductor layer that becomes an i-type oxide semiconductor layer or a substantially i-type oxide semiconductor layer (a highly purified oxide semiconductor layer) in a later step is extremely sensitive to the interface state density or interface electric charge; therefore, the interface with the gate insulating layer is important. For that reason, the gate insulating layer (GI) which is in contact with the highly purified oxide semiconductor layer needs to have high quality. Therefore, high-density plasma CVD with use of microwaves (2.45 GHz) is preferably employed because a dense and high-quality insulating film having high withstand voltage can be formed. The highly purified oxide semiconductor and the high-quality gate insulating layer are in close contact with each other, so that the interface state density can be reduced and favorable interface characteristics can be obtained. It is important that the insulating layer has favorable quality as the gate insulating layer and can reduce the interface state density with the oxide semiconductor layer so that a favorable interface can be formed.

The oxide semiconductor layer 406 can be formed by a sputtering method in a rare gas (typically argon) atmosphere, an oxygen atmosphere, or an atmosphere including a rare gas (typically argon) and oxygen. As an atmosphere in which the oxide semiconductor layer 406 is formed, it is preferable to use a high-purity gas atmosphere, for example, from which impurities such as hydrogen, water, a hydroxyl group, and hydride are removed to a concentration of a few parts per million (preferably, a few parts per billion).

Before the oxide semiconductor layer 406 is deposited by a sputtering method, powdery substances (also referred to as particles or dust) attached on a surface of the gate insulating layer 402 are preferably removed by reverse sputtering in which an argon gas is introduced and plasma is generated. The reverse sputtering refers to a method in which, without application of voltage to a target side, an RF power source is used for application of voltage in order to generate plasma in the vicinity of the substrate to modify a surface. Note that instead of an argon atmosphere, nitrogen, helium, oxygen, or the like may be used.

The oxide semiconductor layer 406 can be formed using a four-component metal oxide such as an In—Sn—Ga—Zn—O-based metal oxide; a three-component metal oxide such as an In—Ga—Zn—O-based metal oxide, an In—Sn—Zn—O-based metal oxide, an In—Al—Zn—O based metal oxide, a Sn—Ga—Zn—O-based metal oxide, an Al—Ga—Zn—O-based metal oxide, or a Sn—Al—Zn—O-based metal oxide; a two-component metal oxide such as an In—Zn—O-based metal oxide, a Sn—Zn—O-based metal oxide, an Al—Zn—O-based metal oxide, a Zn—Mg—O-based metal oxide, a Sn—Mg—O-based metal oxide, or an In—Mg—O-based metal oxide; an In—O-based metal oxide, a Sn—O-based metal oxide, a Zn—O-based metal oxide, or the like.

In particular, an In—Ga—Zn—O-based oxide semiconductor material is preferably employed as a semiconductor material used for a semiconductor device because it has sufficiently high resistance when no electric field is applied and can realize a sufficiently small off-state current, and because it has high field-effect mobility.

In this embodiment, the amorphous oxide semiconductor layer 406 is formed as the oxide semiconductor layer 406 by a sputtering method with the use of an In—Ga—Zn—O-based oxide semiconductor target.

As a target used for forming the In—Ga—Zn—O-based oxide semiconductor layer 406 by a sputtering method, a target represented by a composition ratio of In:Ga:Zn=1:x:y (x is 0 or larger and y is 0.5 to 5) may be used. For example, a target with a composition ratio of In:Ga:Zn=1:1:1 [atomic ratio] (x=1 and y=1; that is, $In_2O_3$:$Ga_2O_3$:ZnO=1:1:2 [molar ratio]) may be used. As the oxide semiconductor target, it is possible to use a target with a composition ratio of In:Ga:Zn=1:1:0.5 [atomic ratio], a target with a composition ratio of In:Ga:Zn=1:1:2 [atomic ratio], or a target with a composition ratio of In:Ga:Zn=1:0:1 [atomic ratio] (x=0 and y=1). Moreover, the oxide semiconductor layer 406 can be deposited using a target containing $SiO_2$ at 2 wt % to 10 wt % so as to contain $SiO_x$ (X>0).

The relative density of the oxide semiconductor in the oxide semiconductor target is 80% or more, preferably 95% or more, further preferably 99.9% or more. By using an oxide semiconductor with a high relative density, the dense oxide semiconductor layer 406 can be formed.

In forming the oxide semiconductor layer 406, for example, the substrate is held in a treatment chamber that is maintained at reduced pressure, and the substrate is heated to 100° C. to 600° C., preferably 200° C. to 400° C. Then, a sputtering gas from which hydrogen and water are removed is introduced into the treatment chamber from which remaining moisture is being removed, and the oxide semiconductor layer 406 is formed using the above-described target. The oxide semiconductor layer 406 is formed while the substrate is heated, so that impurities contained in the oxide semiconductor layer 406 can be reduced. In addition, damage by sputtering can be reduced. In order to remove moisture remaining in the treatment chamber, the above-described entrapment vacuum pump is preferably used. Hydrogen, water, and the like are removed in the treatment chamber that is evacuated with a cryopump, for example; thus, the concentration of impurities contained in the oxide semiconductor layer 406 can be reduced.

For example, the conditions for forming the oxide semiconductor layer 406 can be set as follows: the distance between the substrate and the target is 170 mm; the pressure is 0.4 Pa; the direct-current (DC) power is 0.5 kW; and the atmosphere is an oxygen atmosphere (the flow rate ratio of oxygen is 100%), an argon atmosphere (the flow rate ratio of argon is 100%), or an atmosphere including oxygen and argon. Note that a pulse direct current (DC) power supply is preferable because dust (powder or flake-like substances formed at the time of the film formation) can be reduced and the film thickness can be uniform. The thickness of the oxide semiconductor layer 406 is 2 nm to 200 nm, preferably 5 nm to 30 nm Note that since an appropriate thickness of the oxide semiconductor layer 406 differs depending on an oxide semiconductor material to be used, application, and the like, the thickness is set in accordance with the material to be used, application, and the like.

Next, the oxide semiconductor layer 406 is selectively etched to form the island-shaped oxide semiconductor layer 406a. After that, a conductive layer is formed so as to cover the gate insulating layer 402 and the oxide semiconductor layer 406a and is etched, so that the source/drain electrode layers 408a and 408b are formed (see FIG. 15B).

The oxide semiconductor layer can be etched by dry etching, wet etching, or a combination of dry etching and wet etching. The etching conditions (e.g., an etching gas or an etching solution, etching time, and temperature) are set as appropriate depending on the material so that the oxide semiconductor layer can be etched into a desired shape.

As dry etching, a parallel plate RIE (reactive ion etching) method, an ICP (inductively coupled plasma) etching method, or the like can be used. Also in this case, the etching conditions (e.g., the amount of electric power applied to a coiled electrode, the amount of electric power applied to an electrode on the substrate side, and the electrode temperature on the substrate side) need to be set as appropriate.

An example of an etching gas that can be used for dry etching is a gas containing chlorine (a chlorine-based gas such as chlorine ($Cl_2$), boron chloride ($BCl_3$), silicon chloride ($SiCl_4$), or carbon tetrachloride ($CCl_4$)). Moreover, a gas containing fluorine (a fluorine-based gas such as carbon tetrafluoride ($CF_4$), sulfur hexafluoride ($SF_6$), nitrogen trifluoride ($NF_3$), or trifluoromethane ($CHF_3$)), hydrogen bromide (HBr), oxygen ($O_2$), any of these gases to which a rare gas such as helium (He) or argon (Ar) is added, or the like may be used.

Examples of an etchant that can be used for wet etching are a solution obtained by mixing phosphoric acid, acetic acid, and nitric acid; and an ammonia peroxide mixture (hydrogen peroxide water at 31 wt %: ammonia water at 28 wt %: water=5:2:2). An etchant such as ITO07N (produced by Kanto Chemical Co., Inc.) may also be used.

Next, first heat treatment is preferably performed on the oxide semiconductor layer 406a. An excess amount of water (including a hydroxyl group), hydrogen, and the like that are contained in the oxide semiconductor layer 406a can be removed by the first heat treatment. The temperature of the first heat treatment is, for example, higher than or equal to 400° C. and lower than or equal to 750° C., or higher than or equal to 400° C. and less than the strain point of the substrate. The first heat treatment can be performed, for example, at 450° C. for one hour in a nitrogen atmosphere after the substrate 400 is introduced into an electric furnace including a resistance heating element. During the first heat treatment, it is preferable that the oxide semiconductor layer 406a be not exposed to the air in order to prevent entry of water and hydrogen.

The heat treatment apparatus is not limited to an electric furnace; the heat treatment apparatus can be an apparatus that heats an object with thermal conduction or thermal radiation given by a medium such as a heated gas. For example, an RTA apparatus employing a lamp heating method (a lamp rapid thermal anneal (LRTA) apparatus), an RTA apparatus employing a gas heating method using a heated gas (a gas rapid thermal anneal (GRTA) apparatus), an RTA apparatus employing both a lamp heating method and a gas heating method, or the like can be used. In the case where an apparatus employing a gas heating method is used, an inert gas that does not react with an object to be processed by heat treatment, for example, nitrogen or a rare gas such as argon is used.

For example, as the first heat treatment, a GRTA process may be performed as follows. The substrate is put in an inert gas atmosphere that has been heated to a high temperature of 650° C. to 700° C., heated for several minutes, and taken out of the inert gas atmosphere. The GRTA process enables high-temperature heat treatment for a short time. Moreover, the GRTA process can be employed even when the temperature exceeds the upper temperature limit of the substrate because it is heat treatment for a short time. For example, in the case where a glass substrate is used, shrinkage of the substrate becomes a problem at temperatures higher than the upper temperature limit (the strain point) of the substrate; however, shrinkage is not a problem in heat treatment for a short time. Note that an inert gas may be switched to a gas including oxygen during the treatment. This is because defects due to oxygen vacancy can be reduced by performing the first heat treatment in an atmosphere including oxygen.

Note that the inert gas atmosphere is preferably an atmosphere that contains nitrogen or a rare gas (e.g., helium, neon, or argon) as its main component and does not contain water, hydrogen, or the like. For example, the purity of nitrogen or a rare gas (e.g., helium, neon, or argon) introduced into a heat treatment apparatus is 6N (99.9999%) or higher, preferably 7N (99.99999%) or higher (i.e., the concentration of the impurities is less than or equal to 1 ppm, preferably less than or equal to 0.1 ppm). The first heat treatment may be performed in ultra-dry air with an $H_2O$ concentration of 20 ppm or lower, preferably in ultra-dry air with an $H_2O$ concentration of 1 ppm or lower. By such first heat treatment, water (including a hydroxyl group), hydrogen, and the like that are contained in the oxide semiconductor layer 406 can be removed.

By performing the above-described first heat treatment, hydrogen contained in the oxide semiconductor layer 406 can be reduced (preferably removed), so that the oxide semiconductor layer 406 can be highly purified so as to contain an impurity other than its main component as little as possible.

Note that the first heat treatment performed on the oxide semiconductor layer can also be performed on the oxide semiconductor layer 406 which has not yet been processed into the island-shaped oxide semiconductor layer. In that case, after the first heat treatment, the substrate is taken out from a heating apparatus, and then, etching is performed using a mask, for example.

The heat treatment for dehydration or dehydrogenation of the oxide semiconductor layer may be performed at any of the following timings: after the oxide semiconductor layer is formed; after the source electrode layer and the drain electrode layer are stacked over the oxide semiconductor layer; and after a protective insulating film is formed over the source electrode layer and the drain electrode layer.

The source/drain electrode layers 408a and 408b are formed in the following manner: a conductive layer is formed so as to cover the oxide semiconductor layer 406a and then the conductive layer is selectively etched. The conductive layer can be formed by a sputtering method or a vacuum evaporation method. The conductive layer can be formed using a metal material selected from aluminum, chromium, copper, tantalum, titanium, molybdenum, and tungsten; an alloy material including any of these elements; an alloy material including the above elements in combination; or the like. One or more materials selected from manganese, magnesium, zirconium, beryllium, and yttrium may be used. A material that contains aluminum and one or more of elements selected from titanium, tantalum, tungsten, molybdenum, chromium, neodymium, and scandium may be used.

The source/drain electrode layers 408a and 408b can have a single-layer structure or a layered structure of two layers or more and can have, for example, a single-layer structure of an aluminum film containing silicon; a two-layer structure in which a titanium film is stacked over an aluminum film; or a three-layer structure in which a titanium film, an aluminum film, and a titanium film are stacked in the order.

In the case where heat treatment for dehydration or dehydrogenation of the oxide semiconductor layer 406a is performed on the conductive layer, it is preferable to use a conductive layer with heat resistance high enough to withstand the heat treatment.

Materials and etching conditions are adjusted as appropriate so that the oxide semiconductor layer 406a is not removed when the conductive layer is etched.

In this embodiment, a titanium film is used as the conductive layer; an In—Ga—Zn—O-based oxide is used for the oxide semiconductor layer 406a; and an ammonia hydrogen peroxide solution (a mixed solution of ammonia, water, and a hydrogen peroxide solution) is used as an etchant.

Note that in etching of the conductive layer, only part of the oxide semiconductor layer 406a is etched and the oxide semiconductor layer 406a having a groove (a recessed portion) is formed in some cases. Moreover, a mask used in the etching step may be formed by an inkjet method. A photomask is not used when the mask is formed by an inkjet method, which results in reducing manufacturing costs.

In order to reduce the number of photomasks used in a photolithography step and reduce the number of steps, an etching step may be performed with the use of a multi-tone mask which is a light-exposure mask through which light is transmitted to have a plurality of intensities. Since a resist mask formed using a multi-tone mask has a plurality of thicknesses and can be further changed in shape by ashing, the resist mask can be used in a plurality of etching steps for providing different patterns. Therefore, a resist mask corresponding to at least two kinds of different patterns can be formed by one multi-tone mask. Thus, the number of light-exposure masks can be reduced and the number of corresponding photolithography steps can be also reduced, whereby the process can be simplified.

Next, plasma treatment using a gas such as nitrous oxide ($N_2O$), nitrogen ($N_2$), or argon (Ar) is performed. By this plasma treatment, absorbed water and the like attached to an exposed surface of the oxide semiconductor layer are removed. Plasma treatment may be performed using a mixture gas of oxygen and argon.

Then, the insulating layer 412 is formed so as to cover the oxide semiconductor layer 406a and the source/drain electrode layers 408a and 408b (see FIG. 15C).

The insulating layer 412 can be formed by a sputtering method, a CVD method, or the like, that is, a method with which impurities such as moisture and hydrogen are not mixed into the insulating layer 412. If hydrogen is contained in the insulating layer 412, hydrogen enters the oxide semiconductor layer 406a so that the backchannel of the oxide semiconductor layer 406a is made to have lower resistance (to be an n-type layer); thus, a parasitic channel is formed. Therefore, it is important to employ a formation method in which hydrogen is not used so that the insulating layer 412 contains as little hydrogen as possible.

The insulating layer 412 is preferably formed using silicon oxide, silicon oxynitride, aluminum oxide, hafnium oxide, tantalum oxide, or the like. In particular, a silicon oxide film formed by a sputtering method is preferably used. Note that the insulating layer 412 can have a single-layer structure or a layered structure. Although not particularly limited, the insulating layer 412 can have a thickness of, for example, 10 nm to 500 nm, preferably 50 nm to 200 nm.

Next, second heat treatment is preferably performed on the oxide semiconductor layer 406a in an inert gas atmosphere or an oxygen atmosphere. By performing the second heat treatment, oxygen can be supplied to oxygen vacancy of the oxide semiconductor layer 406a, and the intrinsic (i-type) or substantially intrinsic oxide semiconductor layer can be formed. The second heat treatment can reduce variations in electric characteristics of transistors. The second heat treatment is performed at 200° C. to 450° C., preferably 250° C. to 350° C. For example, the second heat treatment can be performed at 250° C. for one hour in a nitrogen atmosphere.

Through the above steps, the transistor 450 can be formed.

Further, the insulating layer 418 may be formed over the insulating layer 412. The insulating layer 418 is preferably formed using an inorganic insulating material that does not contain impurities such as moisture, a hydrogen ion, and $OH^-$ and blocks entry of these impurities from the outside; for example, a silicon nitride film, an aluminum nitride film, a silicon nitride oxide film, an aluminum oxynitride film, or the like is used. In this embodiment, a silicon nitride film is formed by an RF sputtering method, for example. Since an RF sputtering method has high productivity, it is preferably used as a method for depositing the insulating layer 418 (see FIG. 15D).

Note that depending on the conditions of the first heat treatment and the second heat treatment or the material of the oxide semiconductor layer 406a, part of the oxide semiconductor layer 406a may be crystallized so that a microcrystal or a polycrystal is formed in the oxide semiconductor layer 406a. When the oxide semiconductor layer 406a includes a non-single-crystal region, the transistor can have higher field-effect mobility and larger on-state current. On the other hand, when the oxide semiconductor layer 406a is amorphous, variations in characteristics of a plurality of elements can be reduced.

By performing the above-described first heat treatment, hydrogen contained in the oxide semiconductor layer 406 can be reduced (preferably removed), so that the oxide semiconductor layer 406 can be highly purified so as to contain an impurity other than its main component as little as possible. Thus, defects levels generated due to excessive hydrogen atoms can be reduced. The hydrogen concentration of the oxide semiconductor layer 406 at that time is preferably $5 \times 10^{19}$ (atoms/cm$^3$) or less. Moreover, the carrier density of the oxide semiconductor layer 406 is less than $1 \times 10^{14}$ cm$^{-3}$, preferably less than $1 \times 10^{12}$ cm$^{-3}$, further preferably less than $1.45 \times 10^{19}$ cm$^{-3}$. That is, the carrier concentration of the oxide semiconductor layer 406 is as close to zero as possible. Furthermore, the band gap is 2 eV or more, preferably 2.5 eV or more, further preferably 3 eV or more.

By using the highly purified oxide semiconductor layer 406 for a channel formation region, the off-state current of the transistor can be reduced. The off-state current flows by generation and recombination of holes and electrons due to direct recombination or indirect recombination. Since the oxide semiconductor layer has a wide band gap and high thermal energy is needed for exciting electrons, direct recombination and indirect recombination are not likely to occur. Since a hole which is a minority carrier is substantially zero in an off state, direct recombination and indirect recombination are not likely to occur, and the off-state current can be reduced as much as possible. Thus, the transistor can have excellent properties of small off-state current, large on-state current, and high field-effect mobility.

As described above, the highly purified oxide semiconductor layer functions as a path, and carriers are supplied from the source and drain electrodes. By appropriately selecting the electron affinity ($\chi$) and the Fermi level (ideally, the Fermi level identical to the intrinsic Fermi level) of the oxide semiconductor and the work function of the source and drain electrodes, carriers can be injected from the source electrode and the drain electrode while the carrier density of the oxide semiconductor layer remains low. Thus, an n-channel transistor and a p-channel transistor can be manufactured as appropriate.

The intrinsic carrier density of a highly purified oxide semiconductor is extremely lower than that of silicon. The intrinsic carrier density of silicon and an oxide semiconductor can be obtained from approximation formulae of the Fermi-Dirac distribution and the Boltzmann distribution. The intrinsic carrier density $n_i$ of silicon is $1.45 \times 10^{10}$ cm$^{-3}$ and the intrinsic carrier density $n_i$ of an oxide semiconductor (here, an In—Ga—Zn—O layer) is $1.2 \times 10^{-7}$ cm$^{-3}$, that is, silicon has an intrinsic carrier density $10^{17}$ times larger than that of the oxide semiconductor. In other words, it is clear that the intrinsic carrier density of the oxide semiconductor is extremely lower than that of silicon.

In this embodiment, the case where a bottom-gate thin film transistor is manufactured is described; however, one embodiment of the present invention is not limited thereto and a top-gate thin film transistor can be manufactured.

<Electrical Conduction Mechanism of Transistor Including Oxide Semiconductor>

Next, an electrical conduction mechanism of a transistor including an oxide semiconductor will be described with reference to FIG. 23, FIGS. 24A and 24B, FIGS. 25A and 25B, and FIG. 26. Note that the following description is based on the assumption of an ideal situation for simplification and does not entirely reflect a real situation. In addition, the following description is only an examination.

Figure 23:
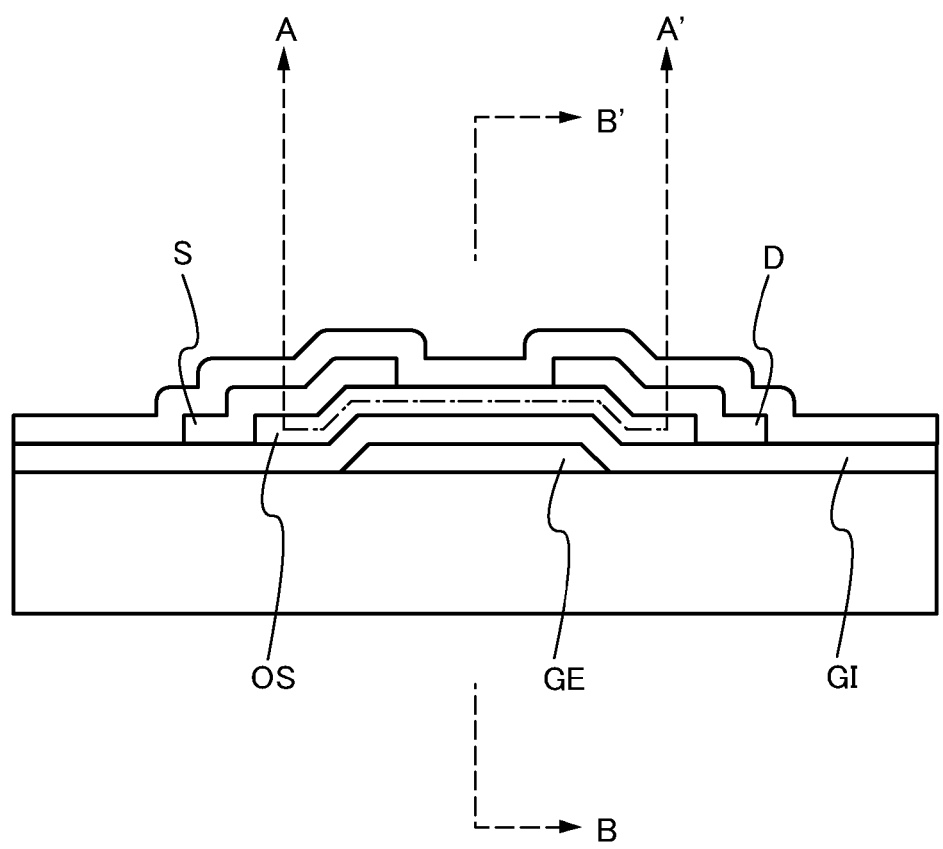
FIG. 23 illustrates an example of a semiconductor device in Embodiment 5.

FIG. 23 is a cross-sectional view of an inverted staggered transistor (thin film transistor) including an oxide semiconductor. An oxide semiconductor layer (OS) is provided over a gate electrode layer (GE) with a gate insulating layer (GI) therebetween, and a source electrode layer (S) and a drain electrode layer (D) are provided thereover.

Figure 24A:
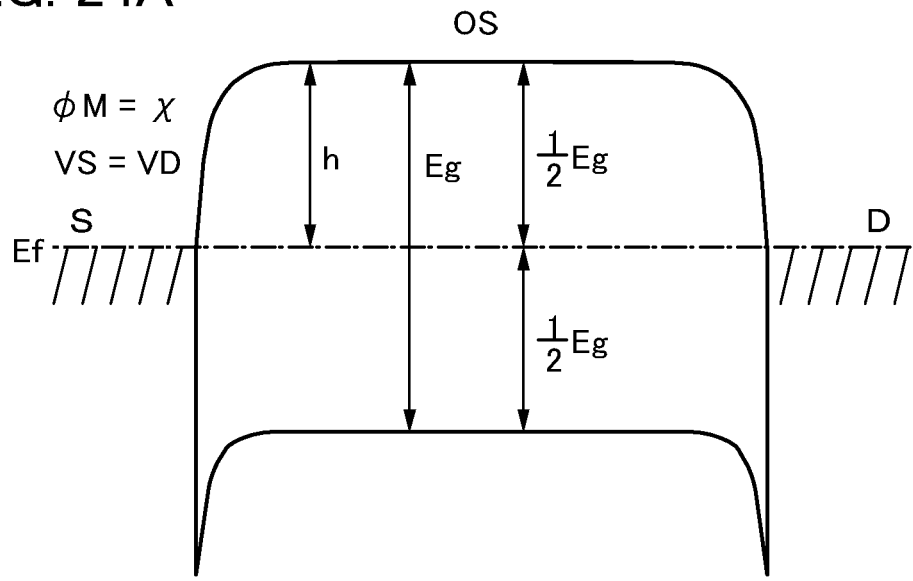
FIGS. 24A and 24B each illustrate an example of a semiconductor device in Embodiment 5.
Figure 24B:
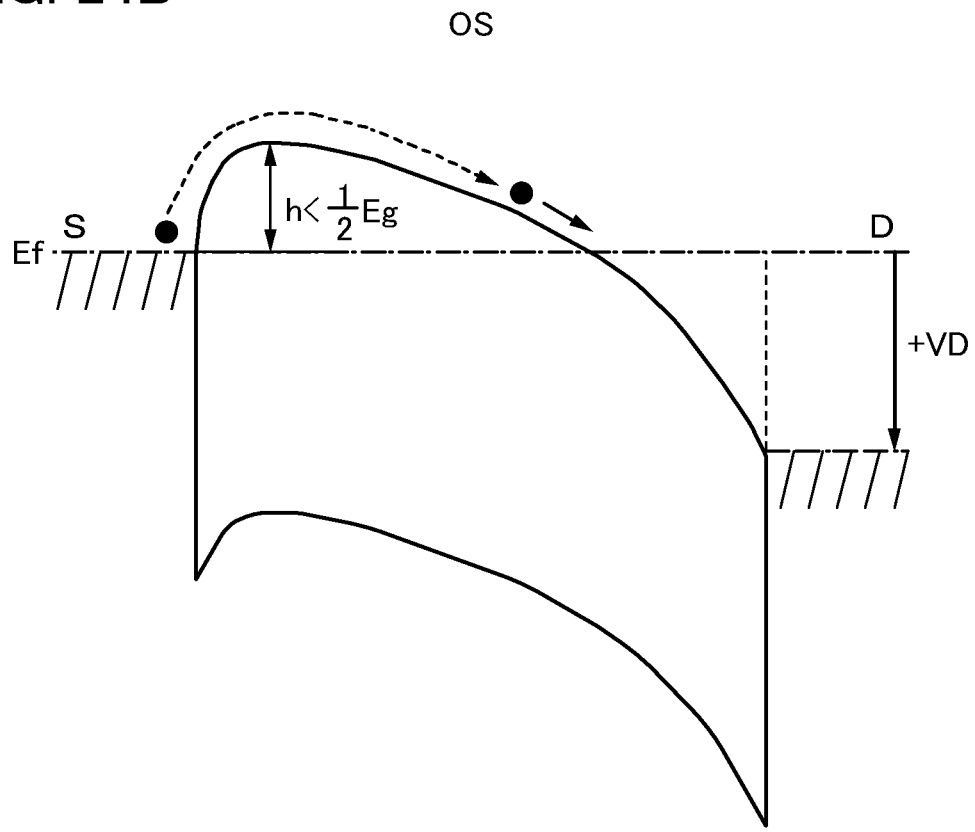

FIGS. 24A and 24B are energy band diagrams (schematic diagrams) of the cross section along A-A' in FIG. 23. FIG. 24A illustrates the case where the potential difference between the source and the drain is zero (the source and the drain have the same potential, $V_D = 0$ V). FIG. 24B illustrates the case where the potential of the drain is higher than that of the source ($V_D > 0$).

Figure 25A:
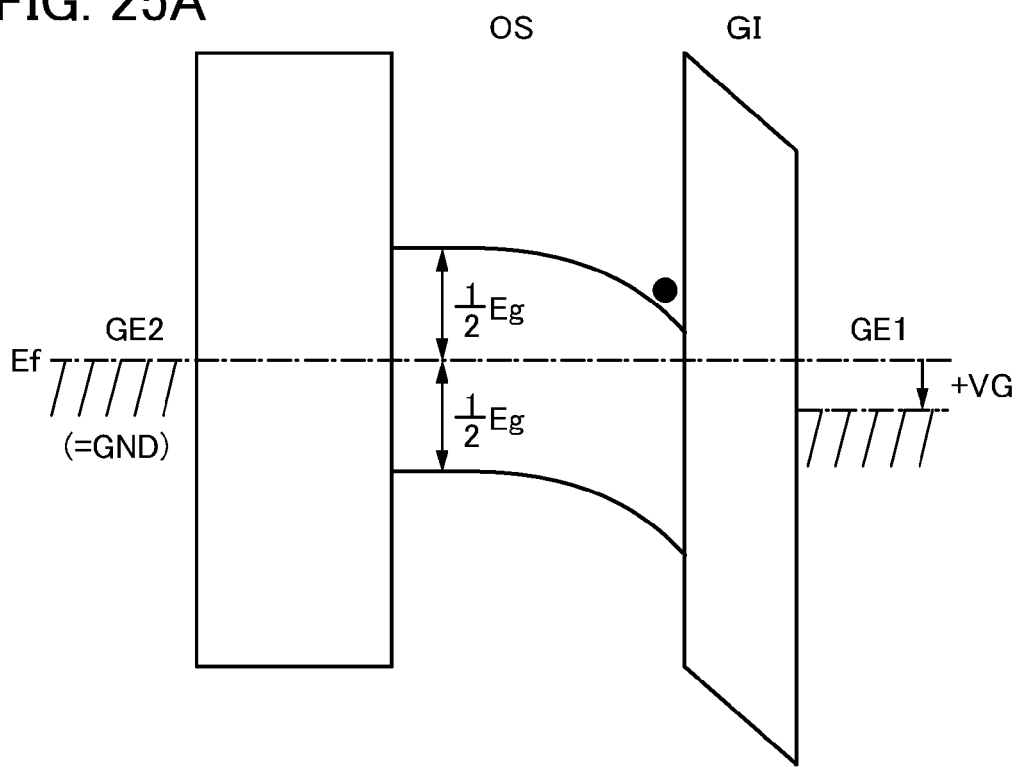
FIGS. 25A and 25B each illustrate an example of a semiconductor device in Embodiment 5.
Figure 25B:
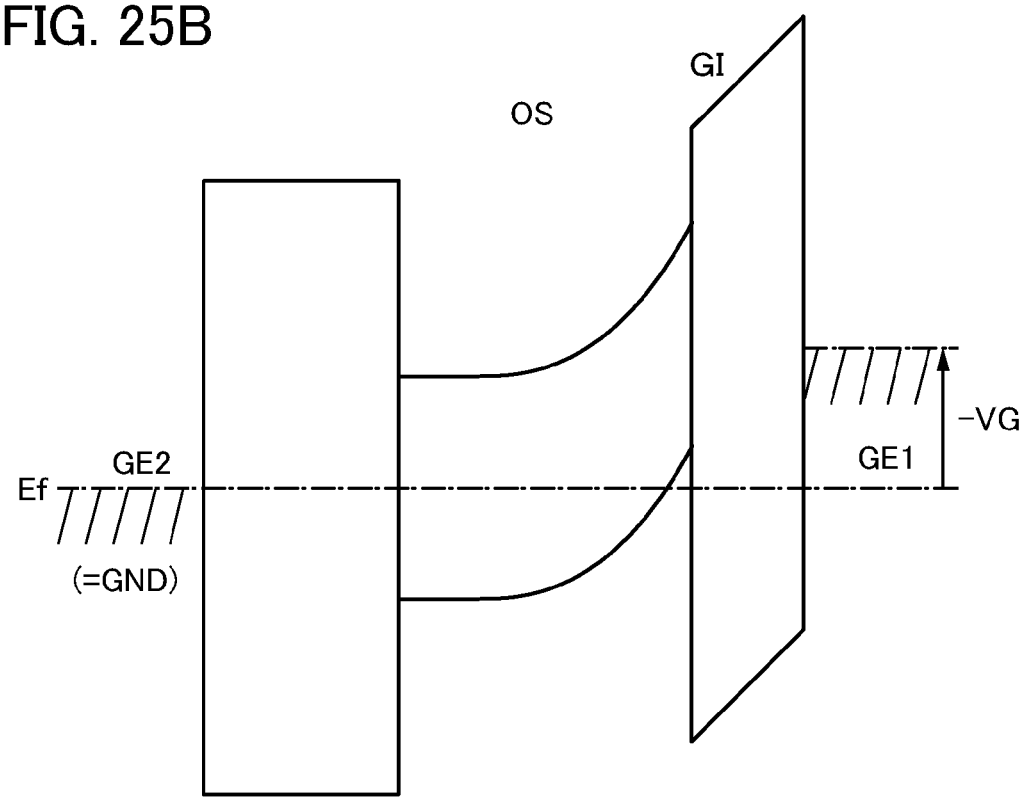

FIGS. 25A and 25B are energy band diagrams (schematic diagrams) of the cross section along B-B' in FIG. 23. FIG. 25A illustrates a state where a positive potential (+$V_G$) is applied to the gate (GE1), that is, an on state where carriers (electrons) flow between the source and the drain. FIG. 25B illustrates a state where a negative potential (−$V_G$) is applied to the gate (GE1), that is, an off state (a state where minority carriers do not flow).

Figure 26:
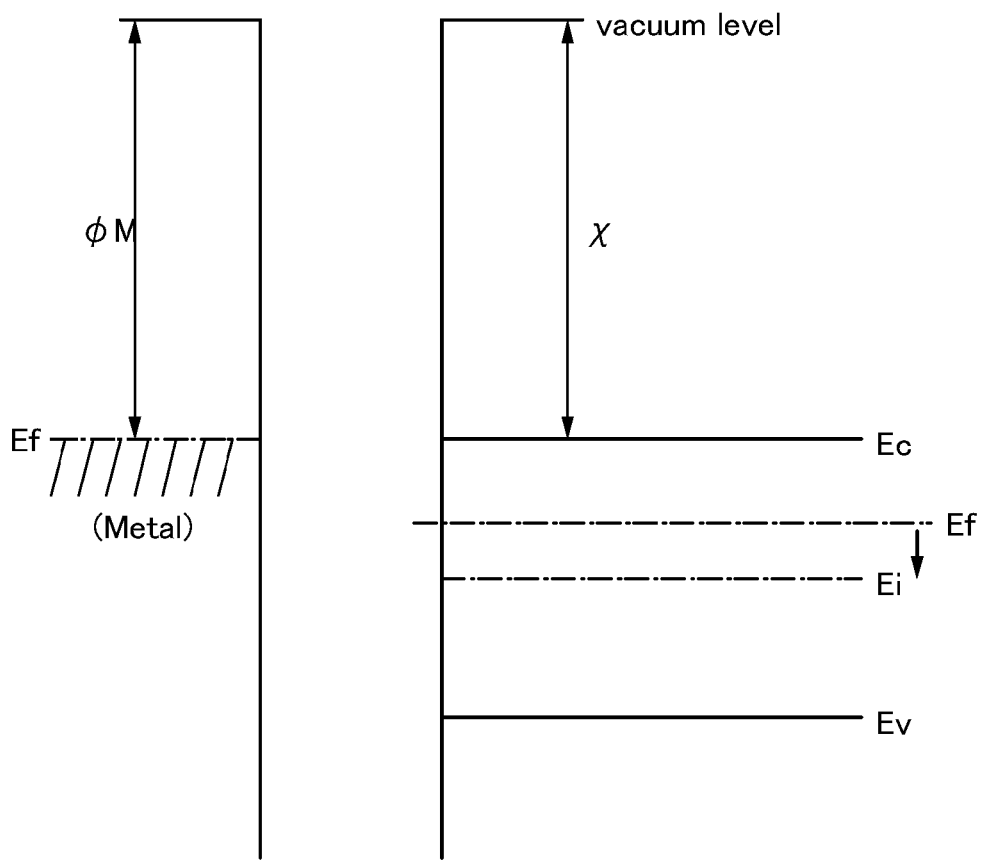
FIG. 26 illustrates an example of a semiconductor device in Embodiment 5.

FIG. 26 illustrates the relation between the vacuum level and the work function ($\phi_M$) of a metal and the relation between the vacuum level and the electron affinity ($\chi$) of an oxide semiconductor.

Since electrons in the metal are degenerated, the Fermi level is located in the conduction band. On the other hand, a conventional oxide semiconductor is an n-type semiconductor, and the Fermi level ($E_f$) is distant from the intrinsic Fermi level ($E_i$) in the middle of the band gap and is located near the conduction band. It is known that hydrogen in the oxide semiconductor is a donor and might be a factor that causes an oxide semiconductor to be an n-type oxide semiconductor. Further, oxygen vacancy is known as one of the causes to produce an n-type oxide semiconductor.

In contrast, an oxide semiconductor according to one embodiment of the invention disclosed herein is an oxide semiconductor that is made to be intrinsic (i-type) or to be close to intrinsic in the following manner: hydrogen, which is the cause to produce an n-type oxide semiconductor, is removed from an oxide semiconductor for high purification so that the oxide semiconductor contains an element (impurity element) other than the main component of the oxide semiconductor as little as possible, and oxygen vacancy is eliminated. That is, an oxide semiconductor is made to be or be close to a highly purified i-type (intrinsic) semiconductor not by addition of an impurity element but by elimination of impurities such as hydrogen and water and oxygen vacancy as much as possible. Thus, the Fermi level ($E_f$) can be comparable with the intrinsic Fermi level ($E_i$).

In the case where the band gap ($E_g$) of an oxide semiconductor is 3.15 eV, the electron affinity ($\chi$) is said to be 4.3 eV. The work function of titanium (Ti) included in the source electrode and the drain electrode is substantially equal to the electron affinity ($\chi$) of the oxide semiconductor. In that case, a Schottky barrier for electrons is not formed at an interface between the metal and the oxide semiconductor.

That is, in the case where the work function ($\phi_M$) of a metal is equal to the electron affinity ($\chi$) of the oxide semiconductor and the metal and the oxide semiconductor are in contact with each other, an energy band diagram (a schematic diagram) illustrated in FIG. 24A is obtained.

In FIG. 24B, a black dot (●) indicates an electron. When a positive potential is applied to the drain, the electron crosses over a barrier (h) and is injected into the oxide semiconductor, and flows toward the drain. The height of the barrier (h) depends on a gate voltage and a drain voltage. When a positive drain voltage is applied, the height of the barrier (h) is lower than the height of the barrier in FIG. 24A where a voltage is not applied, that is, half the band gap ($E_g$).

At this time, as illustrated in FIG. 25A, the electron travels in the vicinity of the interface between the gate insulating layer and the highly purified oxide semiconductor (the lowest part of the oxide semiconductor, which is energetically stable).

As illustrated in FIG. 25B, when a negative potential (a reverse bias) is applied to the gate electrode (GE1), a hole which is a minority carrier does not substantially exist, so that the current value is as close to zero as possible.

For example, even when a thin film transistor has a channel width W of $1 \times 10^4$ μm and a channel length of 3 μm, the off-state current can be $10^{-13}$ A or less and the subthreshold swing (S value) can be 0.1 V/dec at room temperature (with a 100-nm-thick gate insulating layer).

As described above, the oxide semiconductor is highly purified so as to contain impurities that are not main components of the oxide semiconductor as little as possible, so that the thin film transistor can operate in a favorable manner. For example, the off-state current at room temperature can be reduced to approximately $1 \times 10^{-20}$ A (10 zA (zeptoamperes)) to $1 \times 10^{-19}$ A (100 zA).

The above-described oxide semiconductor is a highly purified and electrically intrinsic (i-type) oxide semiconductor made by the following manner: in order to suppress variations in electrical characteristics, impurities which cause variations, such as hydrogen, moisture, a hydroxyl group, and hydride (also referred to as hydrogen compound), are removed intentionally; and oxygen which is a main component of the oxide semiconductor and is reduced in the step of removing impurities is supplied.

Therefore, it is preferable that the amount of hydrogen in the oxide semiconductor be as small as possible, and hydrogen contained in the oxide semiconductor is removed to as close to zero as possible so that the hydrogen concentration of the oxide semiconductor is $5 \times 10^{19}$ (atoms/cm$^3$) or less. The hydrogen concentration of the oxide semiconductor may be measured by secondary ion mass spectrometry (SIMS).

The number of carriers in the highly purified oxide semiconductor is extremely small (close to zero), and the carrier density is less than $1 \times 10^{12}$ cm$^{-3}$, preferably less than $1.45 \times 10^{10}$ cm$^3$. That is, the carrier density of the oxide semiconductor layer is extremely close to zero. Since the number of carriers in the oxide semiconductor layer is extremely small, the off-state current of the thin film transistor can be reduced. It is preferable that the off-state current be as small as possible. The amount of current of the thin film transistor per a channel width (W) of 1 μm is 100 aA (i.e., 100 aA/μm) or less, preferably 10 aA (i.e., 10 aA/μm) or less, and further preferably 1 aA (i.e., 1 aA/μm) or less. Moreover, since the thin film transistor does not have pn junction and hot carrier degradation does not occur, electrical characteristics of the thin film transistor are not adversely affected.

As described above, the off-state current can be extremely small in a thin film transistor in which an oxide semiconductor layer that is highly purified by drastically removing hydrogen contained therein is used in a channel formation region. In other words, in circuit design, the oxide semiconductor layer can be regarded as an insulator when the thin film transistor is off. On the other hand, when the thin film transistor is on, the current supply capability of the oxide semiconductor is expected to be higher than that of a semiconductor layer formed of amorphous silicon.

Design is performed assuming that the off-state current of a thin film transistor formed using low-temperature polysilicon is about 10000 times as large as that of a thin film transistor formed using an oxide semiconductor. Thus, a period for holding voltage of the thin film transistor formed using an oxide semiconductor can be about 10000 times as long as that of the thin film transistor formed using low-temperature polysilicon, when these thin film transistors have an equivalent storage capacitance (of about 0.1 pF). For example, when moving images are displayed at 60 frames per second, a holding period for one signal writing can be approximately 160 seconds, which is 10000 times as long as that of the thin film transistor formed using low-temperature polysilicon. In this manner, still images can be displayed on a display portion even by less frequent writing of image signals.

By application of the transistor in this embodiment to any of the semiconductor devices in Embodiments 1 to 3, the drive capability of the semiconductor device can be improved.

Embodiment 6

In this embodiment, an example of a display device will be described.

Figure 18A:
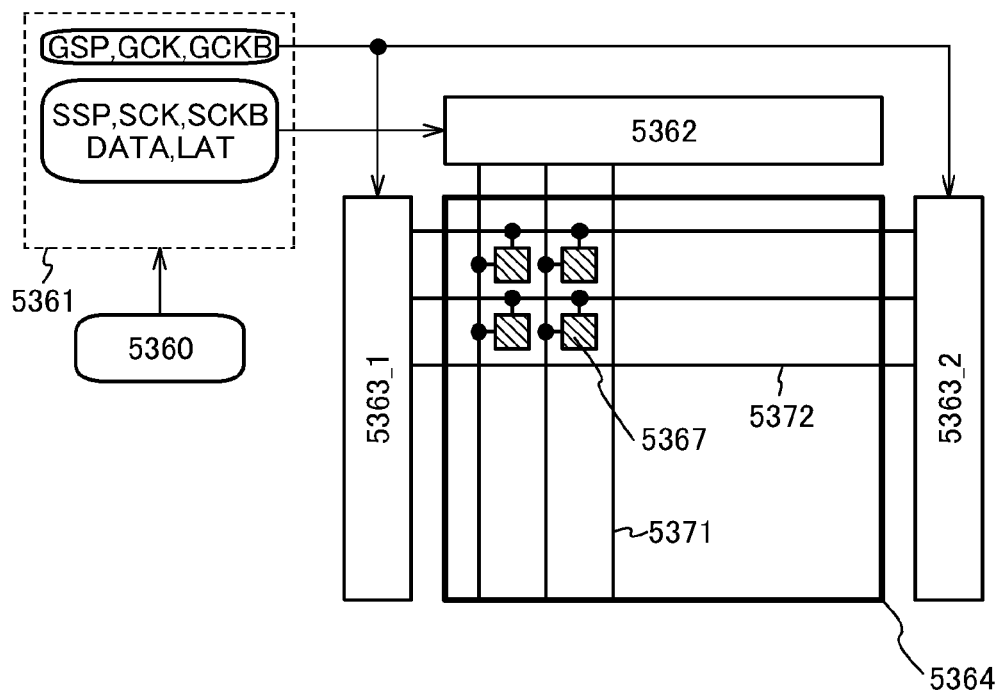
FIGS. 18A and 18B each illustrate an example of a block diagram of a display device in Embodiment 6.

FIG. 18A illustrates an example of a display device. The display device in FIG. 18A includes a circuit 5361, a circuit 5362, a circuit 5363_1, a circuit 5363_2, and a pixel portion 5364. A plurality of wirings 5371 that are extended from the circuit 5362 and a plurality of wirings 5372 that are extended from the circuits 5363_1 and 5363_2 are provided in the pixel portion 5364. In addition, pixels 5367 are arranged in matrix in respective regions where the plurality of wirings 5371 and the plurality of wirings 5372 intersect with each other.

The circuit 5361 has a function of controlling the timing at which the circuit 5362, the circuit 5363_1, and the circuit 5363_2 operate. Accordingly, the circuit 5361 supplies a signal, voltage, current, or the like to the circuits 5362, 5363_1, and 5363_2 in response to a video signal 5360. For example, the circuit 5361 supplies a source driver start signal (SSP), a source driver clock signal (SCK), a source driver inverted clock signal (SCKB), video signal data (DATA), and a latch signal (LAT) to the circuit 5362. Moreover, the circuit 5361 supplies a gate driver start signal (GSP), a gate driver clock signal (GCK), and a gate driver inverted clock signal (GCKB) to the circuit 5363_1 and the circuit 5363_2. As described above, the circuit 5361 has a function of a controller, a control circuit, a timing generator, a power supply circuit, a regulator, or the like.

The circuit 5362 has a function of outputting video signals to the plurality of wirings 5371 in response to a signal supplied from the circuit 5361 (e.g., SSP, SCK, SCKB, DATA, or LAT). That is, the circuit 5362 has a function of a source driver.

The circuit 5363_1 and the circuit 5363_2 each have a function of outputting gate signals to the plurality of wirings 5372 in response to a signal supplied from the circuit 5361 (e.g., GSP, GCK, or GCKB). That is, each of the circuit 5363_1 and the circuit 5363_2 can function as a gate driver.

Figure 18B:
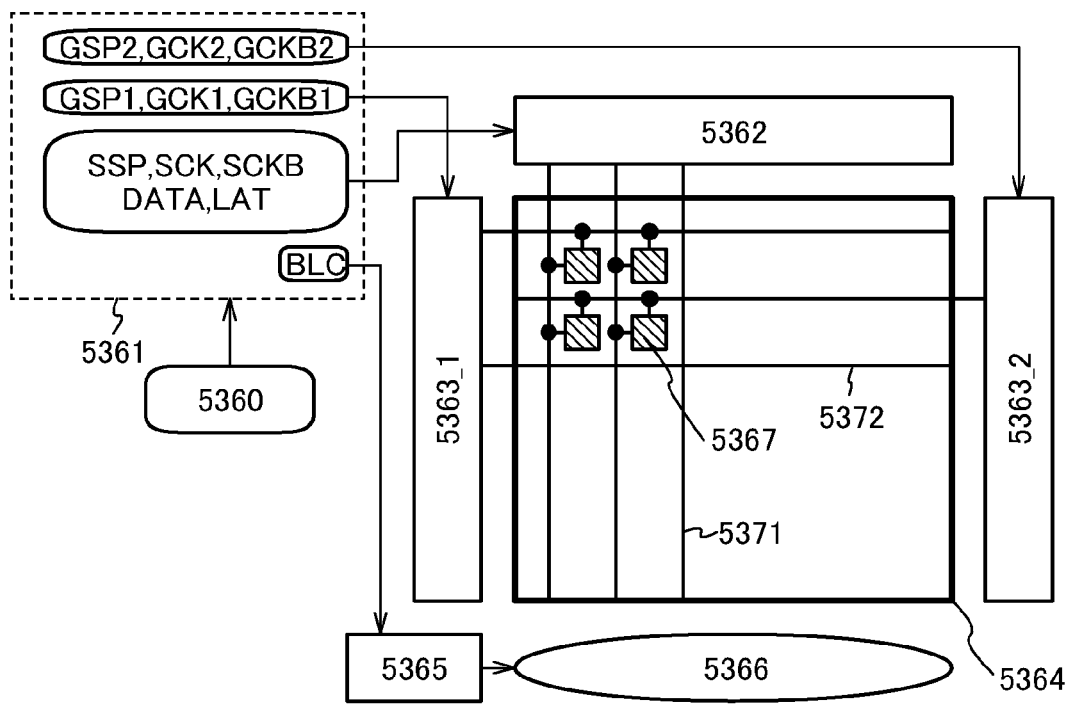

Note that in the display device in FIG. 18A, the same signal is supplied to the circuit 5363_1 and the circuit 53632, so that the circuit 5363_1 and the circuit 53632 often output gate signals to the plurality of wirings 5372 at about the same timing Therefore, the load of the circuit 5363_1 and the circuit 53632 can be reduced. However, one example of this embodiment is not limited to this structure. For example, as illustrated in FIG. 18B, different signals can be input to the circuit 5363_1 and the circuit 5363_2. Accordingly, part of the plurality of wirings 5372 (e.g., odd-numbered rows) can be controlled by the circuit 5363_1 and another part of the plurality of wirings 5372 (e.g., even-numbered rows) can be controlled by the circuit 5363_2. Thus, the drive frequency of the circuits 5363_1 and 5363_2 can be lowered.

As illustrated in FIG. 18B, the display device can include a circuit 5365 and a lighting device 5366. The circuit 5365 has a function of controlling the amount of electric power supplied to the lighting device 5366, time to supply the electric power to the lighting device 5366, or the like in response to a backlight control signal (BLC) supplied from the circuit 5361. Thus, the luminance (or average luminance) of the lighting device 5366 can be controlled in accordance with the video signal 5360, so that local dimming can be realized. The luminance of the lighting device 5366 can be reduced when an image as a whole is dark, whereas the luminance of the lighting device 5366 can be increased when an image as a whole is bright. In this manner, the contrast ratio can be increased or power consumption can be reduced.

The plurality of wirings 5371 and the plurality of wirings 5372 function as signal lines. Specifically, the plurality of wirings 5371 function as source signal lines (also referred to as video signal lines), and the plurality of wirings 5372 function as gate signal lines (also referred to as scan signal lines or selection signal lines).

Note that one of the circuit 5363_1 and the circuit 5363_2 can be omitted. Alternatively, a circuit having a function similar to that of the circuits 5363_1 and 5363_2 can be additionally provided.

Note that one or a plurality of wirings (e.g., a capacitor line, a power supply line, a gate signal line, and/or a source signal line) can be provided in the pixel portion 5364 depending on the structure of the pixel 5367. In such a case, it is possible to additionally provide a circuit for controlling a potential of the wiring additionally provided. Specifically, when a liquid crystal element, an electrophoretic element, or the like is used as a display element, a capacitor line is preferably provided in the pixel portion 5364. Specifically, when an EL element is used as a display element, a power source is preferably provided in the pixel portion 5364.

Figure 19A:
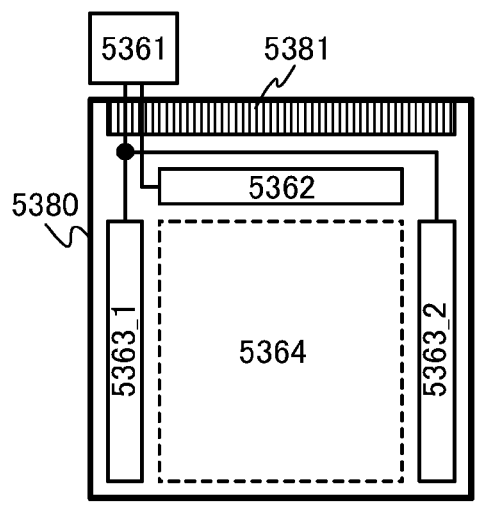
FIGS. 19A to 19D each illustrate an example of a block diagram of a display device in Embodiment 6.

As illustrated in FIG. 19A, in the display device of FIG. 18A, the circuit 5362, the circuit 5363_1, and the circuit 5363_2 can be formed over the substrate 5380 where the pixel portion 5364 is formed. Moreover, the circuit 5361 in the display device of FIG. 18A can be formed over a substrate different from the substrate where the pixel portion 5364 is formed.

Figure 19B:
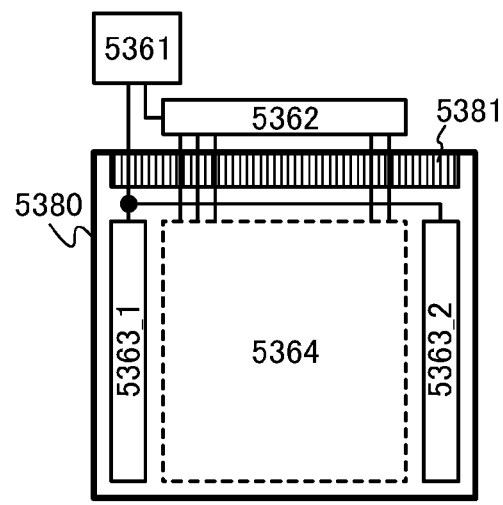

As illustrated in FIG. 19B, in the display device of FIG. 18A, the circuit 5361 and the circuit 5362 can be formed over a substrate different from the substrate where the pixel portion 5364 is formed. Since the drive frequency of the circuit 5363_1 and the circuit 5363_2 is often lower than that of the circuit 5361 and the circuit 5362, the circuit 5361 and the circuit 5362 are preferably formed over a substrate different from the substrate where the circuit 5363_1 and the circuit 53632 are formed. Thus, the drive frequency of the circuit 5361 and the circuit 5362 can be increased, so that the size of the display device can be increased. Furthermore, the circuit 5363_1 and the circuit 53632 can be formed over the substrate where the pixel portion 5364 is formed, so that the display device can be manufactured at lower cost.

Figure 19C:
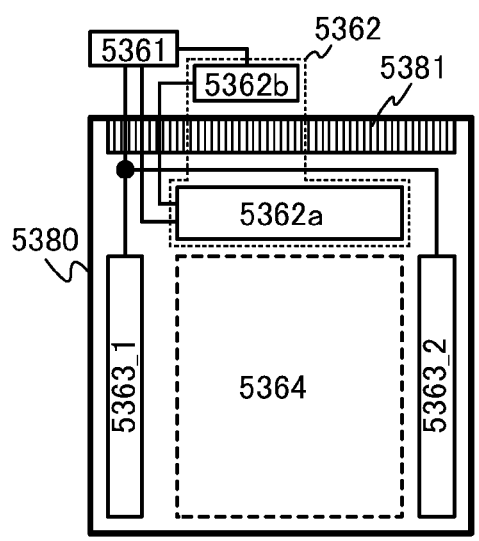

As illustrated in FIG. 19C, in the display device of FIG. 18A, a circuit 5362a (part of the circuit 5362) can be formed over the substrate where the pixel portion 5364 is formed, and the circuit 5361 and a circuit 5362b (another part of the circuit 5362) can be formed over a substrate different from the substrate where the pixel portion 5364 is formed. A circuit whose drive frequency is comparatively low, such as a switch, a shift register, and/or a selector can be used as the circuit 5362a. Thus, the drive frequency of the circuit 5361 and the circuit 5362b can be increased, so that the size of the display device can be increased. Alternatively, the circuit 5362a, the circuit 5363_1, and the circuit 5363_2 can be formed over the substrate where the pixel portion 5364 is formed, so that the display device can be manufactured at lower cost.

Figure 19D:
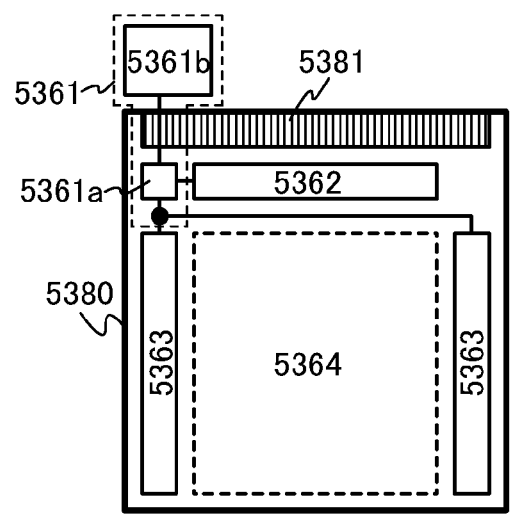

As illustrated in FIG. 19D, in the display device in FIG. 18A, a circuit 5361a (part of the circuit 5361) can be formed over the substrate where the pixel portion 5364 is formed, and a circuit 5361b (another part of the circuit 5361) can be formed over a substrate different from the substrate where the pixel portion 5364 is formed.

A circuit formed over a substrate different from the substrate where the pixel portion 5364 is formed (such a circuit is also referred to as an external circuit) often supplies a signal, voltage, current, or the like through an input terminal 5381 to a circuit or a wiring formed over the substrate where the pixel portion 5364 is formed.

Note that the external circuit can be mounted on an FPC (flexible printed circuit) by TAB (tape automated bonding). Alternatively, the external circuit can be mounted on the substrate 5380 where the pixel portion 5364 is formed, by COG (chip on glass).

The external circuit is preferably formed using a single crystal substrate, an SOI substrate, or the like. Accordingly, it is possible to realize improvement in drive frequency, improvement in drive voltage, reduction in variation of output signals, or the like.

Note that any of the semiconductor devices shown in Embodiments 1 to 4 can be applied to the display device in this embodiment. Specifically, any of the semiconductor devices in Embodiments 1 to 4 can be used as the circuit 5362 and the circuit 5363. Thus, the drive capability of a circuit for driving the pixel portion 5364 (e.g., the circuit 5362 and the circuit 5363) can be improved, so that the resolution of the pixel can be increased or the size of the display device can be increased.

Note that in this specification and the like, a display element, a display device which is a device including a display element, a light-emitting element, and a light-emitting device which is a device including a light-emitting element can employ various modes or can include various elements. For example, a display medium whose contrast, luminance, reflectance, transmittance, or the like changes by electromagnetic action, such as an EL (electroluminescence) element (e.g., an EL element including organic and inorganic materials, an organic EL element, or an inorganic EL element), an LED (e.g., a white LED, a red LED, a green LED, or a blue LED), a transistor (a transistor that emits light depending on the amount of current), an electron emitter, a liquid crystal element, electronic ink, an electrophoretic element, a grating light valve (GLV), a plasma display panel (PDP), a digital micromirror device (DMD), or a piezoelectric ceramic display, can be used for a display element, a display device, a light-emitting element, or a light-emitting device. An example of display devices including EL elements is an EL display. Examples of display devices including electron emitters are a field emission display (FED) and an SED-type flat panel display (SED: surface-conduction electron-emitter display). Examples of display devices including liquid crystal elements are liquid crystal displays (e.g., a transmissive liquid crystal display, a transflective liquid crystal display, a reflective liquid crystal display, a direct-view liquid crystal display, and a projection liquid crystal display). An example of display devices including electronic ink or electrophoretic elements is electronic paper.

An example of an EL element is an element including an anode, a cathode, and an EL layer placed between the anode and the cathode. Examples of an EL layer are a layer utilizing light emission (fluorescence) from a singlet exciton, a layer utilizing light emission (phosphorescence) from a triplet exciton, a layer utilizing light emission (fluorescence) from a singlet exciton and light emission (phosphorescence) from a triplet exciton, a layer formed using an organic material, a layer formed using an inorganic material, a layer formed using an organic material and an inorganic material, a layer including a high-molecular material, a layer including a low-molecular material, and a layer including a high-molecular material and a low-molecular material. Note that various types of EL elements can be used without limitation to the above.

An example of liquid crystal elements is an element that controls transmission and non-transmission of light by optical modulation action of liquid crystals. The element can include a pair of electrodes and a liquid crystal layer. The optical modulation action of liquid crystals is controlled by an electric field applied to the liquid crystal (including a lateral electric field, a vertical electric field, and a diagonal electric field). Specifically, the following can be used for a liquid crystal element, for example: a nematic liquid crystal, a cholesteric liquid crystal, a smectic liquid crystal, a discotic liquid crystal, a thermotropic liquid crystal, a lyotropic liquid crystal, a low-molecular liquid crystal, a high-molecular liquid crystal, a polymer dispersed liquid crystal (PDLC), a ferroelectric liquid crystal, an anti-ferroelectric liquid crystal, a main-chain liquid crystal, a side-chain high-molecular liquid crystal, a plasma addressed liquid crystal (PALC), and a banana-shaped liquid crystal. Moreover, the following methods can be used for driving the liquid crystals, for example: a TN (twisted nematic) mode, an STN (super twisted nematic) mode, an IPS (in-plane-switching) mode, an FFS (fringe field switching) mode, an MVA (multi-domain vertical alignment) mode, a PVA (patterned vertical alignment) mode, an ASV (advanced super view) mode, an ASM (axially symmetric aligned microcell) mode, an OCB (optically compensated birefringence) mode, an ECB (electrically controlled birefringence) mode, an FLC (ferroelectric liquid crystal) mode, an AFLC (anti-ferroelectric liquid crystal) mode, a PDLC (polymer dispersed liquid crystal) mode, a PNLC (polymer network liquid crystal) mode, a guest-host mode, and a blue phase mode. Note that various liquid crystal elements and driving methods can be used without limitation to the above.

For example, display of electronic paper can be performed using molecules (a method utilizing optical anisotropy, dye molecular orientation, or the like), particles (a method utilizing electrophoresis, particle movement, particle rotation, phase change, or the like), movement of one end of a film, coloring properties or phase change of molecules, optical absorption by molecules, or self-light emission by combination of electrons and holes. Specific examples of display methods of electronic paper are microcapsule electrophoresis, horizontal electrophoresis, vertical electrophoresis, a spherical twisting ball, a magnetic twisting ball, a columnar twisting ball, a charged toner, electro liquid powder (registered trademark), magnetophoresis, a magnetic thermosensitive type, electrowetting, light-scattering (transparent-opaque change), a cholesteric liquid crystal and a photoconductive layer, a cholesteric liquid crystal, a bistable nematic liquid crystal, a ferroelectric liquid crystal, a liquid crystal dispersed type with a dichroic dye, a movable film, coloring and decoloring properties of a leuco dye, photochromism, electrochromism, electrodeposition, and flexible organic EL. Note that various electronic paper and display methods can be used without limitation to the above. By using microcapsule electrophoresis as a display method of electronic paper, problems of electrophoresis, that is, aggregation and precipitation of electrophoretic particles can be solved. By using electro liquid powder as a display method of electronic paper, the electronic paper has advantages such as high-speed response, high reflectance, wide viewing angle, low power consumption, and memory properties.

Note that electroluminescence, a cold cathode fluorescent lamp, a hot cathode fluorescent lamp, an LED, a laser light source, a mercury lamp, or the like can be used as a light source of a display device in which a light source is needed, such as a liquid crystal display (e.g., a transmissive liquid crystal display, a transflective liquid crystal display, a reflective liquid crystal display, a direct-view liquid crystal display, or a projection liquid crystal display), a display device including a grating light valve (GLV), or a display device including a digital micromirror device (DMD), for example. Note that a variety of light sources can be used without limitation to the above.

Note that in this specification and the like, a transistor can be formed using a variety of substrates. There is no particular limitation on the kind of a substrate. Examples of a substrate where a transistor is formed are a semiconductor substrate (e.g., a single crystal substrate and a silicon substrate), an SOI substrate, a glass substrate, a quartz substrate, a plastic substrate, a metal substrate, a stainless steel substrate, a substrate including stainless steel foil, a tungsten substrate, a substrate including tungsten foil, a flexible substrate, an attachment film, paper including a fibrous material, and a base material film. Examples of a glass substrate are a barium borosilicate glass substrate, an aluminoborosilicate glass substrate, and a soda lime glass substrate. For a flexible substrate, a flexible synthetic resin such as plastics typified by polyethylene terephthalate (PET), polyethylene naphthalate (PEN), and polyether sulfone (PES), or acrylic can be used, for example. An example of an attachment film is an attachment film formed using polypropylene, polyester, vinyl, polyvinyl fluoride, polyvinyl chloride, or the like. For a base film, polyester, polyamide, polyimide, an inorganic vapor deposition film, paper, or the like can be used, for example. Specifically, when a transistor is formed using a semiconductor substrate, a single crystal substrate, an SOI substrate, or the like, it is possible to form a transistor with few variations in characteristics, size, shape, or the like and with high current supply capability and a small size. By forming a circuit using such transistors, power consumption of the circuit can be reduced or the circuit can be highly integrated.

Note that a transistor may be formed using one substrate, and then, the transistor may be transferred to another substrate. Example of a substrate to which a transistor is transferred are, in addition to the above-described substrate where the transistor can be formed, a paper substrate, a cellophane substrate, a stone substrate, a wood substrate, a cloth substrate (including a natural fiber (e.g., silk, cotton, or hemp), a synthetic fiber (e.g., nylon, polyurethane, or polyester), a regenerated fiber (e.g., acetate, cupra, rayon, or regenerated polyester), or the like), a leather substrate, and a rubber substrate. By using such a substrate, transistors with excellent properties or transistors with low power consumption can be formed, a device with high durability or high heat resistance can be formed, or reduction in weight or thickness can be achieved.

Note that all the circuits that are necessary to realize a desired function can be formed using one substrate (e.g., a glass substrate, a plastic substrate, a single crystal substrate, or an SOI substrate).

In addition, not all the circuits that are necessary to realize the predetermined function are needed to be formed using one substrate. That is, part of the circuits which are necessary to realize the predetermined function can be formed using one substrate and another part of the circuits which are necessary to realize the predetermined function can be formed using another substrate. For example, some of the circuits which are necessary to realize the predetermined function can be formed using a glass substrate and some of the circuits which are necessary to realize the predetermined function can be formed using a single crystal substrate (or an SOI substrate). Then, the single crystal substrate where some of the circuits which are necessary to realize the predetermined function (such a substrate is also referred to as an IC chip) are formed can be connected to the glass substrate by COG (chip on glass), and the IC chip can be provided over the glass substrate. Alternatively, the IC chip can be connected to the glass substrate by TAB (tape automated bonding), COF (chip on film), SMT (surface mount technology), a printed circuit board, or the like.

Note that the transistor in Embodiment 5 can be used as a transistor included in a driver circuit (e.g., the circuit 5362 and the circuit 5363) and/or a transistor included in the pixel portion 5354.

Embodiment 7

In this embodiment, an example of a pixel and a method for driving the pixel will be described. Specifically, an example of a pixel that includes a display element with memory properties and an example of a method for driving the pixel will be described.

Figure 20A:
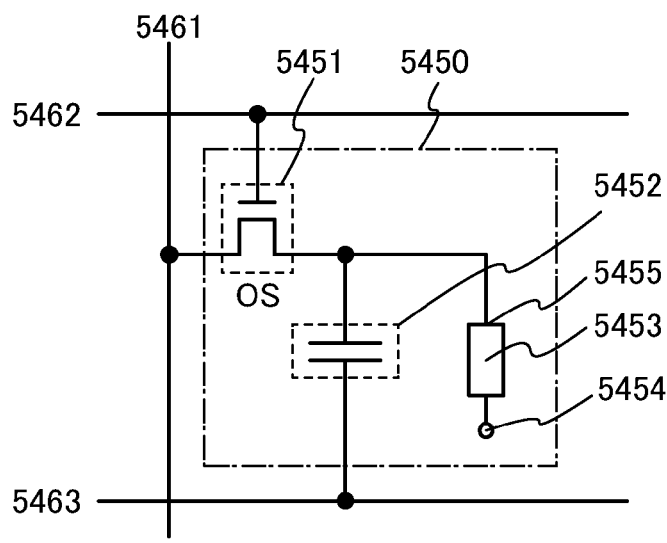
FIG. 20A illustrates an example of a circuit diagram of a pixel in Embodiment 7.

FIG. 20A illustrates an example of a circuit diagram of a pixel. A pixel 5450 includes a transistor 5451, a capacitor 5452, and a display element 5453. A first terminal of the transistor 5451 is connected to a wiring 5461. A second terminal of the transistor 5451 is connected to one electrode of the capacitor 5452 and one electrode of the display element 5453 (also referred to as a pixel electrode). A gate of the transistor 5451 is connected to a wiring 5462. The other electrode of the capacitor 5452 is connected to a wiring 5463. The other electrode of the display element 5453 is connected to an electrode 5454 (also referred to as a common electrode, a counter electrode, or a cathode electrode).

Note that an electrode 5455 refers to one electrode of the display element 5453.

The display element 5453 preferably has memory properties. Examples of the display element 5453 and a method for driving the display element are microcup electrophoresis, microcup electrophoresis, horizontal electrophoresis, vertical electrophoresis, twisting ball, liquid powder display, electro liquid powder, a cholesteric liquid crystal, a chiral nematic liquid crystal, an anti-ferroelectric liquid crystal, a polymer dispersed liquid crystal, a charged toner, electrowetting, electrochromism, and electrodeposition.

Figure 20B:
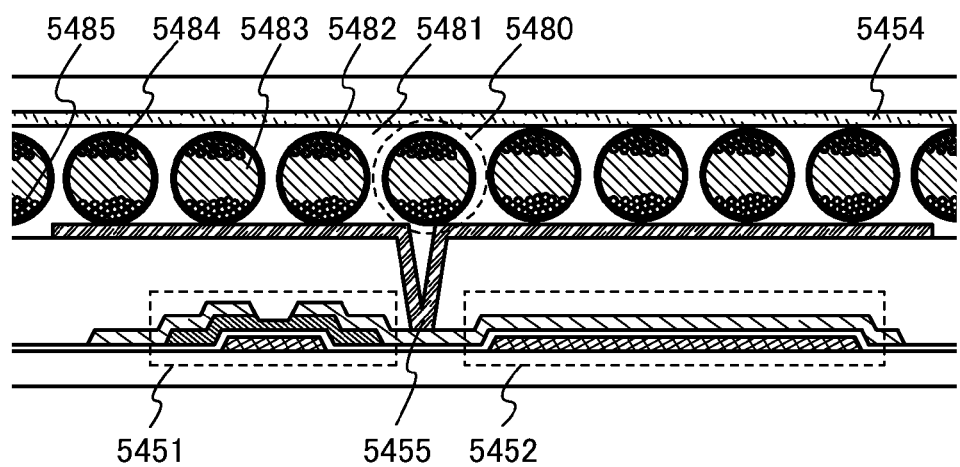
FIG. 20B illustrates an example of a cross-sectional view of the pixel.

FIG. 20B is a cross-sectional view of a pixel using microcapsule electrophoresis. A plurality of microcapsules 5480 are placed between an electrode 5454 and an electrode 5455. The plurality of microcapsules 5480 are fixed by a resin 5481. The resin 5481 functions as a binder. The resin 5481 preferably has light-transmitting properties. A space formed by the electrode 5454, the electrode 5455, and the microcapsule 5480 can be filled with a gas such as air or an inert gas. Note that the microcapsules 5480 can be fixed by formation of a layer including an adhesive or the like on a surface of one or both of the electrodes 5454 and 5455.

The microcapsule 5480 includes a film 5482, a liquid 5483, particles 5484, and particles 5485. The liquid 5483, the particles 5484, and the particles 5485 are sealed in the film 5482. The film 5482 has light-transmitting properties. The liquid 5483 functions as a dispersion liquid. The particles 5484 and the particles 5485 can be dispersed in the film 5482 by the liquid 5483. It is preferable that the liquid 5483 have light-transmitting properties and be not colored. The particle 5484 and the particle 5485 have different colors. For example, it is preferable that one of the particle 5484 and the particle 5485 be black and the other of the particle 5484 and the particle 5485 be white. Note that the particle 5484 and the particle 5485 are charged so that their electric charge densities are different from each other. For example, one of the particle 5484 and the particle 5485 is positively charged and the other of the particle 5484 and the particle 5485 is negatively charged. Thus, when a potential difference occurs between the electrode 5454 and the electrode 5455, the particle 5484 and the particle 5485 move in accordance with the direction of electric fields. Accordingly, the reflectance of the display element 5453 is changed, so that the gray level can be controlled. Note that the structure of the microcapsule 5480 is not limited to the above-described structure. For example, the liquid 5483 can be colored. As another example, as particles sealed in the film 5482, one kind of particles or three kinds or more of particles can be used. As another example, colors of the particle 5484 and the particle 5485 can be selected from red, green, blue, cyan, magenta, yellow emerald green, vermillion, and the like in addition to white and black.

The film 5482 is formed using a light-transmitting material (e.g., a polymer resin such as an acrylic resin (e.g., poly (methyl methacrylate) or poly(ethyl methacrylate)), a urea resin, or gum arabic), for example. Note that the film 5482 is preferably gelatinous. By using such a film 5482, the plasticity, bending strength, mechanical strength, and the like can be improved, leading to improvement in flexibility. Alternatively, the microcapsules 5480 can be uniformly arranged with no gap therebetween over a substrate such as film.

A light-transmitting oily liquid is preferably used as the liquid 5483. Specific examples of the liquid 5483 are an alcohol-based solvent (e.g., methanol, ethanol, isopropanol, butanol, octanol, and methyl cellosolve), ester (e.g., ethyl acetate and butyl acetate), aliphatic hydrocarbon (e.g., ketone such as acetone, methyl ethyl ketone, and methyl isobutyl ketone; pentane, hexane, and octane), alicyclic hydrocarbon (e.g., cyclohexane and methylcyclohexane), aromatic hydrocarbon such as benzene having a long-chain alkyl group (e.g., benzene, toluene, xylene, hexylbenzene, butylbenzene, octylbenzene, nonylbenzene, decylbenzene, undecylbenzene, dodecylbenzene, tridecylbenzene, and tetradecylbenzene), halogenated hydrocarbon (e.g., methylene chloride, chloroform, carbon tetrachloride, and dichloroethane), calboxylate salt, water, and other kinds of oils. Other examples of the liquid 5483 are a mixture of two or more of the above-described materials, a combination of a surface active agent or the like and one of the above materials, and a combination of a surface active agent or the like and a mixture of two or more of the above materials.

Each of the particle 5484 and the particle 5485 is formed using a pigment. The pigments included in the particle 5484 and the particle 5485 preferably have different colors. For example, it is preferable that the particle 5484 be formed using a black pigment and the particle 5485 be formed using a white pigment. Examples of the black pigment are aniline black and carbon black. Examples of the white pigment are titanium dioxide, zinc white (zinc oxide), and antimony trioxide. Note that it is possible to add, to the above-described pigment, a charge controlling agent (e.g., electrolyte, a surface active agent, metallic soap, resin, rubber, oil, varnish, or a compound), a dispersing agent (e.g., a titanium-based coupling agent, an aluminum-based coupling agent, or a silane-based coupling agent), a lubricant agent, a stabilizing agent, or the like.

Figure 21A:
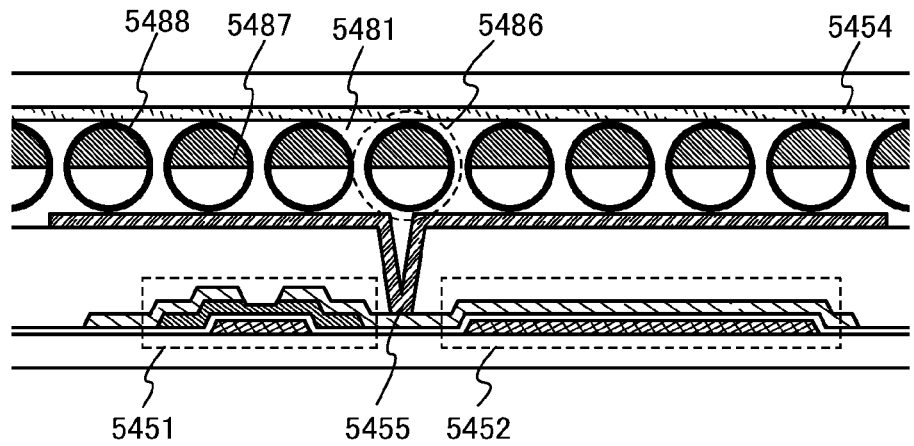
FIGS. 21A to 21C each illustrate an example of a cross-sectional view of a pixel in Embodiment 7.

FIG. 21A is a cross-sectional view of a pixel in the case where a twisting ball display method is used for the display element 5453. In the twisting ball display method, the reflectance is changed by rotation of a display element in order to control the gray level. The difference from FIG. 20B is that instead of the microcapsule 5480, a twisting ball 5486 is placed between the electrode 5454 and the electrode 5455. The twisting ball 5486 includes a particle 5487 and a cavity 5488 formed around the particle 5487. The particle 5487 is a spherical particle in which a surface of one hemisphere is colored in a given color and a surface of the other hemisphere is colored in a different color. Here, the particle 5487 has a white hemisphere and a black hemisphere. Note that there is a difference in electric charge density between the two hemispheres. For that reason, by generating a potential difference between the electrode 5454 and the electrode 5455, the particle 5487 can be rotated in accordance with the direction of electric fields. The cavity 5488 is filled with a liquid. As the liquid, a liquid similar to the liquid 5483 can be used. Note that the structure of the twisting ball 5486 is not limited to the structure illustrated in FIG. 21A. For example, the twisting ball 5486 can be a cylinder, an ellipse, or the like.

Figure 21B:
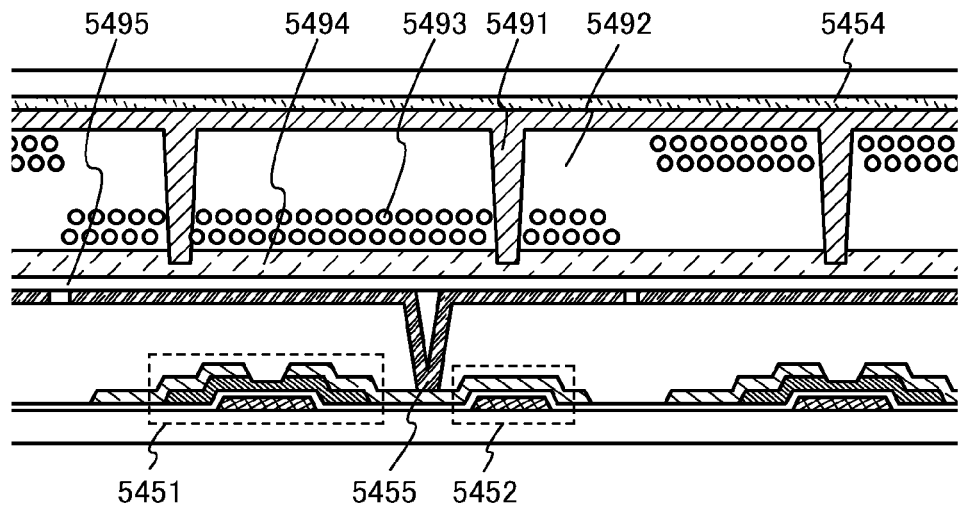

FIG. 21B is a cross-sectional view of a pixel in the case where a microcup electrophoresis method is used for the display element 5453. A microcup array can be formed in the following manner: a microcup 5491 that is formed using a UV curable resin or the like and has a plurality of recessed portions is filled with charged pigment particles 5493 dispersed in a dielectric solvent 5492, and sealing is performed with a sealing layer 5494. An adhesive layer 5495 is preferably formed between the sealing layer 5494 and the electrode 5455. As the dielectric solvent 5492, a colorless solvent can be used or a colored solvent of red, blue, or the like can be used. This embodiment shows the case where one kind of charged pigment particles is used; alternatively, two or more kinds of charged pigment particles may be used. The microcup has a wall by which cells are separated, and thus has sufficiently high resistance to shock and pressure. Moreover, since the components of the microcup are tightly sealed, adverse effects due to change in environment can be reduced.

Figure 21C:
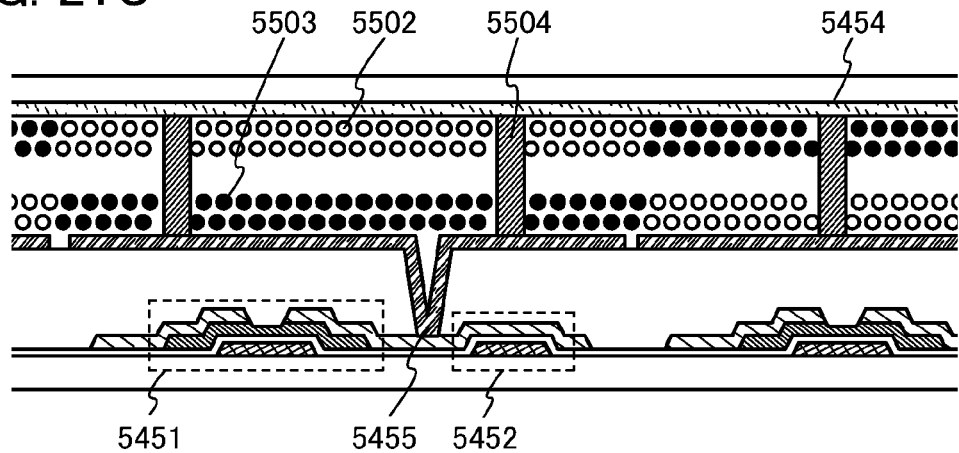

FIG. 21C is a cross-sectional view of a pixel in the case where an electro liquid powder display method is used for the display element 5453. The electro liquid powder has fluidity and is a substance having properties of fluid and properties of a particle. In this method, cells are separated by partitions 5504, and electro liquid powders 5502 and electro liquid powders 5503 are placed in the cell. As the electro liquid powder 5502 and the electro liquid powder 5503, a white particle and a black particle are preferably used. Note that the kinds of the electro liquid powders 5502 and 5503 are not limited thereto. For example, colored particles of two colors which are not white and black can be used as the electro liquid powders 5502 and 5503. As another example, one of the electro liquid powder 5502 and the electro liquid powder 5503 can be omitted.

A signal is input to the wiring 5461. Specifically, a signal for controlling the gray level of the display element 5453 (e.g., a video signal) is input to the wiring 5461. Accordingly, the wiring 5461 functions as a signal line or a source signal line (also referred to as a video signal line or a source line). A signal is input to the wiring 5462. Specifically, a signal for controlling a conduction state of the transistor 5451 (e.g., a gate signal, a scan signal, or a selection signal) is input to the wiring 5462. Accordingly, the wiring 5462 functions as a signal line or a gate signal line (also referred to as a scan signal line or a gate line). A constant voltage is supplied to the wiring 5463. The wiring 5463 is connected to the capacitor 5452. Accordingly, the wiring 5463 functions as a power supply line or a capacitor line. A constant voltage is supplied to the electrode 5454. The electrode 5454 is often shared with a plurality of pixels or all the pixels. Accordingly, the electrode 5454 functions as a common electrode (also referred to as a counter electrode or a cathode electrode).

Note that the signals or voltages input to the wiring 5461, the wiring 5462, the wiring 5463, and the electrode 5454 are not limited to the above, and various other signals or voltages can be input. For example, a signal can be input to the wiring 5463. Thus, the potential of the electrode 5455 can be controlled, so that the amplitude voltage of a signal input to the wiring 5461 can be reduced. Thus, the wiring 5463 can have a function of a signal line. As another example, by changing a voltage supplied to the electrode 5454, a voltage applied to the display element 5453 can be adjusted. Thus, the amplitude voltage of a signal input to the wiring 5461 can be reduced.

The transistor 5451 has a function of controlling electrical continuity between the wiring 5461 and the electrode 5455, a function of controlling the timing of supplying the potential of the wiring 5461 to the electrode 5455, or a function of controlling the timing of selecting the pixel 5450. In such a manner, the transistor 5451 has a function of a switch or a selection transistor. The transistor 5451 is an n-channel transistor. For that reason, the transistor 5451 is turned on when an H signal is input to the wiring 5462, and is turned off when an L signal is input to the wiring 5462. Note that transistor 5451 is not limited to an n-channel transistor and can be a p-channel transistor. In that case, the transistor 5451 is turned on when an L signal is input to the wiring 5462, and is turned off when an H signal is input to the wiring 5462. The capacitor 5452 has a function of holding the potential difference between the electrode 5455 and the wiring 5463, or a function of keeping the potential of the electrode 5455a predetermined value. Thus, a voltage can continue to be applied to the display element 5453 even when the transistor 5451 is off. In such a manner, the capacitor 5452 has a function of a storage capacitor. Note that functions of the transistor 5451 and the capacitor 5452 are not limited to the above, and the transistor 5451 and the capacitor 5452 can have various other functions.

Next, operation of the pixel in this embodiment will be roughly described. The gray level of the display element 5453 is controlled by applying a voltage to the display element 5453 so that an electric field is generated in the display element 5453. A voltage applied to the display element 5453 is controlled by controlling the potential of the electrode 5454 and the potential of the electrode 5455. Specifically, the potential of the electrode 5454 is controlled by controlling a voltage applied to the electrode 5454. The potential of the electrode 5455 is controlled by controlling a signal input to the wiring 5461. The signal input to the wiring 5461 is supplied to the electrode 5455 when the transistor 5451 is turned on.

Note that the gray level of the display element 5453 can be controlled by controlling the intensity or the direction of electric fields applied to the display element 5453, the time to apply electric fields to the display element 5453, or the like. Note that the gray level of the display element 5453 can be maintained by not generating a potential difference between the electrode 5454 and the electrode 5455.

Figure 22A:
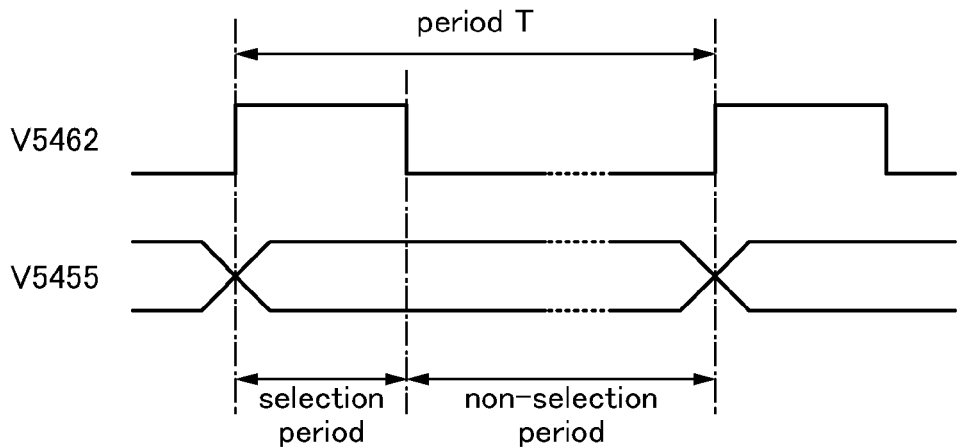
FIGS. 22A to 22C each illustrate an example of a timing chart for explaining operation of a pixel in Embodiment 7.

Next, an example of operation of the pixel in this embodiment will be described. The timing chart in FIG. 22A shows a period T including a selection period and a non-selection period. The period T is a period from the start of a selection period until the start of the next selection period.

In the selection period, an H signal is input to the wiring 5462, so that the potential of the wiring 5462 (referred to as a potential V5462) is at the H level. For that reason, the transistor 5451 is turned on, so that electrical continuity is established between the wiring 5461 and the electrode 5455. Thus, a signal input to the wiring 5461 is supplied to the electrode 5455 through the transistor 5451. Then, the potential of the electrode 5455 (referred to as a potential V5455) becomes equal to the signal input to the wiring 5461. At this time, the capacitor 5452 holds a potential difference between the electrode 5455 and the wiring 5463. In the non-selection period, an L signal is input to the wiring 5462, so that the potential of the wiring 5462 is at the L level. For that reason, the transistor 5451 is turned off, so that electrical continuity between the wiring 5461 and the electrode 5455 is broken. Then, the electrode 5455 is set in a floating state. At this time, the capacitor 5452 holds the potential difference in the selection period between the electrode 5455 and the wiring 5463. For that reason, the potential of the electrode 5455 remains equal to the signal input to the wiring 5461 in the selection period. In such a manner, in the non-selection period, a voltage can continue to be applied to the display element 5453 even when the transistor 5451 is off. As described above, by controlling a signal input to the wiring 5461 in the selection period, a voltage applied to the display element 5453 can be controlled. That is, the gray level of the display element 5453 can be controlled by controlling a signal input to the wiring 5461 in the selection period.

Note that the potential of the electrode 5455 in the non-selection period may be different from the signal input to the wiring 5461 in the selection period because of adverse effects of the off-state current of the transistor 5451, feedthrough of the transistor 5451, charge injection of the transistor 5451, or the like.

Figure 22B:
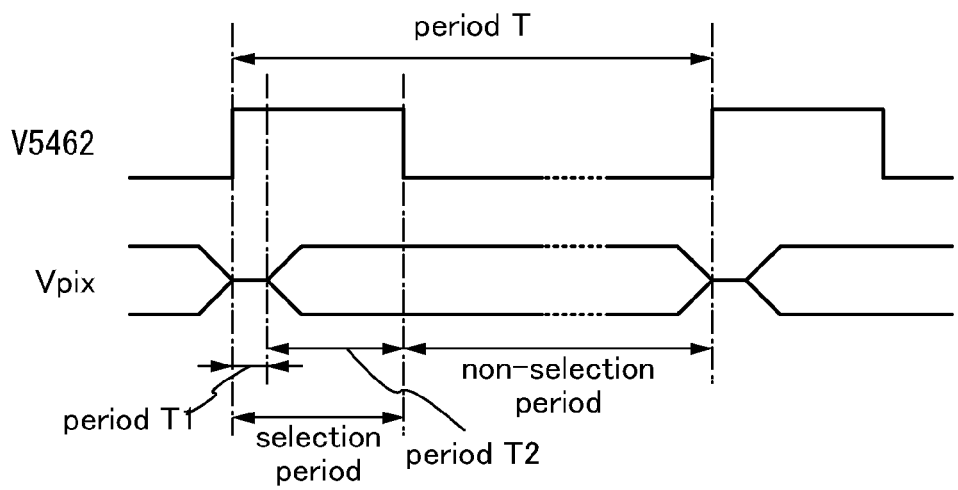

As illustrated in FIG. 22B, the potential of the electrode 5455 can be equal to that of the electrode 5454 in part of the selection period. For that reason, by changing the potential of the electrode 5455 in part of the selection period even when the same signal is continuously input to the wiring 5461, the intensity of electric fields applied to the display element 5453 can be changed. Thus, afterimages can be reduced; the response speed can be increased; or variations in response speed between pixels can be reduced so that unevenness or afterimages can be prevented. In order to realize such a driving method, the selection period can be divided into a period T1 and a period T2. In the period T1, the signal input to the wiring 5461 is preferably equal to the potential of the electrode 5454. In the period T2, the signal input to the wiring 5461 preferably has various values in order to control the gray level of the display element 5453. Note that when the period T1 is too long, a period during which a signal for controlling the gray level of the display element 5453 is written into the pixel 5450 becomes short. Therefore, the period T1 is preferably shorter than the period T2. Specifically, the period T1 accounts for preferably 1 to 20%, more preferably 3 to 15%, further preferably 5 to 10% of the selection period.

Figure 22C:
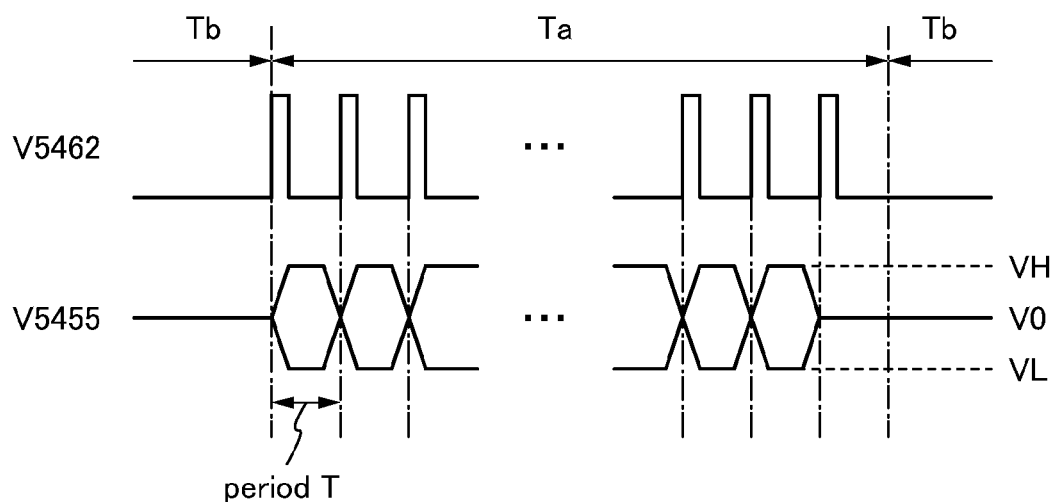

Next described is an example of operation of the pixel in this embodiment, in which the gray level of the display element 5453 is controlled by the time to apply a voltage to the display element 5453. The timing chart in FIG. 22C shows a period Ta and a period Tb. The period Ta includes N periods T (N is a natural number). The N periods T are similar to the period T illustrated in FIG. 22A or FIG. 22B. The period Ta is a period for changing the gray level of the display element 5453 (e.g., an address period, a writing period, or an image rewriting period). The period Tb is a period for holding the gray level of the display element 5453 in the period Ta (i.e., a holding period).

A voltage V0 is supplied to the electrode 5454, so that a potential V0 is applied to the electrode 5454. A signal having at least three values is input to the wiring 5463 and three potentials of the signal are a potential VH (VH>V0), the potential V0, and a potential VL (VL<V0); accordingly, the potential VH, the potential V0, and the potential VL are selectively applied to the electrode 5455.

In each of the N periods T in the period Ta, by controlling a potential applied to the electrode 5455, a voltage applied to the display element 5453 can be controlled. For example, when the potential VH is applied to the electrode 5455, the potential difference between the electrode 5454 and the electrode 5455 becomes VH−VL. Thus, a positive voltage can be applied to the display element 5453. When the potential V0 is applied to the electrode 5455, the potential difference between the electrode 5454 and the electrode 5455 becomes zero. Thus, zero voltage can be applied to the display element 5453. When the potential VL is applied to the electrode 5455, the potential difference between the electrode 5454 and the electrode 5455 becomes VL−VH. Thus, a negative voltage can be applied to the display element 5453. As described above, in the period Ta, the positive voltage (VH−VL), the negative voltage (VL−VH), and zero voltage can be applied to the display element 5453 in a variety of orders. Thus, the gray level of the display element 5453 can be closely controlled; afterimages can be reduced; or the response speed can be increased.

Note that in this embodiment, when a positive voltage is applied to the display element 5453, the gray level of the display element 5453 is close to black (also referred to as a first gray level). When a negative voltage is applied to the display element 5453, the gray level of the display element 5453 is close to white (also referred to as a second gray level). When zero voltage is applied to the display element 5453, the gray level of the display element 5453 is maintained.

In the period Tb, a signal input to the wiring 5461 is not written into the pixel 5450. Therefore, a potential applied to the electrode 5455 in the Nth period T in the period Ta continues to be applied in the period Tb. Specifically, it is preferable that in the period Tb, the gray level of the display element 5453 be maintained by not generating a field effect in the display element 5453. For that reason, in the Nth period T in the period Ta, the potential V0 is preferably applied to the electrode 5455. Thus, the potential V0 is applied to the electrode 5455 also in the period Tb, so that zero voltage is applied to the display element 5453. In such a manner, the gray level of the display element 5453 can be maintained.

Note that as the gray level to be subsequently expressed by the display element 5453 is closer to the first gray level, the time during which the potential VH is applied to the electrode 5455 is preferably longer in the period Ta. Alternatively, the frequency of application of the potential VH to the electrode 5455 is preferably higher in the N periods T. Alternatively, in the period Ta, it is preferable to increase a time obtained by subtracting the time during which the potential VL is applied to the electrode 5455 from the time during which the potential VH is applied to the electrode 5455. Further alternatively, in the N periods T, it is preferable to increase a frequency obtained by subtracting the frequency of application of the potential VL to the electrode 5455 from the frequency of application of the potential VH to the electrode 5455.

In addition, as the gray level to be subsequently expressed by the display element 5453 is closer to the second gray level, the time during which the potential VL is applied to the electrode 5455 is preferably longer in the period Ta. Alternatively, the frequency of application of the potential VL to the electrode 5455 is preferably higher in the N periods T. Alternatively, in the period Ta, it is preferable to increase a time obtained by subtracting the time during which the potential VH is applied to the electrode 5455 from the time during which the potential VL is applied to the electrode 5455. Further alternatively, in the N periods T, it is preferable to increase a frequency obtained by subtracting the frequency of application of the potential VH to the electrode 5455 from the frequency of application of the potential VL to the electrode 5455.

In the period Ta, a combination of potentials (the potential VH, the potential V0, and the potential VL) applied to the electrode 5455 can depend not only on the gray level to be subsequently expressed by the display element 5453, but also on the gray level that has been expressed by the display element 5453. For that reason, if a different gray level has been expressed by the display element 5453, a combination of potentials applied to the electrode 5455 may vary even when the gray level to be subsequently expressed by the display element 5453 is the same.

For example, in the period Ta for expressing the gray level that has been expressed by the display element 5453, the time during which the potential VL is applied to the electrode 5455 is preferably longer in the period Ta in any of the following cases: the case where the time during which the potential VH is applied to the electrode 5455 is longer; the case where a time obtained by subtracting the time during which the potential VL is applied to the electrode 5455 from the time during which the potential VH is applied to the electrode 5455 is longer; the case where the frequency of application of the potential VH to the electrode 5455 is higher in the N periods T; or the case where a frequency obtained by subtracting the frequency of application of the potential VL to the electrode 5455 from the frequency of application of the potential VH to the electrode 5455 is higher in the N periods T. Alternatively, the frequency of application of the potential VL to the electrode 5455 is preferably higher in the N periods T. Alternatively, in the period Ta, it is preferable to increase a time obtained by subtracting the time during which the potential VH is applied to the electrode 5455 from the time during which the potential VL is applied to the electrode 5455. Further alternatively, in the N periods T, it is preferable to increase a frequency obtained by subtracting the frequency of application of the potential VH to the electrode 5455 from the frequency of application of the potential VL to the electrode 5455. In such a manner, afterimages can be reduced.

As another example, in the period Ta for expressing the gray level that has been expressed by the display element 5453, the time during which the potential VH is applied to the electrode 5455 is preferably longer in the period Ta in any of the following cases: the case where the time during which the potential VL is applied to the electrode 5455 is longer; the case where a time obtained by subtracting the time during which the potential VH is applied to the electrode 5455 from the time during which the potential VL is applied to the electrode 5455 is longer; the case where the frequency of application of the potential VL to the electrode 5455 is higher in the N periods T; or the case where a frequency obtained by subtracting the frequency of application of the potential VH to the electrode 5455 from the frequency of application of the potential VL to the electrode 5455 is higher in the N periods T. Alternatively, the frequency of application of the potential VH to the electrode 5455 is preferably higher in the N periods T. Alternatively, in the period Ta, it is preferable to increase a time obtained by subtracting the time during which the potential VL is applied to the electrode 5455 from the time during which the potential VH is applied to the electrode 5455. Further alternatively, in the N periods T, it is preferable to increase a frequency obtained by subtracting the frequency of application of the potential VL to the electrode 5455 from the frequency of application of the potential VH to the electrode 5455. In such a manner, afterimages can be reduced.

Note that the N periods T have the same length; however, the length of the N periods T is not limited thereto and the lengths of at least two of the N periods T can be different from each other. It is particularly preferable that the length of the N periods T be weighted. For example, in the case where N=4 and the length of the first period T is denoted by a time h, the length of the second period T is preferably a time h×2, the length of the third period T is preferably a time h×4, and the length of the fourth period T is preferably a time h×8. When the length of the N periods T is weighted in such a manner, the frequency of selection of the pixel 5450 can be reduced and the time to apply a voltage to the display element 5453 can be closely controlled. Thus, power consumption can be reduced.

Note that the potential VH and the potential VL can be selectively applied to the electrode 5454. In this case, it is preferable that the potential VH and the potential VL be selectively applied also to the electrode 5455. For example, in the case where the potential VH is applied to the electrode 5454, zero voltage is applied to the display element 5453 when the potential VH is applied to the electrode 5455, whereas a negative voltage is applied to the display element 5453 when the potential VL is applied to the electrode 5455. On the other hand, in the case where the potential VL is applied to the electrode 5454, a positive voltage is applied to the display element 5453 when the potential VH is applied to the electrode 5455, whereas zero voltage is applied to the display element 5453 when the potential VL is applied to the electrode 5455. In such a manner, the signal input to the wiring 5461 can have two values (i.e., the signal can be a digital signal). For that reason, it is possible to simplify a circuit that outputs a signal to the wiring 5461.

Note that in the period Tb or part of the period Tb, it is possible not to input a signal to the wiring 5461 and the wiring 5462. That is, the wiring 5461 and the wiring 5462 can be set in a floating state. Moreover, in the period Tb or part of the period Tb, it is possible not to input a signal to the wiring 5463. That is, the wiring 5463 can be set in a floating state.

Furthermore, in the period Tb or part of the period Tb, it is possible not to supply a voltage to the electrode 5454. That is, the electrode 5454 can be set in a floating state.

The display element with memory properties in this embodiment needs to be supplied with a voltage higher than that for an ordinary liquid crystal element (e.g., a TN liquid crystal). The drive voltage can be increased by using the semiconductor device in any of Embodiments 1 to 4 which includes the transistor in Embodiment 5 as a circuit for driving the display element with memory properties. This is because the transistor in Embodiment 5 has withstand voltage higher than that of an amorphous silicon thin film transistor (a-Si TFT), a polycrystalline silicon thin film transistor (p-Si TFT), or the like.

In addition, it is preferable that the transistor shown in Embodiment 5 be used as the transistor 5451 included in the pixel that includes the display element with memory properties, as well as using the transistor in Embodiment 5 in the circuit for driving the display element with memory properties. Thus, the off-state current of the transistor 5451 can be reduced, so that the channel width of the transistor 5451 can be reduced or the area of the capacitor 5452 can be reduced. As a result, the area of the pixel can be reduced. Therefore, when the pixel in this embodiment is provided in a pixel portion of a display device, the resolution of the display device can be increased. Moreover, the circuit for driving the display element with memory properties and the pixel portion including the display element with memory properties can be easily formed over one substrate.

Embodiment 8

In this embodiment, examples of electronic devices will be described.

FIGS. 27A to 27H and FIGS. 28A to 28D each illustrate an electronic device. These electronic devices can include a housing 5000, a display portion 5001, a speaker 5003, an LED lamp 5004, operation keys 5005 (including a power switch or an operation switch), a connection terminal 5006, a sensor 5007 (a sensor having a function of measuring force, displacement, position, speed, acceleration, angular velocity, rotational frequency, distance, light, liquid, magnetism, temperature, chemical substance, sound, time, hardness, electric field, current, voltage, electric power, radiation, flow rate, humidity, gradient, oscillation, odor, or infrared ray), a microphone 5008, or the like.

Figure 27A:
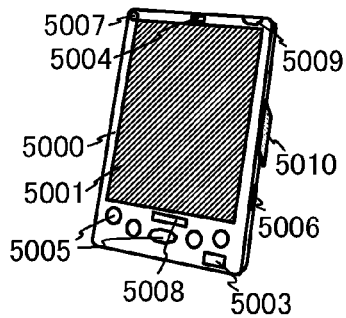
FIGS. 27A to 27H each illustrate an example of an electronic device in Embodiment 8.
Figure 27B:
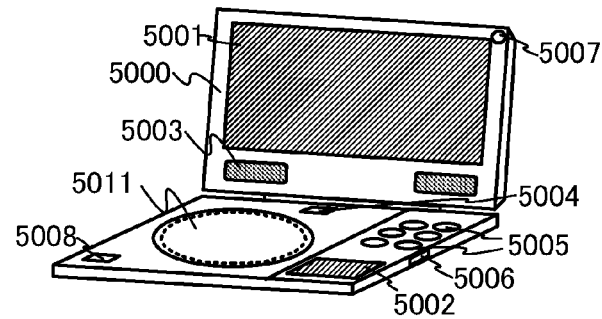
Figure 27C:
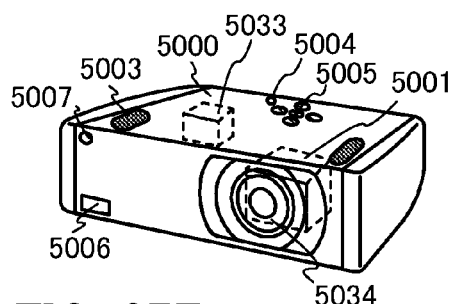
Figure 27D:
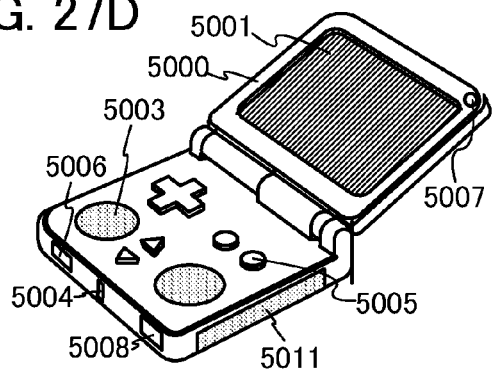
Figure 27E:
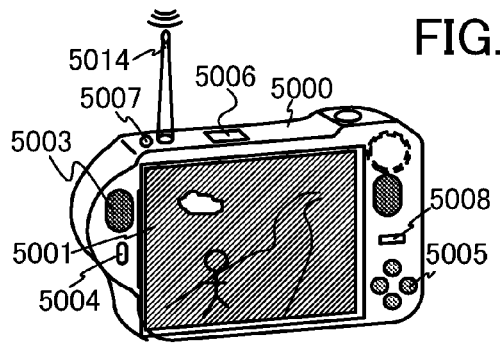
Figure 27F:
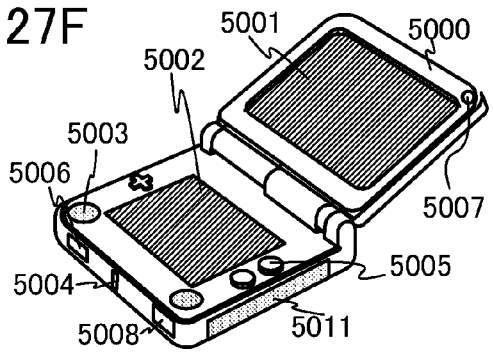
Figure 27G:
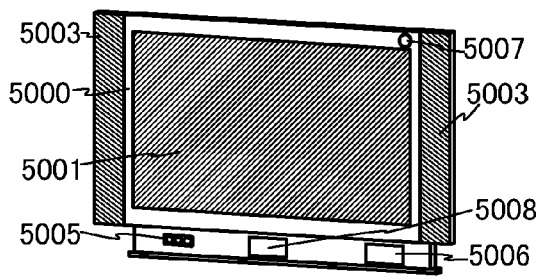
Figure 27H:
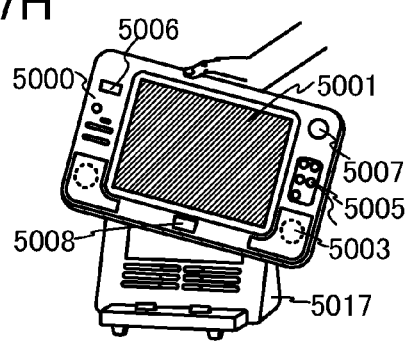
Figure 28A:
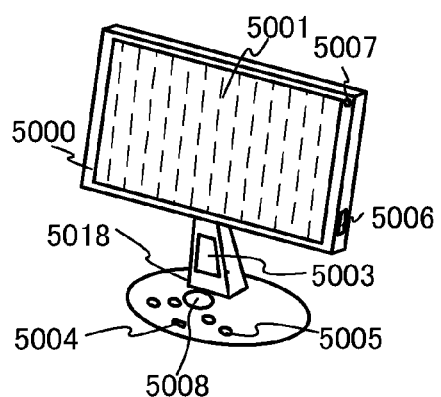
FIGS. 28A to 28H each illustrate an example of an electronic device in Embodiment 8.
Figure 28B:
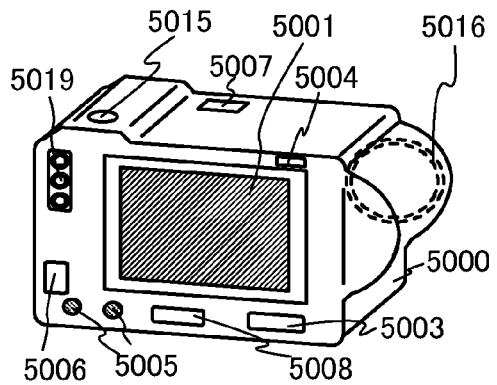
Figure 28C:
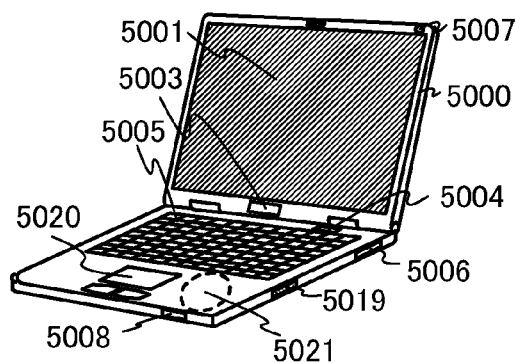
Figure 28D:
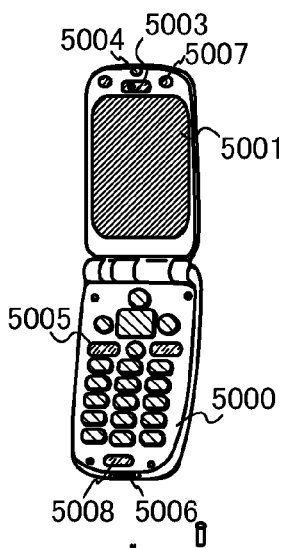

FIG. 27A illustrates a personal digital assistant that can include a switch 5009, an infrared port 5010, and the like in addition to the above-described components. FIG. 27B illustrates a portable image reproducing device (e.g., a DVD reproducing device) provided with a memory medium, and the image reproducing device can include a second display portion 5002, a memory medium reading portion 5011, and the like in addition to the above components. FIG. 27E illustrates a mobile television device that can include an antenna 5014 and the like in addition to the above components. FIG. 27D illustrates a portable game machine that can include the memory medium reading portion 5011 and the like in addition to the above components. FIG. 27C illustrates a projector that can include a light source 5033, a projector lens 5034, and the like in addition to the above components. FIG. 27F illustrates a portable game machine that can include the second display portion 5002, the memory medium reading portion 5011, and the like in addition to the above components. FIG. 27G illustrates a television receiver that can include a tuner, an image processing portion, and the like in addition to the above components. FIG. 27H illustrates a portable television receiver that can include a charger 5017 capable of transmitting and receiving signals and the like in addition to the above components. FIG. 28A illustrates a display that can include a support base 5018 and the like in addition to the above-described components. FIG. 28B illustrates a camera that can include an external connecting port 5019, a shutter button 5015, an image receiving portion 5016, and the like in addition to the above components. FIG. 28C illustrates a computer that can include a pointing device 5020, the external connecting port 5019, a reader/writer 5021, and the like in addition to the above components. FIG. 28D illustrates a mobile phone that can include the antenna 5014, a tuner of one-segment (1 seg digital TV broadcasts) partial reception service for mobile phones and mobile terminals, and the like in addition to the above components.

The electronic devices illustrated in FIGS. 27A to 27H and FIGS. 28A to 28D can have a variety of functions, for example, a function of displaying a variety of information (a still image, a moving image, a text image, and the like) on a display portion; a touch panel function; a function of displaying a calendar, date, time, and the like; a function of controlling process with a variety of software (programs); a wireless communication function; a function of being connected to a variety of computer networks with a wireless communication function; a function of transmitting and receiving a variety of data with a wireless communication function; and a function of reading program or data stored in a memory medium and displaying the program or data on a display portion. Further, the electronic device including a plurality of display portions can have a function of displaying image information mainly on one display portion and displaying text information on another display portion, a function of displaying a three-dimensional image by displaying images where parallax is considered on a plurality of display portions, or the like. Furthermore, the electronic device including an image receiving portion can have a function of photographing a still image, a function of photographing a moving image, a function of automatically or manually correcting a photographed image, a function of storing a photographed image in a memory medium (an external memory medium or a memory medium incorporated in the camera), a function of displaying a photographed image on a display portion, or the like. Note that functions which can be provided for the electronic devices illustrated in FIGS. 27A to 27H and FIGS. 28A to 28D are not limited to those described above, and the electronic devices can have a variety of functions.

Next, applications of a semiconductor device will be described.

Figure 28E:
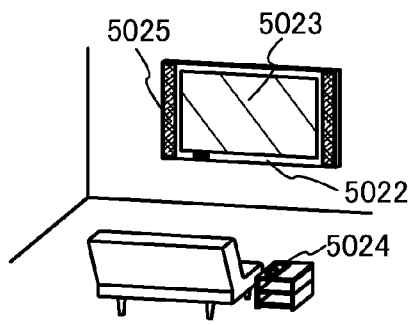

FIG. 28E illustrates an example in which a semiconductor device is incorporated in a building structure. FIG. 28E illustrates a housing 5022, a display portion 5023, a remote controller 5024 which is an operation portion, a speaker 5025, and the like. The semiconductor device is incorporated in the building as a wall-hanging type, so that the semiconductor device can be provided without requiring a large space.

Figure 28F:
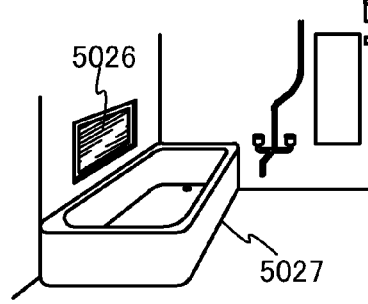

FIG. 28F illustrates another example in which a semiconductor device is incorporated in a building. A display panel 5026 is integrated with a prefabricated bath 5027, so that a person who takes a bath can watch the display panel 5026.

Note that although this embodiment gives the wall and the prefabricated bath as examples of the building, this embodiment is not limited to these examples and the semiconductor device can be provided in a variety of buildings.

Next, examples in which the semiconductor device is incorporated with a moving object will be described.

Figure 28G:
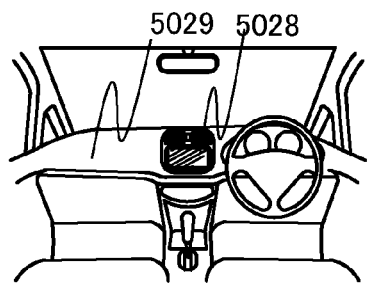

FIG. 28G illustrates an example in which the semiconductor device is provided in a car. A display panel 5028 is provided in a body 5029 of the car and can display information related to the operation of the car or information input from inside or outside of the car on demand. Note that a navigation function may be provided.

Figure 28H:
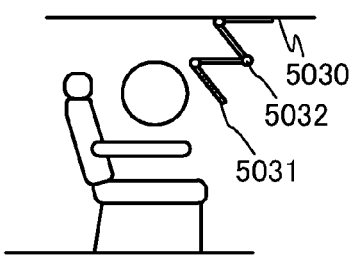

FIG. 28H illustrates an example in which the semiconductor device is incorporated in a passenger airplane. FIG. 28H illustrates a usage pattern when a display panel 5031 is provided for a ceiling 5030 above a seat of the airplane. The display panel 5031 is integrated with the ceiling 5030 through a hinge portion 5032, and a passenger can watch the display panel 5031 by extending and contracting the hinge portion 5032. The display panel 5031 has a function of displaying information when operated by the passenger.

Note that although this embodiment gives the body of the car and the body of the plane as examples of the moving body, this embodiment is not limited to these examples. The semiconductor device can be provided for a variety of moving bodies such as a two-wheel motor vehicle, a four-wheel vehicle (including a car, bus, and the like), a train (including a monorail, a railway, and the like), and a ship.

Any of the semiconductor devices in Embodiments 1 to 4 is preferably provided in the electronic device shown in this embodiment. In particular, any of the semiconductor devices in Embodiments 1 to 4 is preferably provided as a circuit for driving the display portion of the electronic device. When any of the semiconductor devices in Embodiments 1 to 4 is provided as a circuit for driving the display portion of the electronic device, the area of the driver circuit can be reduced and the size of the display portion can be increased. Alternatively, the resolution of the display portion can be increased.

Embodiment 9

In this embodiment, another example of the structure and the manufacturing method of the semiconductor device according to Embodiment 5 will be described with reference to FIGS. 29A to 29D. In this embodiment, the difference from Embodiment 5 is described in detail and the description of Embodiment 5 is employed for similar portions.

First, the gate electrode layer 411 is formed over the substrate 400, and then, the gate insulating layer 402 is formed so as to cover the gate electrode layer 411. After that, a first oxide semiconductor layer 404 is formed over the gate insulating layer 402.

The first oxide semiconductor layer 404 can be formed using an oxide semiconductor material which is a three-component metal oxide and can be represented by In-M$_X$-Zn$_Y$—O$_z$ (Y=0.5 to 5). Here, M denotes one or plural kinds of elements selected from elements of Group 13, such as gallium (Ga), aluminum (Al), and boron (B). Note that the amount of In, M, Zn, and O contained is not limited and the amount of M can be zero (i.e., X can be 0). In contrast, the amount of In and Zn is not zero. That is, the above expression represents In—Ga—Zn—O and In—Zn—O, for example.

Like the oxide semiconductor layer 406 in Embodiment 5, the first oxide semiconductor layer 404 can be formed using a four-component metal oxide such as an In—Sn—Ga—Zn—O-based metal oxide; a three-component metal oxide such as an In—Ga—Zn—O-based metal oxide, an In—Sn—Zn—O-based metal oxide, an In—Al—Zn—O based metal oxide, a Sn—Ga—Zn—O-based metal oxide, an Al—Ga—Zn—O-based metal oxide, or a Sn—Al—Zn—O-based metal oxide; a two-component metal oxide such as an In—Zn—O-based metal oxide, a Sn—Zn—O-based metal oxide, an Al—Zn—O-based metal oxide, a Zn—Mg—O-based metal oxide, a Sn—Mg—O-based metal oxide, or an In—Mg—O-based metal oxide; an In—O-based metal oxide, a Sn—O-based metal oxide, a Zn—O-based metal oxide, or the like.

In this embodiment, the first oxide semiconductor layer 404 is formed by a sputtering method with the use of an In—Ga—Zn—O-based oxide semiconductor target.

As a target used for forming the In—Ga—Zn—O-based first oxide semiconductor layer 404 by a sputtering method, a metal oxide target containing zinc oxide as its main component can be used, for example. The target containing In, Ga, and Zn has a composition ratio of In:Ga:Zn=1:x:y (x is 0 or larger and y is 0.5 to 5). For example, a target with a composition ratio of In:Ga:Zn=1:1:1 [atomic ratio] (x=1 and y=1; that is, $In_2O_3$:$Ga_2O_3$:ZnO=1:1:2 [molar ratio]) may be used. As the oxide semiconductor target, it is possible to use a target with a composition ratio of In:Ga:Zn=1:1:0.5 [atomic ratio], a target with a composition ratio of In:Ga:Zn=1:1:2 [atomic ratio], or a target with a composition ratio of In:Ga:Zn=1:0:1 [atomic ratio] (x=0 and y=1). In this embodiment, it is preferable to use an oxide semiconductor target with which crystals are easily generated, because heat treatment is performed later in order to intentionally crystallize the first oxide semiconductor layer 404.

Figure 29A:
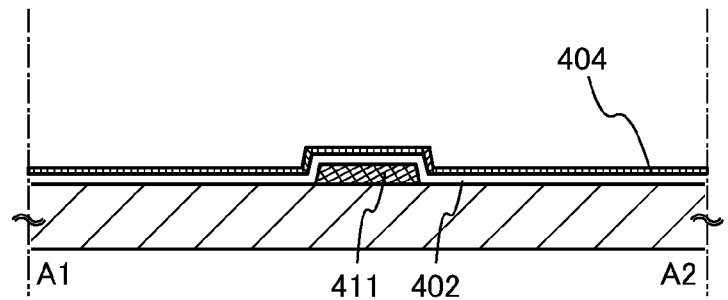
FIGS. 29A to 29D illustrate an example of a process for manufacturing a semiconductor device in Embodiment 9.

Then, the first heat treatment is performed on the first oxide semiconductor layer 404, so that a region including at least a surface of the first oxide semiconductor layer 404 is crystallized (see FIG. 29A). By performing the first heat treatment on the first oxide semiconductor layer 404, an excess amount of water (including a hydroxyl group), hydrogen, and the like that are contained in the first oxide semiconductor layer 404 can be removed. The first heat treatment is performed at 450° C. to 850° C., preferably 550° C. to 750° C. for 1 minute to 24 hours.

In this embodiment, as the first heat treatment, heat treatment is performed at 700° C. for one hour in a nitrogen atmosphere; after dehydration or dehydrogenation is performed, the atmosphere is switched to an oxygen atmosphere so that oxygen is supplied inside the first oxide semiconductor layer 404.

The first heat treatment in Embodiment 5 can be referred to for other conditions of the heat treatment; therefore, the detailed description is not repeated.

The first heat treatment is performed on the first oxide semiconductor layer 404, so that a non-single-crystal region can be formed in the region including at least the surface of the first oxide semiconductor layer 404. The non-single-crystal region formed in the region including the surface of the first oxide semiconductor layer 404 is formed by crystal growth from the surface toward the inside. The non-single-crystal region is a plate-like non-single-crystal layer with an average thickness of 2 nm to 10 nm. Moreover, the non-single-crystal region includes a non-single-crystal layer which has a c-axis alignment in the direction substantially perpendicular to the surface of the first oxide semiconductor layer 404. Here, "substantially parallel" means a state within ±10° from a parallel direction. Further, "substantially perpendicular" means a state within ±10° from a perpendicular direction.

Figure 29B:
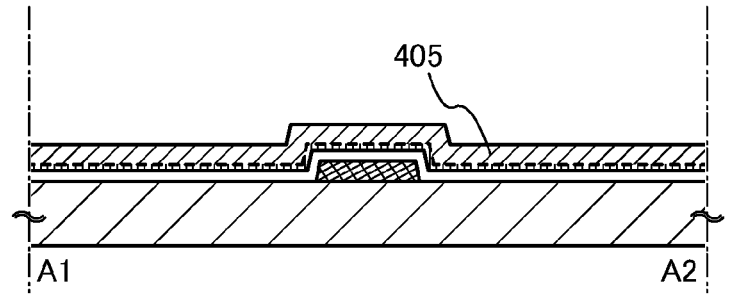

Next, a second oxide semiconductor layer 405 is formed over the first oxide semiconductor layer 404 (see FIG. 29B).

Like the first oxide semiconductor layer 404, the second oxide semiconductor layer 405 can be formed using a four-component metal oxide such as an In—Sn—Ga—Zn—O-based metal oxide; a three-component metal oxide such as an In—Ga—Zn—O-based metal oxide, an In—Sn—Zn—O-based metal oxide, an In—Al—Zn—O based metal oxide, a Sn—Ga—Zn—O-based metal oxide, an Al—Ga—Zn—O- based metal oxide, or a Sn—Al—Zn—O-based metal oxide; a two-component metal oxide such as an In—Zn—O-based metal oxide, a Sn—Zn—O-based metal oxide, an Al—Zn—O-based metal oxide, a Zn—Mg—O-based metal oxide, a Sn—Mg—O-based metal oxide, or an In—Mg—O-based metal oxide; an In—O-based metal oxide, a Sn—O-based metal oxide, a Zn—O-based metal oxide, or the like.

It is preferable that the second oxide semiconductor layer 405 be formed using a material containing the same main component as the first oxide semiconductor layer 404, or that the second oxide semiconductor layer 405 have the same crystal structure as the first oxide semiconductor layer 404 and have a lattice constant close to the first oxide semiconductor layer 404 (the mismatch is 1% or lower). In the case where a material containing the same main component is used for the second oxide semiconductor layer 405 and the first oxide semiconductor layer 404, the second oxide semiconductor layer 405 is easily crystallized when crystals grow using the non-single-crystal region of the first oxide semiconductor layer 404 as seeds in the second heat treatment performed later. Moreover, the case where a material containing the same main component is used for these oxide semiconductor layers, favorable electrical characteristics and interface characteristics such as adhesion between the second oxide semiconductor layer 405 and the first oxide semiconductor layer 404 can be obtained.

Alternatively, the second oxide semiconductor layer 405 may be formed using a material containing a main component different from that of a material for the first oxide semiconductor layer 404. In the case of using a material containing a main component different from that of a material for the first oxide semiconductor layer 404, electrical characteristics of the layers can be different from each other. For example, when the second oxide semiconductor layer 405 is formed using a material with high electrical conductivity and the first oxide semiconductor layer 404 is formed using a material with low electrical conductivity, it is possible to realize a semiconductor device in which adverse effects of the base interface are reduced. Furthermore, when a material that is easily crystallized is used for the first oxide semiconductor layer 404 to form a favorable seed crystal and then, the second oxide semiconductor layer 405 is formed and crystallized, the crystallinity of the second oxide semiconductor layer 405 can be favorable regardless of easiness of crystallization of the second oxide semiconductor layer 405.

In this embodiment, the second oxide semiconductor layer 405 is formed by a sputtering method with the use of an In—Ga—Zn—O-based oxide semiconductor target. The second oxide semiconductor layer 405 may be deposited in a manner similar to that of the first oxide semiconductor layer 404. Note that the thickness of the second oxide semiconductor layer 405 is preferably larger than that of the first oxide semiconductor layer 404. Moreover, it is preferable to form the second oxide semiconductor layer 405 so that the sum of the thickness of the first and second oxide semiconductor layers 404 and 405 is 3 nm to 50 nm Note that since an appropriate thickness differs depending on an oxide semiconductor material to be used, application, and the like, the thickness is set in accordance with the material to be used, application, and the like.

Figure 29C:
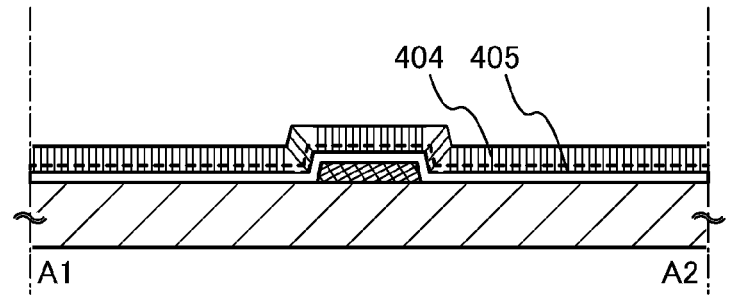

Next, the second heat treatment is performed on the second oxide semiconductor layer 405, so that crystals grow using the non-single-crystal region of the first oxide semiconductor layer 404 as seeds and the crystallized second oxide semiconductor layer 405 is formed (see FIG. 29C).

By performing the second heat treatment on the second oxide semiconductor layer 405, crystals can grow in the entire second oxide semiconductor layer 405 from the non-single-crystal region formed at the interface between the first oxide semiconductor layer 404 and the second oxide semiconductor layer 405, and the crystallized second oxide semiconductor layer 405 can be formed. Furthermore, by performing the second heat treatment, the first oxide semiconductor layer 404 can be a non-single-crystal layer with higher degree of crystal orientation.

Note that in the first oxide semiconductor layer 404, a region overlapping with unevenness of the gate insulating layer 402 has a grain boundary and thus has a non-single-crystal structure. In the second oxide semiconductor layer 405, a region that serves as a channel formation region at least has a flat surface. Moreover, the region serving as the channel formation region in the second oxide semiconductor layer 405 includes c-axis-oriented non-single crystals like the first oxide semiconductor layer 404. Note that in the region overlapping with the gate electrode layer 411 (i.e., the channel formation region), a difference in height of the surface of the second oxide semiconductor layer 405 is preferably 1 nm or less, further preferably 0.2 nm or less. The a-axis and the b-axis of the non-single crystals deviate in the channel formation region of the second oxide semiconductor layer 405.

For example, when an In—Ga—Zn—O-based oxide semiconductor material is used for the second oxide semiconductor layer 405, the second oxide semiconductor layer 405 can include a crystal represented by $InGaO_3(ZnO)_m$ (m is larger than 0 and is not a natural number), a crystal represented by $In_2Ga_2ZnO_7$ (In:Ga:Zn:O=2:2:1:7), or the like. By the second heat treatment, such crystals align so that the c-axis is substantially perpendicular to the surface of the second oxide semiconductor layer 405.

Here, the above-described crystal includes any of In, Ga, and Zn and can be considered to have a layered structure of layers parallel to the a-axis and the b-axis. Specifically, the above crystal has a structure in which a layer that contains In and a layer that does not contain In (i.e., a layer that contains Ga or Zn) are stacked in the c-axis direction.

In the In—Ga—Zn—O-based oxide semiconductor, the conductivity in the direction parallel to the a-axis and the b-axis of the layer containing In is favorable. This is because electrical conduction in the In—Ga—Zn—O-based oxide semiconductor is mainly controlled by In and because a carrier path is formed since the 5 s orbital of one In overlaps with the 5 s orbital of adjacent In.

When the first oxide semiconductor layer 404 includes an amorphous region at the interface with the gate insulating layer 402, the second heat treatment sometimes makes crystal grow from the crystalline region formed on the surface of the first oxide semiconductor layer 404 toward a bottom surface of the first oxide semiconductor layer 404 so that the amorphous region is crystallized. Note that the amorphous region is left in some cases depending on the material included in the gate insulating layer 402, the conditions of the heat treatment, or the like.

In the case where the first oxide semiconductor layer 404 and the second oxide semiconductor layer 405 are formed using an oxide semiconductor material with the same main component, when crystal grows upward toward the surface of the second oxide semiconductor layer 405 as illustrated in FIG. 29C, using the first oxide semiconductor layer 404 as the seeds for crystal growth, the first oxide semiconductor layer 404 and the second oxide semiconductor layer 405 have the same crystal structure. For that reason, although shown by dot lines in FIG. 29C, the interface between the first oxide semiconductor layer 404 and the second oxide semiconductor layer 405 cannot be recognized and the first and second oxide semiconductor layers 404 and 405 can be regarded as one layer in some cases.

In such a manner, by performing the second heat treatment, the entire second oxide semiconductor layer 405 can be crystallized from the non-single-crystal region formed at the interface between the second oxide semiconductor layer 405 and the first oxide semiconductor layer 404. Furthermore, by performing the second heat treatment, the first oxide semiconductor layer 404 can be a non-single-crystal layer with higher degree of crystal orientation.

The second heat treatment is performed at 450° C. to 850° C., preferably 600° C. to 700° C. for 1 minute to 100 hours, preferably 5 hours to 20 hours, typically 10 hours.

Also in the second heat treatment, it is preferable that water, hydrogen, and the like be not contained in nitrogen, oxygen, or a rare gas such as helium, neon, or argon. Alternatively, it is preferable that the purity of nitrogen, oxygen, or the rare gas such as helium, neon, or argon which is introduced into a heat treatment apparatus be 6N or higher, further preferably 7N or higher. The second heat treatment may be performed in ultra-dry air with an $H_2O$ concentration of 20 ppm or lower, preferably in ultra-dry air with an $H_2O$ concentration of 1 ppm or lower. By such second heat treatment, water (including a hydroxyl group), hydrogen, and the like that are contained in the second oxide semiconductor layer 405 can be removed. Thus, it is possible to form the first oxide semiconductor layer 404 and the second oxide semiconductor layer 405 that are made to be intrinsic or substantially intrinsic by being highly purified by reduction in impurities.

In addition, the atmosphere inside a furnace may be switched so that a nitrogen atmosphere is used when the temperature is increased in the second heat treatment and an oxygen atmosphere is used at the time of cooling; when the atmosphere is switched to an oxygen atmosphere after dehydration or dehydrogenation is performed in a nitrogen atmosphere, oxygen can be supplied inside the second oxide semiconductor layer 405.

The heat treatment apparatus in Embodiment 5 can be referred to for the heat treatment apparatus used in the second heat treatment; therefore, the detailed description is not repeated.

The subsequent steps can refer to Embodiment 5 (FIGS. 15B to 15D).

Figure 29D:
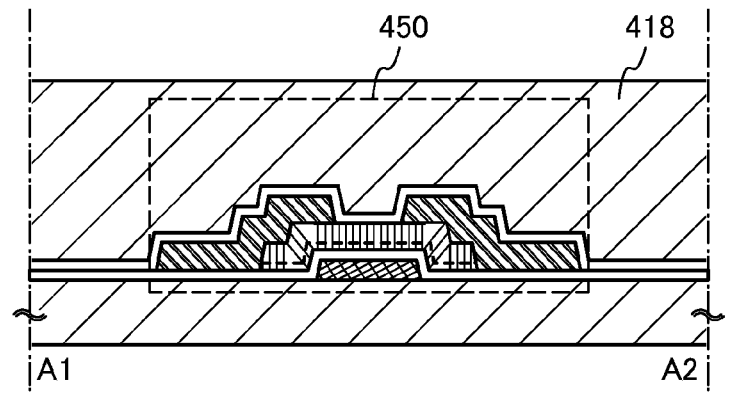

Through the above-described process, the transistor 450 including the oxide semiconductor layer 406a is completed (see FIG. 29D).

The non-single-crystal region is formed in the oxide semiconductor layer 406a as described above, whereby the mobility of the transistor can be increased. When the transistor whose mobility is increased in such a manner is applied to a circuit for which high-speed operation is required, the drive capability of the circuit can be improved.

By application of the transistor in this embodiment to any of the semiconductor devices in Embodiments 1 to 3, the drive capability of the semiconductor device can be improved.

In addition, a combination of the transistor in this embodiment and the transistor in Embodiment 5 can be applied to any of the semiconductor devices in Embodiments 1 to 4.

This application is based on Japanese Patent Application serial no. 2009-282268 filed with Japan Patent Office on Dec. 11, 2009, the entire contents of which are hereby incorporated by reference.

What is claimed is:

1. A semiconductor device comprising:
   a first transistor;
   a second transistor;
   a third transistor; and
   a fourth transistor,
   wherein a first terminal of the first transistor is electrically connected to a first wiring and a second terminal of the first transistor is electrically connected to a second wiring,
   wherein a gate of the second transistor is electrically connected to a third wiring, a first terminal of the second transistor is electrically connected to the third wiring, and a second terminal of the second transistor is electrically connected to a gate of the first transistor,
   wherein a gate of the third transistor is electrically connected to a fourth wiring, a first terminal of the third transistor is electrically connected to a fifth wiring, and a second terminal of the third transistor is electrically connected to the second wiring,
   wherein a gate of the fourth transistor is electrically connected to the fourth wiring, a first terminal of the fourth transistor is electrically connected to the fifth wiring, and a second terminal of the fourth transistor is electrically connected to the gate of the first transistor,
   wherein a channel width of the first transistor is larger than a channel width of the second transistor, and
   wherein the second transistor comprises an oxide semiconductor layer comprising a channel formation region.

2. The semiconductor device according to claim 1, the second transistor comprising:
   a gate electrode layer on a substrate;
   an insulating layer having a layered structure on the gate electrode layer and under and in contact with the oxide semiconductor layer, the insulating layer comprising silicon, oxygen and nitrogen;
   a source electrode layer and a drain electrode layer on and in contact with the oxide semiconductor layer, each of the source electrode layer and the drain electrode layer having a layered structure; and
   a silicon oxide layer on and in contact with the source electrode layer and the drain electrode layer.

3. The semiconductor device according to claim 1, wherein an off-state current of the second transistor per channel width of 1 μm is 1 aA or less.

4. The semiconductor device according to claim 1, wherein each of the first transistor, the third transistor and the fourth transistor comprises a separate oxide semiconductor layer.

5. The semiconductor device according to claim 1, wherein the oxide semiconductor layer includes a non-single-crystal region.

6. The semiconductor device according to claim 1, wherein the oxide semiconductor layer includes a non-single-crystal region, the non-single-crystal region having a c-axis alignment in a direction perpendicular to a surface of the oxide semiconductor layer.

7. A display device comprising the semiconductor device according to claim 1, and further comprising:
   a substrate;
   a pixel portion on the substrate;
   a gate driver circuit on the substrate, the gate driver circuit being configured to control the pixel portion; and
   an input terminal on the substrate,
   wherein the semiconductor device is comprised in the gate driver circuit.

8. An electronic device comprising the semiconductor device according to claim 1.

9. A semiconductor device comprising:
a substrate;
a first transistor;
a second transistor;
a third transistor; and
a fourth transistor,
wherein a first terminal of the first transistor is electrically connected to a first wiring and a second terminal of the first transistor is electrically connected to a second wiring,
wherein a gate of the second transistor is electrically connected to a third wiring, a first terminal of the second transistor is electrically connected to the third wiring, and a second terminal of the second transistor is electrically connected to a gate of the first transistor,
wherein a gate of the third transistor is electrically connected to a fourth wiring, a first terminal of the third transistor is electrically connected to a fifth wiring, and a second terminal of the third transistor is electrically connected to the second wiring,
wherein a gate of the fourth transistor is electrically connected to the fourth wiring, a first terminal of the fourth transistor is electrically connected to the fifth wiring, and a second terminal of the fourth transistor is electrically connected to the gate of the first transistor,
wherein a channel width of the first transistor is larger than a channel width of the second transistor,
wherein the second transistor comprises:
a gate electrode layer on the substrate;
an insulating layer having a layered structure on the gate electrode layer, the insulating layer comprising silicon, oxygen and nitrogen;
an oxide semiconductor layer comprising a channel formation region on and in contact with the insulating layer;
a source electrode layer and a drain electrode layer on and in contact with the oxide semiconductor layer, each of the source electrode layer and the drain electrode layer having a layered structure; and
a silicon oxide layer on and in contact with the oxide semiconductor layer.

10. The semiconductor device according to claim 9, further comprising a silicon nitride layer,
wherein the silicon oxide layer is on and in contact with the source electrode layer and the drain electrode layer, and
wherein the silicon nitride layer is on and in contact with the silicon oxide layer.

11. The semiconductor device according to claim 9, wherein an off-state current of the second transistor per channel width of 1 μm is 1 aA or less.

12. The semiconductor device according to claim 9, wherein each of the first transistor, the third transistor and the fourth transistor comprises a separate oxide semiconductor layer.

13. The semiconductor device according to claim 9, wherein the oxide semiconductor layer includes a non-single-crystal region.

14. The semiconductor device according to claim 9, wherein the oxide semiconductor layer includes a non-single-crystal region, the non-single-crystal region having a c-axis alignment in a direction perpendicular to a surface of the oxide semiconductor layer.

15. A display device comprising the semiconductor device according to claim 9, and further comprising:
a pixel portion on the substrate;
a gate driver circuit on the substrate, the gate driver circuit being configured to control the pixel portion; and
an input terminal on the substrate,
wherein the semiconductor device is comprised in the gate driver circuit.

16. An electronic device comprising the semiconductor device according to claim 9.

17. A semiconductor device comprising:
a first transistor;
a second transistor;
a third transistor; and
a fourth transistor,
wherein a first terminal of the first transistor is electrically connected to a first wiring and a second terminal of the first transistor is electrically connected to a second wiring,
wherein a gate of the second transistor is electrically connected to a third wiring, a first terminal of the second transistor is electrically connected to the third wiring, and a second terminal of the second transistor is electrically connected to a gate of the first transistor,
wherein a gate of the third transistor is electrically connected to a fourth wiring, a first terminal of the third transistor is electrically connected to a fifth wiring, and a second terminal of the third transistor is electrically connected to the second wiring,
wherein a first terminal of the fourth transistor is electrically connected to the gate of the first transistor,
wherein a channel width of the first transistor is larger than a channel width of the second transistor, and
wherein the second transistor comprises an oxide semiconductor layer comprising a channel formation region.

18. The semiconductor device according to claim 17, the second transistor comprising:
a gate electrode layer on a substrate;
an insulating layer having a layered structure on the gate electrode layer and under and in contact with the oxide semiconductor layer, the insulating layer comprising silicon, oxygen and nitrogen;
a source electrode layer and a drain electrode layer on and in contact with the oxide semiconductor layer, each of the source electrode layer and the drain electrode layer having a layered structure; and
a silicon oxide layer on and in contact with the source electrode layer and the drain electrode layer.

19. The semiconductor device according to claim 17, wherein an off-state current of the second transistor per channel width of 1 μm is 1 aA or less.

20. The semiconductor device according to claim 17, wherein each of the first transistor, the third transistor and the fourth transistor comprises a separate oxide semiconductor layer.

21. The semiconductor device according to claim 17, wherein the oxide semiconductor layer includes a non-single-crystal region.

22. The semiconductor device according to claim 17, wherein the oxide semiconductor layer includes a non-single-crystal region, the non-single-crystal region having a c-axis alignment in a direction perpendicular to a surface of the oxide semiconductor layer.

23. A display device comprising the semiconductor device according to claim 17, and further comprising:
a substrate;
a pixel portion on the substrate;
a gate driver circuit on the substrate, the gate driver circuit being configured to control the pixel portion; and
an input terminal on the substrate,
wherein the semiconductor device is comprised in the gate driver circuit.

24. An electronic device comprising the semiconductor device according to claim 17.

* * * * *

UNITED STATES PATENT AND TRADEMARK OFFICE
CERTIFICATE OF CORRECTION

PATENT NO. : 8,890,146 B2  
APPLICATION NO. : 13/763804  
DATED : November 18, 2014  
INVENTOR(S) : Hajime Kimura et al.

It is certified that error appears in the above-identified patent and that said Letters Patent is hereby corrected as shown below:

In the Specification

At column 4, line 62, "X" should be --X,--;  
At column 26, line 34, "2012." should be --201_2.--;  
At column 28, line 3, "InGaO$_3$(ZnO)," should be --InGaO$_3$(ZnO)$_m$--;  
At column 28, line 5, "1 nMO$_3$(ZnO)$_m$" should be --InMO$_3$(ZnO)$_m$--;  
At column 31, line 47, "30 nm" should be --30 nm.--;  
At column 38, line 42, "53632," should be --5363_2,--;  
At column 38, line 53, "53632" should be --5363_2--;  
At column 39, line 10, "53632," should be --5363_2,--;  
At column 39, line 11, "53632" should be --5363_2--;  
At column 39, line 13, "timing" should be --timing.--;  
At column 39, line 14, "53632" should be --5363_2--;  
At column 40, line 6, "53632" should be --5363_2--;  
At column 40, line 9, "53632" should be --5363_2--;  
At column 46, line 58, "5455a" should be --5455 a--;  
At column 55, line 56, "50 nm" should be --50 nm.--;  
At column 56, line 27, "InGaO$_3$(ZnO)," should be --InGaO$_3$(ZnO)$_m$--;  
At column 56, line 44, "5 s" should be --5s--;  
At column 56, line 45, "5 s" should be --5s--.

Signed and Sealed this  
Thirtieth Day of June, 2015

Michelle K. Lee  
*Director of the United States Patent and Trademark Office*